(12) United States Patent
Anthony et al.

(10) Patent No.: US 9,001,486 B2
(45) Date of Patent: *Apr. 7, 2015

(54) INTERNALLY OVERLAPPED CONDITIONERS

(71) Applicant: X2Y Attenuators, LLC, Erie, PA (US)

(72) Inventors: William M. Anthony, Erie, PA (US);
David Anthony, Erie, PA (US);
Anthony Anthony

(73) Assignee: X2Y Attenuators, LLC, Erie, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/042,637

(22) Filed: Sep. 30, 2013

(65) Prior Publication Data

US 2014/0104747 A1 Apr. 17, 2014

Related U.S. Application Data

(63) Continuation of application No. 13/175,918, filed on Jul. 4, 2011, now Pat. No. 8,547,677, which is a continuation of application No. 12/861,811, filed on Aug. 23, 2010, now Pat. No. 7,974,062, which is a
(Continued)

(51) Int. Cl.
| | |
|---|---|
| *H02H 9/00* | (2006.01) |
| *H01G 4/35* | (2006.01) |
| *H01G 4/005* | (2006.01) |
| *H01G 4/232* | (2006.01) |
| *H01G 4/30* | (2006.01) |
| *H05K 1/02* | (2006.01) |
| *H05K 1/11* | (2006.01) |

(52) U.S. Cl.
CPC ............. *H01G 4/35* (2013.01); *H01G 4/005* (2013.01); *H01G 4/232* (2013.01); *H01G 4/30* (2013.01); *H05K 1/0231* (2013.01); *H05K 1/113* (2013.01); *H05K 1/114* (2013.01); *H05K 2201/0979* (2013.01); *H05K 2201/10636* (2013.01)

(58) Field of Classification Search
USPC ..................................................... 361/118
See application file for complete search history.

(56) References Cited

U.S. PATENT DOCUMENTS

| | | |
|---|---|---|
| 676,185 A | 6/1901 | Gattinger |
| 3,104,363 A | 9/1963 | Butler |
| 3,240,621 A | 3/1966 | Flower, Jr. et al. |
| 3,273,027 A | 9/1966 | Bourgault et al. |

(Continued)

FOREIGN PATENT DOCUMENTS

| | | |
|---|---|---|
| CA | 747079 | 11/1966 |
| CA | 1237534 | 5/1988 |

(Continued)

OTHER PUBLICATIONS

Oct. 1, 2002, PCT International Search Report for PCT/US01/48861.
(Continued)

*Primary Examiner* — Stephen W Jackson
(74) *Attorney, Agent, or Firm* — Kenneth C. Spafford

(57) ABSTRACT

The application discloses novel internal structures of energy conditioners, assemblies of external structures of energy conditioners and mounting structure, and novel circuits including energy conditioners having A, B, and G master electrodes.

1 Claim, 15 Drawing Sheets

Related U.S. Application Data continuation of application No. 11/817,634, filed as application No. PCT/US2006/006607 on Feb. 27, 2006, now Pat. No. 7,782,587.

(60) Provisional application No. 60/656,910, filed on Mar. 1, 2005, provisional application No. 60/661,002, filed on Mar. 14, 2005, provisional application No. 60/668,992, filed on Apr. 7, 2005, provisional application No. 60/671,107, filed on Apr. 14, 2005, provisional application No. 60/671,532, filed on Apr. 15, 2005, provisional application No. 60/674,284, filed on Apr. 25, 2005, provisional application No. 60/751,273, filed on Dec. 19, 2005.

(56) References Cited

U.S. PATENT DOCUMENTS

| | | |
|---|---|---|
| 3,343,034 A | 9/1967 | Ovshinsky |
| 3,379,943 A | 4/1968 | Breedlove |
| 3,381,244 A | 4/1968 | Dalley |
| 3,488,528 A | 1/1970 | Emond |
| 3,496,434 A | 2/1970 | Prokopowicz |
| 3,519,959 A | 7/1970 | Bewley et al. |
| 3,534,301 A | 10/1970 | Golembeski |
| 3,568,000 A | 3/1971 | Martre et al. |
| 3,573,677 A | 4/1971 | Detar |
| 3,652,941 A | 3/1972 | Neuf |
| 3,680,005 A | 7/1972 | Bewley et al. |
| 3,681,612 A | 8/1972 | Vogl |
| 3,688,361 A | 9/1972 | Bonini |
| 3,691,563 A | 9/1972 | Shelton |
| 3,701,958 A | 10/1972 | Herbert |
| 3,736,471 A | 5/1973 | Donze et al. |
| 3,740,678 A | 6/1973 | Hill |
| 3,742,420 A | 6/1973 | Harnden, Jr. |
| 3,764,727 A | 10/1973 | Balde |
| 3,790,858 A | 2/1974 | Brancaleone et al. |
| 3,842,374 A | 10/1974 | Schlicke |
| 3,880,493 A | 4/1975 | Lockhart, Jr. |
| 3,896,354 A | 7/1975 | Coleman et al. |
| 3,898,541 A | 8/1975 | Weller |
| 3,921,041 A | 11/1975 | Stockman |
| 4,023,071 A | 5/1977 | Fussell |
| 4,030,190 A | 6/1977 | Varker |
| 4,071,878 A | 1/1978 | Stynes |
| 4,081,770 A | 3/1978 | Mayer |
| 4,119,084 A | 10/1978 | Eckels |
| 4,135,132 A | 1/1979 | Tafjord |
| 4,139,783 A | 2/1979 | Engeler |
| 4,148,003 A | 4/1979 | Colburn et al. |
| 4,160,220 A | 7/1979 | Stachejko |
| 4,191,986 A | 3/1980 | ta Huang et al. |
| 4,198,613 A | 4/1980 | Whitley |
| 4,237,522 A | 12/1980 | Thompson |
| 4,259,604 A | 3/1981 | Aoki |
| 4,262,317 A | 4/1981 | Baumbach |
| 4,275,945 A | 6/1981 | Krantz et al. |
| 4,290,041 A | 9/1981 | Utsumi et al. |
| 4,292,558 A | 9/1981 | Flick et al. |
| 4,308,509 A | 12/1981 | Tsuchiya et al. |
| 4,312,023 A | 1/1982 | Frappart et al. |
| 4,312,026 A | 1/1982 | Iwaya et al. |
| 4,320,364 A | 3/1982 | Sakamoto et al. |
| 4,322,698 A | 3/1982 | Takahashi et al. |
| 4,328,530 A | 5/1982 | Bajorek et al. |
| 4,328,531 A | 5/1982 | Nagashima et al. |
| 4,335,417 A | 6/1982 | Sakshaug et al. |
| 4,342,143 A | 8/1982 | Jennings |
| 4,349,862 A | 9/1982 | Bajorek et al. |
| 4,353,040 A | 10/1982 | Krumm et al. |
| 4,353,044 A | 10/1982 | Nossek |
| 4,366,456 A | 12/1982 | Ueno et al. |
| 4,374,368 A | 2/1983 | Viola et al. |
| 4,375,053 A | 2/1983 | Viola et al. |
| 4,384,263 A | 5/1983 | Neuman et al. |
| 4,394,639 A | 7/1983 | McGalliard |
| 4,412,146 A | 10/1983 | Futterer et al. |
| 4,424,552 A | 1/1984 | Saint Marcoux |
| 4,441,088 A | 4/1984 | Anderson |
| 4,494,083 A | 1/1985 | Josefsson et al. |
| 4,494,092 A | 1/1985 | Griffin et al. |
| 4,498,122 A | 2/1985 | Rainal |
| 4,533,931 A | 8/1985 | Mandai et al. |
| 4,541,035 A | 9/1985 | Carlson et al. |
| 4,551,746 A | 11/1985 | Gilbert et al. |
| 4,551,747 A | 11/1985 | Gilbert et al. |
| 4,553,114 A | 11/1985 | English et al. |
| 4,556,929 A | 12/1985 | Tanaka et al. |
| 4,560,962 A | 12/1985 | Barrow |
| 4,563,659 A | 1/1986 | Sakamoto |
| 4,577,214 A | 3/1986 | Schaper |
| 4,586,104 A | 4/1986 | Standler |
| 4,587,589 A | 5/1986 | Marek |
| 4,590,537 A | 5/1986 | Sakamoto |
| 4,592,606 A | 6/1986 | Mudra |
| 4,597,029 A | 6/1986 | Kucharek et al. |
| 4,612,140 A | 9/1986 | Mandai |
| 4,612,497 A | 9/1986 | Ulmer |
| 4,626,958 A | 12/1986 | Lockard et al. |
| 4,628,411 A | 12/1986 | Balderes et al. |
| 4,633,368 A | 12/1986 | Frederick |
| 4,636,752 A | 1/1987 | Saito |
| 4,639,826 A | 1/1987 | Val et al. |
| 4,654,694 A | 3/1987 | Val |
| 4,658,334 A | 4/1987 | McSparran et al. |
| 4,665,465 A | 5/1987 | Tanabe |
| 4,667,267 A | 5/1987 | Hernandez et al. |
| 4,675,644 A | 6/1987 | Ott et al. |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,706,162 A | 11/1987 | Hernandez et al. |
| 4,707,671 A | 11/1987 | Suzuki et al. |
| 4,710,854 A | 12/1987 | Yamada et al. |
| 4,712,062 A | 12/1987 | Takamine |
| 4,712,540 A | 12/1987 | Tucker et al. |
| 4,713,540 A | 12/1987 | Gilby et al. |
| 4,720,690 A | 1/1988 | Popek et al. |
| 4,720,760 A | 1/1988 | Starr |
| 4,725,878 A | 2/1988 | Miyauchi et al. |
| 4,729,058 A | 3/1988 | Gupta et al. |
| 4,734,818 A | 3/1988 | Hernandez et al. |
| 4,734,819 A | 3/1988 | Hernandez et al. |
| 4,739,448 A | 4/1988 | Rowe et al. |
| 4,746,557 A | 5/1988 | Sakamoto et al. |
| 4,752,752 A | 6/1988 | Okubo |
| 4,755,910 A | 7/1988 | Val |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,785,135 A | 11/1988 | Ecker et al. |
| 4,785,271 A | 11/1988 | Higgins |
| 4,789,847 A | 12/1988 | Sakamoto et al. |
| 4,793,058 A | 12/1988 | Venaleck |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,799,128 A | 1/1989 | Chen |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,827,327 A | 5/1989 | Miyauchi et al. |
| 4,845,606 A | 7/1989 | Herbert |
| 4,847,730 A | 7/1989 | Konno et al. |
| 4,856,102 A | 8/1989 | Insetta et al. |

(56) References Cited

U.S. PATENT DOCUMENTS

| | | |
|---|---|---|
| 4,864,465 A | 9/1989 | Robbins |
| 4,875,087 A | 10/1989 | Miyauchi et al. |
| 4,884,170 A | 11/1989 | Ohki et al. |
| 4,891,616 A | 1/1990 | Renken et al. |
| 4,891,686 A | 1/1990 | Krausse |
| 4,901,039 A | 2/1990 | Corzine et al. |
| 4,904,967 A | 2/1990 | Morii et al. |
| 4,908,586 A | 3/1990 | Kling et al. |
| 4,908,590 A | 3/1990 | Sakamoto et al. |
| 4,909,909 A | 3/1990 | Florjancic et al. |
| 4,916,576 A | 4/1990 | Herbert et al. |
| 4,924,340 A | 5/1990 | Sweet |
| 4,942,353 A | 7/1990 | Herbert et al. |
| 4,945,399 A | 7/1990 | Brown et al. |
| 4,947,286 A | 8/1990 | Kaneko et al. |
| 4,949,217 A | 8/1990 | Ngo |
| 4,954,929 A | 9/1990 | Baran |
| 4,967,315 A | 10/1990 | Schelhorn |
| 4,975,761 A | 12/1990 | Chu |
| 4,978,906 A | 12/1990 | Herbert et al. |
| 4,982,311 A | 1/1991 | Dehaine et al. |
| 4,989,117 A | 1/1991 | Hernandez |
| 4,990,202 A | 2/1991 | Murata et al. |
| 4,994,936 A | 2/1991 | Hernandez |
| 4,999,595 A | 3/1991 | Azumi et al. |
| 5,012,386 A | 4/1991 | McShane et al. |
| 5,018,047 A | 5/1991 | Insetta et al. |
| 5,027,253 A | 6/1991 | Lauffer et al. |
| 5,029,062 A | 7/1991 | Capel |
| 5,034,709 A | 7/1991 | Azumi et al. |
| 5,034,710 A | 7/1991 | Kawaguchi |
| 5,034,850 A | 7/1991 | Hernandez et al. |
| 5,034,851 A | 7/1991 | Monsorno et al. |
| 5,040,092 A | 8/1991 | Katho et al. |
| 5,040,093 A | 8/1991 | Greuel |
| 5,041,899 A | 8/1991 | Oku et al. |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,075,665 A | 12/1991 | Taira et al. |
| 5,079,069 A | 1/1992 | Howard et al. |
| 5,079,223 A | 1/1992 | Maroni |
| 5,079,669 A | 1/1992 | Williams |
| 5,083,101 A | 1/1992 | Frederick |
| 5,089,688 A | 2/1992 | Fang et al. |
| 5,089,880 A | 2/1992 | Meyer et al. |
| 5,089,881 A | 2/1992 | Panicker |
| 5,095,402 A | 3/1992 | Hernandez et al. |
| 5,099,387 A | 3/1992 | Kato et al. |
| 5,105,333 A | 4/1992 | Yamano et al. |
| 5,107,394 A | 4/1992 | Naito et al. |
| 5,109,206 A | 4/1992 | Carlile |
| 5,115,221 A | 5/1992 | Cowman |
| 5,119,062 A | 6/1992 | Nakamura et al. |
| 5,140,297 A | 8/1992 | Jacobs et al. |
| 5,140,496 A | 8/1992 | Heinks et al. |
| 5,140,497 A | 8/1992 | Kato et al. |
| 5,142,352 A | 8/1992 | Chambers et al. |
| 5,142,430 A | 8/1992 | Anthony |
| 5,146,191 A | 9/1992 | Mandai et al. |
| 5,148,005 A | 9/1992 | Fang et al. |
| 5,150,088 A | 9/1992 | Virga et al. |
| 5,151,770 A | 9/1992 | Inoue |
| 5,153,379 A | 10/1992 | Guzuk et al. |
| 5,155,464 A | 10/1992 | Cowman et al. |
| 5,155,655 A | 10/1992 | Howard et al. |
| 5,159,750 A | 11/1992 | Dutta et al. |
| 5,161,086 A | 11/1992 | Howard et al. |
| 5,162,977 A | 11/1992 | Paurus et al. |
| 5,165,055 A | 11/1992 | Metsler |
| 5,166,772 A | 11/1992 | Soldner et al. |
| 5,167,483 A | 12/1992 | Gardiner |
| 5,170,317 A | 12/1992 | Yamada et al. |
| 5,172,299 A | 12/1992 | Yamada et al. |
| 5,173,670 A | 12/1992 | Naito et al. |
| 5,173,767 A | 12/1992 | Lange et al. |
| 5,177,594 A | 1/1993 | Chance et al. |
| 5,177,663 A | 1/1993 | Ingleson et al. |
| 5,177,670 A | 1/1993 | Shinohara et al. |
| 5,179,362 A | 1/1993 | Okochi et al. |
| 5,181,859 A | 1/1993 | Foreman et al. |
| 5,184,210 A | 2/1993 | Westbrook |
| 5,186,647 A | 2/1993 | Denkmann et al. |
| 5,187,455 A | 2/1993 | Mandai et al. |
| 5,206,786 A | 4/1993 | Lee |
| 5,208,502 A | 5/1993 | Yamashita et al. |
| 5,212,402 A | 5/1993 | Higgins, III |
| 5,216,278 A | 6/1993 | Lin et al. |
| 5,218,230 A | 6/1993 | Tamamura et al. |
| 5,219,812 A | 6/1993 | Doi et al. |
| 5,220,480 A | 6/1993 | Kershaw, Jr. et al. |
| 5,220,483 A | 6/1993 | Scott |
| 5,223,741 A | 6/1993 | Bechtel et al. |
| 5,225,709 A | 7/1993 | Nishiuma et al. |
| 5,227,951 A | 7/1993 | deNeuf et al. |
| 5,235,208 A | 8/1993 | Katoh |
| 5,236,376 A | 8/1993 | Cohen |
| 5,237,204 A | 8/1993 | Val |
| 5,243,308 A | 9/1993 | Shusterman et al. |
| 5,251,092 A | 10/1993 | Brady et al. |
| 5,257,950 A | 11/1993 | Lenker et al. |
| 5,261,153 A | 11/1993 | Lucas |
| 5,262,611 A | 11/1993 | Danysh et al. |
| 5,264,983 A | 11/1993 | Petrinec |
| 5,268,810 A | 12/1993 | DiMarco et al. |
| 5,272,590 A | 12/1993 | Hernandez |
| 5,278,524 A | 1/1994 | Mullen |
| 5,283,717 A | 2/1994 | Hundt |
| 5,290,191 A | 3/1994 | Foreman et al. |
| 5,294,751 A | 3/1994 | Kamada |
| 5,294,826 A | 3/1994 | Marcantonio et al. |
| 5,299,956 A | 4/1994 | Brownell et al. |
| 5,300,760 A | 4/1994 | Batliwalla et al. |
| 5,303,419 A | 4/1994 | Ittipiboon et al. |
| 5,309,024 A | 5/1994 | Hirano |
| 5,309,121 A | 5/1994 | Kobayashi et al. |
| 5,310,363 A | 5/1994 | Brownell et al. |
| 5,311,408 A | 5/1994 | Ferchau et al. |
| 5,313,176 A | 5/1994 | Upadhyay |
| 5,319,525 A | 6/1994 | Lightfoot |
| 5,321,373 A | 6/1994 | Shusterman et al. |
| 5,321,573 A | 6/1994 | Person et al. |
| 5,326,284 A | 7/1994 | Bohbot et al. |
| 5,331,505 A | 7/1994 | Wilheim |
| 5,333,095 A | 7/1994 | Stevenson et al. |
| 5,337,028 A | 8/1994 | White |
| 5,338,970 A | 8/1994 | Boyle et al. |
| 5,349,314 A | 9/1994 | Shimizu et al. |
| 5,353,189 A | 10/1994 | Tomlinson |
| 5,353,202 A | 10/1994 | Ansell et al. |
| 5,355,016 A | 10/1994 | Swirbel et al. |
| 5,357,568 A | 10/1994 | Pelegris |
| 5,362,249 A | 11/1994 | Carter |
| 5,362,254 A | 11/1994 | Siemon et al. |
| 5,365,203 A | 11/1994 | Nakamura et al. |
| 5,367,430 A | 11/1994 | DeVoe et al. |
| 5,369,379 A | 11/1994 | Fujiki |
| 5,369,390 A | 11/1994 | Lin et al. |
| 5,369,545 A | 11/1994 | Bhattacharyya et al. |
| 5,371,653 A | 12/1994 | Kametani et al. |
| 5,374,909 A | 12/1994 | Hirai et al. |
| 5,376,759 A | 12/1994 | Marx et al. |
| 5,378,407 A | 1/1995 | Chandler et al. |
| 5,382,928 A | 1/1995 | Davis et al. |
| 5,382,938 A | 1/1995 | Hansson et al. |
| 5,386,335 A | 1/1995 | Amano et al. |
| 5,386,627 A | 2/1995 | Booth et al. |
| 5,396,201 A | 3/1995 | Ishizaki et al. |
| 5,396,397 A | 3/1995 | McClanahan et al. |
| 5,399,898 A | 3/1995 | Rostoker |
| 5,401,952 A | 3/1995 | Sugawa |
| 5,402,318 A | 3/1995 | Otsuka et al. |
| 5,404,044 A | 4/1995 | Booth et al. |

(56) References Cited

U.S. PATENT DOCUMENTS

| | | |
|---|---|---|
| 5,405,466 A | 4/1995 | Naito et al. |
| 5,414,299 A | 5/1995 | Wang et al. |
| 5,414,393 A | 5/1995 | Rose et al. |
| 5,414,587 A | 5/1995 | Kiser et al. |
| 5,420,553 A | 5/1995 | Sakamoto et al. |
| 5,426,560 A | 6/1995 | Amaya et al. |
| 5,428,885 A | 7/1995 | Takaya et al. |
| 5,430,605 A | 7/1995 | deNeuf et al. |
| 5,432,484 A | 7/1995 | Klas et al. |
| 5,446,625 A | 8/1995 | Urbish et al. |
| 5,448,445 A | 9/1995 | Yamate et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,457,340 A | 10/1995 | Templeton et al. |
| 5,461,351 A | 10/1995 | Shusterman |
| 5,463,232 A | 10/1995 | Yamashita et al. |
| 5,467,064 A | 11/1995 | Gu |
| 5,468,997 A | 11/1995 | Imai et al. |
| 5,471,027 A | 11/1995 | Call et al. |
| 5,471,035 A | 11/1995 | Holmes |
| 5,471,181 A | 11/1995 | Park |
| 5,473,813 A | 12/1995 | Chobot et al. |
| 5,474,458 A | 12/1995 | Vafi et al. |
| 5,475,262 A | 12/1995 | Wang et al. |
| 5,475,565 A | 12/1995 | Bhattacharyya et al. |
| 5,475,606 A | 12/1995 | Muyshondt et al. |
| 5,477,933 A | 12/1995 | Nguyen |
| 5,481,238 A | 1/1996 | Carsten et al. |
| 5,483,407 A | 1/1996 | Anastasio et al. |
| 5,483,413 A | 1/1996 | Babb |
| 5,488,540 A | 1/1996 | Hatta |
| 5,489,882 A | 2/1996 | Ueno |
| 5,491,299 A | 2/1996 | Naylor et al. |
| 5,491,301 A | 2/1996 | Akiba et al. |
| 5,493,259 A | 2/1996 | Blalock et al. |
| 5,493,260 A | 2/1996 | Park |
| 5,495,180 A | 2/1996 | Huang et al. |
| 5,499,445 A | 3/1996 | Boyle et al. |
| 5,500,629 A | 3/1996 | Meyer |
| 5,500,785 A | 3/1996 | Funada |
| 5,500,789 A | 3/1996 | Miller et al. |
| 5,506,755 A | 4/1996 | Miyagi et al. |
| 5,508,938 A | 4/1996 | Wheeler |
| 5,512,196 A | 4/1996 | Mantese et al. |
| 5,519,650 A | 5/1996 | Ichimura et al. |
| 5,528,083 A | 6/1996 | Malladi et al. |
| 5,530,288 A | 6/1996 | Stone |
| 5,531,003 A | 7/1996 | Seifried et al. |
| 5,534,837 A | 7/1996 | Brandt |
| 5,535,101 A | 7/1996 | Miles et al. |
| 5,536,978 A | 7/1996 | Cooper et al. |
| 5,541,482 A | 7/1996 | Siao |
| 5,544,002 A | 8/1996 | Iwaya et al. |
| 5,546,058 A | 8/1996 | Azuma et al. |
| 5,548,255 A | 8/1996 | Spielman |
| 5,555,150 A | 9/1996 | Newman, Jr. |
| 5,556,811 A | 9/1996 | Agatstein et al. |
| 5,557,142 A | 9/1996 | Gilmore et al. |
| 5,566,040 A | 10/1996 | Cosquer et al. |
| 5,568,348 A | 10/1996 | Foreman et al. |
| 5,570,278 A | 10/1996 | Cross |
| 5,574,630 A | 11/1996 | Kresge et al. |
| 5,583,359 A | 12/1996 | Ng et al. |
| 5,583,470 A | 12/1996 | Okubo |
| 5,583,738 A | 12/1996 | Kohno et al. |
| 5,583,739 A | 12/1996 | Vu et al. |
| 5,586,007 A | 12/1996 | Funada |
| 5,586,011 A | 12/1996 | Alexander |
| 5,587,333 A | 12/1996 | Johansson et al. |
| 5,587,920 A | 12/1996 | Muyshondt et al. |
| 5,590,016 A | 12/1996 | Fujishiro |
| 5,590,030 A | 12/1996 | Kametani et al. |
| 5,592,391 A | 1/1997 | Muyshondt et al. |
| 5,604,668 A | 2/1997 | Wohrstein et al. |
| 5,610,796 A | 3/1997 | Lavene |
| 5,612,657 A | 3/1997 | Kledzik |
| 5,614,111 A | 3/1997 | Lavene |
| 5,614,881 A | 3/1997 | Duggal et al. |
| 5,618,185 A | 4/1997 | Aekins |
| 5,619,079 A | 4/1997 | Wiggins et al. |
| 5,623,160 A | 4/1997 | Liberkowski |
| 5,624,592 A | 4/1997 | Paustian |
| 5,625,166 A | 4/1997 | Natarajan |
| 5,625,225 A | 4/1997 | Huang et al. |
| 5,633,479 A | 5/1997 | Hirano |
| 5,634,268 A | 6/1997 | Dalal et al. |
| 5,635,669 A | 6/1997 | Kubota et al. |
| 5,635,767 A | 6/1997 | Wenzel et al. |
| 5,635,775 A | 6/1997 | Colburn et al. |
| 5,640,048 A | 6/1997 | Selna |
| 5,641,988 A | 6/1997 | Huang et al. |
| 5,644,468 A | 7/1997 | Wink et al. |
| 5,645,746 A | 7/1997 | Walsh |
| 5,647,766 A | 7/1997 | Nguyen |
| 5,647,767 A | 7/1997 | Scheer et al. |
| 5,659,455 A | 8/1997 | Herbert |
| 5,668,511 A | 9/1997 | Furutani et al. |
| 5,672,911 A | 9/1997 | Patil et al. |
| 5,682,303 A | 10/1997 | Goad |
| 5,692,298 A | 12/1997 | Goetz et al. |
| 5,700,167 A | 12/1997 | Pharney et al. |
| 5,708,296 A | 1/1998 | Bhansali |
| 5,708,553 A | 1/1998 | Hung |
| 5,717,249 A | 2/1998 | Yoshikawa et al. |
| 5,719,440 A | 2/1998 | Moden |
| 5,719,450 A | 2/1998 | Vora |
| 5,719,477 A | 2/1998 | Tomihari |
| 5,719,750 A | 2/1998 | Iwane |
| 5,726,612 A | 3/1998 | Mandai et al. |
| 5,731,960 A | 3/1998 | Fung |
| 5,734,198 A | 3/1998 | Stave |
| 5,741,729 A | 4/1998 | Selna |
| 5,742,210 A | 4/1998 | Chaturvedi et al. |
| 5,742,470 A | 4/1998 | Raets |
| 5,745,333 A | 4/1998 | Frankeny et al. |
| 5,751,539 A | 5/1998 | Stevenson et al. |
| 5,756,380 A | 5/1998 | Berg et al. |
| 5,757,252 A | 5/1998 | Cho et al. |
| 5,761,049 A | 6/1998 | Yoshidome et al. |
| 5,764,489 A | 6/1998 | Leigh et al. |
| 5,767,446 A | 6/1998 | Ha et al. |
| 5,770,476 A | 6/1998 | Stone |
| 5,777,383 A | 7/1998 | Stager et al. |
| 5,786,238 A | 7/1998 | Pai et al. |
| 5,786,630 A | 7/1998 | Bhansali et al. |
| 5,789,999 A | 8/1998 | Barnett et al. |
| 5,790,368 A | 8/1998 | Naito et al. |
| 5,796,170 A | 8/1998 | Marcantonio |
| 5,796,568 A | 8/1998 | Baiatu |
| 5,796,595 A | 8/1998 | Cross |
| 5,797,770 A | 8/1998 | Davis et al. |
| 5,801,579 A | 9/1998 | Le et al. |
| 5,801,597 A | 9/1998 | Carter et al. |
| 5,808,873 A | 9/1998 | Celaya et al. |
| 5,812,380 A | 9/1998 | Frech et al. |
| 5,815,050 A | 9/1998 | Brooks et al. |
| 5,815,051 A | 9/1998 | Hamasaki et al. |
| 5,815,373 A | 9/1998 | Johnsen et al. |
| 5,817,130 A | 10/1998 | Cox et al. |
| 5,818,313 A | 10/1998 | Estes et al. |
| 5,822,174 A | 10/1998 | Yamate et al. |
| 5,825,084 A | 10/1998 | Lau et al. |
| 5,825,628 A | 10/1998 | Garbelli et al. |
| 5,827,382 A | 10/1998 | Ogawa et al. |
| 5,828,093 A | 10/1998 | Naito et al. |
| 5,828,272 A | 10/1998 | Romerein et al. |
| 5,828,555 A | 10/1998 | Itoh |
| 5,831,489 A | 11/1998 | Wire |
| 5,834,992 A | 11/1998 | Kato et al. |
| 5,835,338 A | 11/1998 | Suzuki et al. |
| 5,838,216 A | 11/1998 | White et al. |
| 5,838,551 A | 11/1998 | Chan |

(56) References Cited

U.S. PATENT DOCUMENTS

| | | |
|---|---|---|
| 5,847,936 A | 12/1998 | Forehand et al. |
| 5,854,534 A | 12/1998 | Beilin et al. |
| 5,864,089 A | 1/1999 | Rainal |
| 5,867,361 A | 2/1999 | Wolf et al. |
| 5,870,272 A | 2/1999 | Seifried et al. |
| 5,870,273 A | 2/1999 | Sogabe et al. |
| 5,872,695 A | 2/1999 | Fasano et al. |
| 5,875,099 A | 2/1999 | Maesaka et al. |
| 5,880,925 A | 3/1999 | DuPre et al. |
| 5,889,445 A | 3/1999 | Ritter et al. |
| 5,892,415 A | 4/1999 | Okamura |
| 5,894,252 A | 4/1999 | Oida |
| 5,895,990 A | 4/1999 | Lau |
| 5,898,403 A | 4/1999 | Saitoh et al. |
| 5,898,562 A | 4/1999 | Cain et al. |
| 5,898,576 A | 4/1999 | Lockwood et al. |
| 5,900,350 A | 5/1999 | Provost et al. |
| 5,905,627 A | 5/1999 | Brendel et al. |
| 5,907,265 A | 5/1999 | Sakuragawa et al. |
| 5,908,151 A | 6/1999 | Elias |
| 5,909,155 A | 6/1999 | Anderson et al. |
| 5,909,350 A | 6/1999 | Anthony |
| 5,910,755 A | 6/1999 | Mishiro et al. |
| 5,910,879 A | 6/1999 | Herbert |
| 5,912,809 A | 6/1999 | Steigerwald et al. |
| 5,917,388 A | 6/1999 | Tronche et al. |
| 5,923,523 A | 7/1999 | Herbert |
| 5,923,540 A | 7/1999 | Asada et al. |
| 5,925,925 A | 7/1999 | Dehaine et al. |
| 5,926,377 A | 7/1999 | Nakao et al. |
| 5,928,076 A | 7/1999 | Clements et al. |
| 5,929,729 A | 7/1999 | Swarup |
| 5,955,930 A | 9/1999 | Anderson et al. |
| 5,959,829 A | 9/1999 | Stevenson et al. |
| 5,959,846 A | 9/1999 | Noguchi et al. |
| 5,969,461 A | 10/1999 | Anderson et al. |
| 5,969,583 A | 10/1999 | Hutchison |
| 5,973,906 A | 10/1999 | Stevenson et al. |
| 5,973,928 A | 10/1999 | Blasi et al. |
| 5,977,845 A | 11/1999 | Kitahara |
| 5,978,231 A | 11/1999 | Tohya et al. |
| 5,980,718 A | 11/1999 | Van Konynenburg et al. |
| 5,982,018 A | 11/1999 | Wark et al. |
| 5,986,340 A | 11/1999 | Mostafazadeh et al. |
| 5,995,352 A | 11/1999 | Gumley |
| 5,995,591 A | 11/1999 | Halim |
| 5,999,067 A | 12/1999 | D'Ostilio |
| 5,999,398 A | 12/1999 | Makl et al. |
| 6,004,752 A | 12/1999 | Loewy et al. |
| 6,013,957 A | 1/2000 | Puzo et al. |
| 6,016,095 A | 1/2000 | Herbert |
| 6,018,448 A | 1/2000 | Anthony |
| 6,021,564 A | 2/2000 | Hanson |
| 6,023,210 A | 2/2000 | Tulintseff |
| 6,023,406 A | 2/2000 | Kinoshita et al. |
| 6,031,710 A | 2/2000 | Wolf et al. |
| 6,034,576 A | 3/2000 | Kuth |
| 6,034,864 A | 3/2000 | Naito et al. |
| 6,037,846 A | 3/2000 | Oberhammer |
| 6,038,121 A | 3/2000 | Naito et al. |
| 6,042,685 A | 3/2000 | Shinada et al. |
| 6,046,898 A | 4/2000 | Seymour et al. |
| 6,052,038 A | 4/2000 | Savicki |
| 6,052,272 A | 4/2000 | Kuroda et al. |
| 6,054,754 A | 4/2000 | Bissey |
| 6,054,758 A | 4/2000 | Lamson |
| 6,061,227 A | 5/2000 | Nogi |
| 6,061,228 A | 5/2000 | Palmer et al. |
| 6,064,286 A | 5/2000 | Ziegner et al. |
| 6,069,786 A | 5/2000 | Horie et al. |
| 6,072,687 A | 6/2000 | Naito et al. |
| 6,072,690 A | 6/2000 | Farooq et al. |
| 6,075,211 A | 6/2000 | Tohya et al. |
| 6,075,285 A | 6/2000 | Taylor et al. |
| 6,078,117 A | 6/2000 | Perrin et al. |
| 6,078,229 A | 6/2000 | Funada et al. |
| 6,084,779 A | 7/2000 | Fang |
| 6,088,235 A | 7/2000 | Chiao et al. |
| 6,091,310 A | 7/2000 | Utsumi et al. |
| 6,092,269 A | 7/2000 | Yializis et al. |
| 6,094,112 A | 7/2000 | Goldberger et al. |
| 6,094,339 A | 7/2000 | Evans |
| 6,097,260 A | 8/2000 | Whybrew et al. |
| 6,097,581 A | 8/2000 | Anthony |
| 6,104,258 A | 8/2000 | Novak |
| 6,104,599 A | 8/2000 | Ahiko et al. |
| 6,108,448 A | 8/2000 | Song et al. |
| 6,111,479 A | 8/2000 | Myohga et al. |
| 6,120,326 A | 9/2000 | Brooks |
| 6,121,761 A | 9/2000 | Herbert |
| 6,125,044 A | 9/2000 | Cherniski et al. |
| 6,130,585 A | 10/2000 | Whybrew et al. |
| 6,133,805 A | 10/2000 | Jain et al. |
| 6,137,161 A | 10/2000 | Gilliland et al. |
| 6,137,392 A | 10/2000 | Herbert |
| 6,142,831 A | 11/2000 | Ashman et al. |
| 6,144,547 A | 11/2000 | Retseptor |
| 6,147,587 A | 11/2000 | Hadano et al. |
| 6,150,895 A | 11/2000 | Steigerwald et al. |
| 6,157,528 A | 12/2000 | Anthony |
| 6,157,547 A | 12/2000 | Brown et al. |
| 6,160,705 A | 12/2000 | Stearns et al. |
| 6,163,454 A | 12/2000 | Strickler |
| 6,163,456 A | 12/2000 | Suzuki et al. |
| 6,165,814 A | 12/2000 | Wark et al. |
| 6,175,287 B1 | 1/2001 | Lampen et al. |
| 6,180,588 B1 | 1/2001 | Walters |
| 6,181,004 B1 | 1/2001 | Koontz et al. |
| 6,181,231 B1 | 1/2001 | Bartilson |
| 6,183,685 B1 | 2/2001 | Cowman et al. |
| 6,184,477 B1 | 2/2001 | Tanahashi |
| 6,184,769 B1 | 2/2001 | Nakamura et al. |
| 6,185,091 B1 | 2/2001 | Tanahashi et al. |
| 6,188,565 B1 | 2/2001 | Naito et al. |
| 6,191,472 B1 | 2/2001 | Mazumder |
| 6,191,475 B1 | 2/2001 | Skinner et al. |
| 6,191,479 B1 | 2/2001 | Herrell et al. |
| 6,191,669 B1 | 2/2001 | Shigemura |
| 6,191,932 B1 | 2/2001 | Kuroda et al. |
| 6,191,933 B1 | 2/2001 | Ishigaki et al. |
| 6,195,269 B1 | 2/2001 | Hino |
| 6,198,123 B1 | 3/2001 | Linder et al. |
| 6,198,362 B1 | 3/2001 | Harada et al. |
| 6,200,400 B1 | 3/2001 | Farooq et al. |
| 6,204,448 B1 | 3/2001 | Garland et al. |
| 6,205,014 B1 | 3/2001 | Inomata et al. |
| 6,207,081 B1 | 3/2001 | Sasaki et al. |
| 6,208,063 B1 | 3/2001 | Horikawa |
| 6,208,225 B1 | 3/2001 | Miller |
| 6,208,226 B1 | 3/2001 | Chen et al. |
| 6,208,494 B1 | 3/2001 | Nakura et al. |
| 6,208,495 B1 | 3/2001 | Wieloch et al. |
| 6,208,501 B1 | 3/2001 | Ingalls et al. |
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |
| 6,211,754 B1 | 4/2001 | Nishida et al. |
| 6,212,060 B1 | 4/2001 | Liu |
| 6,212,078 B1 | 4/2001 | Hunt et al. |
| 6,215,373 B1 | 4/2001 | Novak et al. |
| 6,215,647 B1 | 4/2001 | Naito et al. |
| 6,215,649 B1 | 4/2001 | Appelt et al. |
| 6,218,631 B1 | 4/2001 | Hetzel et al. |
| 6,219,240 B1 | 4/2001 | Sasov |
| 6,222,427 B1 | 4/2001 | Kato et al. |
| 6,222,431 B1 | 4/2001 | Ishizaki et al. |
| 6,225,876 B1 | 5/2001 | Akino et al. |
| 6,226,169 B1 | 5/2001 | Naito et al. |
| 6,226,182 B1 | 5/2001 | Maehara |
| 6,229,226 B1 | 5/2001 | Kramer et al. |
| 6,236,572 B1 | 5/2001 | Teshome et al. |
| 6,240,621 B1 | 6/2001 | Nellissen et al. |
| 6,243,253 B1 | 6/2001 | DuPre et al. |

(56) References Cited

U.S. PATENT DOCUMENTS

| | | | |
|---|---|---|---|
| 6,249,047 B1 | 6/2001 | Corisis | |
| 6,249,439 B1 | 6/2001 | DeMore et al. | |
| 6,252,161 B1 | 6/2001 | Hailey et al. | |
| 6,252,761 B1 | 6/2001 | Branchevsky | |
| 6,262,895 B1 | 7/2001 | Forthun | |
| 6,266,228 B1 | 7/2001 | Naito et al. | |
| 6,266,229 B1 | 7/2001 | Naito et al. | |
| 6,272,003 B1 | 8/2001 | Schaper | |
| 6,281,704 B2 | 8/2001 | Ngai et al. | |
| 6,282,074 B1 | 8/2001 | Anthony | |
| 6,282,079 B1 | 8/2001 | Nagakari et al. | |
| 6,285,109 B1 | 9/2001 | Katagiri et al. | |
| 6,285,542 B1 | 9/2001 | Kennedy, III et al. | |
| 6,288,344 B1 | 9/2001 | Youker et al. | |
| 6,288,906 B1 | 9/2001 | Sprietsma et al. | |
| 6,292,350 B1 | 9/2001 | Naito et al. | |
| 6,292,351 B1 | 9/2001 | Ahiko et al. | |
| 6,300,846 B1 | 10/2001 | Brunker | |
| 6,307,450 B2 | 10/2001 | Takahashi et al. | |
| 6,309,245 B1 | 10/2001 | Sweeney | |
| 6,310,286 B1 | 10/2001 | Troxel et al. | |
| 6,310,759 B2 | 10/2001 | Ishigaki et al. | |
| 6,313,584 B1 | 11/2001 | Johnson et al. | |
| 6,320,547 B1 | 11/2001 | Fathy et al. | |
| 6,323,116 B1 | 11/2001 | Lamson | |
| 6,324,047 B1 | 11/2001 | Hayworth | |
| 6,324,048 B1 | 11/2001 | Liu | |
| 6,325,672 B1 | 12/2001 | Belopolsky et al. | |
| 6,327,134 B1 | 12/2001 | Kuroda et al. | |
| 6,327,137 B1 | 12/2001 | Yamamoto et al. | |
| 6,331,808 B2 | 12/2001 | Mikami et al. | |
| 6,331,926 B1 | 12/2001 | Anthony | |
| 6,331,930 B1 | 12/2001 | Kuroda | |
| 6,342,681 B1 | 1/2002 | Goldberger et al. | |
| 6,344,961 B1 | 2/2002 | Naito et al. | |
| 6,346,743 B1 | 2/2002 | Figueroa et al. | |
| 6,351,120 B2 | 2/2002 | Goldfine et al. | |
| 6,351,194 B2 | 2/2002 | Takahashi et al. | |
| 6,351,369 B1 | 2/2002 | Kuroda et al. | |
| 6,352,914 B2 | 3/2002 | Ball et al. | |
| 6,353,375 B1 | 3/2002 | Kurata | |
| 6,353,540 B1 | 3/2002 | Akiba et al. | |
| 6,365,828 B1 | 4/2002 | Kinoshita et al. | |
| 6,367,133 B2 | 4/2002 | Ikada et al. | |
| 6,370,010 B1 | 4/2002 | Kuroda et al. | |
| 6,370,011 B1 | 4/2002 | Naito et al. | |
| 6,370,937 B2 | 4/2002 | Hsu | |
| 6,373,349 B2 | 4/2002 | Gilbert | |
| 6,373,673 B1 | 4/2002 | Anthony | |
| 6,373,711 B2 | 4/2002 | Yamauchi et al. | |
| 6,377,439 B1 | 4/2002 | Sekidou et al. | |
| 6,381,153 B1 | 4/2002 | Brussels | |
| 6,388,207 B1 | 5/2002 | Figueroa et al. | |
| 6,388,856 B1 | 5/2002 | Anthony | |
| 6,388,865 B1 | 5/2002 | Honda et al. | |
| 6,392,502 B2 | 5/2002 | Sweeney et al. | |
| 6,392,868 B2 | 5/2002 | Ohya et al. | |
| 6,395,996 B1 | 5/2002 | Tsai et al. | |
| 6,396,088 B2 | 5/2002 | Kitsukawa et al. | |
| 6,407,906 B1 | 6/2002 | Ahiko et al. | |
| 6,414,572 B2 | 7/2002 | Satoh et al. | |
| 6,420,941 B2 | 7/2002 | Okada et al. | |
| 6,430,025 B2 | 8/2002 | Naito et al. | |
| 6,430,030 B1 | 8/2002 | Farooq et al. | |
| 6,437,240 B2 | 8/2002 | Smith | |
| 6,437,409 B2 | 8/2002 | Fujii | |
| 6,448,873 B1 | 9/2002 | Mostov | |
| 6,449,828 B2 | 9/2002 | Pahl et al. | |
| 6,456,481 B1 | 9/2002 | Stevenson | |
| 6,462,628 B2 | 10/2002 | Kondo et al. | |
| 6,462,932 B1 | 10/2002 | Naito et al. | |
| 6,466,107 B2 | 10/2002 | Yamamoto | |
| 6,469,595 B2 | 10/2002 | Anthony et al. | |
| 6,473,292 B1 | 10/2002 | Yoshida et al. | |
| 6,475,854 B2 | 11/2002 | Narwankar et al. | |
| 6,477,034 B1 | 11/2002 | Chakravorty et al. | |
| 6,480,425 B2 | 11/2002 | Yanagisawa et al. | |
| 6,483,394 B2 | 11/2002 | Kim | |
| 6,493,202 B2 | 12/2002 | Kappel et al. | |
| 6,496,354 B2 | 12/2002 | Naito et al. | |
| 6,498,710 B1 | 12/2002 | Anthony | |
| 6,501,344 B2 | 12/2002 | Ikata et al. | |
| 6,504,451 B1 | 1/2003 | Yamaguchi | |
| 6,507,200 B2 | 1/2003 | Brandelik et al. | |
| 6,509,640 B1 | 1/2003 | Li et al. | |
| 6,509,807 B1 | 1/2003 | Anthony et al. | |
| 6,510,038 B1 | 1/2003 | Satou et al. | |
| 6,522,182 B2 | 2/2003 | Tomita et al. | |
| 6,522,516 B2 | 2/2003 | Anthony | |
| 6,525,628 B1 | 2/2003 | Ritter et al. | |
| 6,525,635 B2 | 2/2003 | Murata et al. | |
| 6,532,143 B2 | 3/2003 | Figueroa et al. | |
| 6,534,787 B1 | 3/2003 | Hsu | |
| 6,538,527 B2 | 3/2003 | Hidaka | |
| 6,549,389 B2 | 4/2003 | Anthony et al. | |
| 6,549,395 B1 | 4/2003 | Naito et al. | |
| 6,559,484 B1 | 5/2003 | Li et al. | |
| 6,563,688 B2 | 5/2003 | Anthony et al. | |
| 6,567,257 B2 | 5/2003 | Brown | |
| 6,573,805 B2 | 6/2003 | Hidaka et al. | |
| 6,577,493 B2 | 6/2003 | Honda et al. | |
| 6,580,595 B2 | 6/2003 | Anthony et al. | |
| 6,587,016 B2 | 7/2003 | Kadota | |
| 6,587,327 B1 | 7/2003 | Devoe et al. | |
| 6,594,128 B2 | 7/2003 | Anthony | |
| 6,594,136 B2 | 7/2003 | Kuroda et al. | |
| 6,603,372 B1 | 8/2003 | Ishizaki et al. | |
| 6,603,646 B2 | 8/2003 | Anthony et al. | |
| 6,606,011 B2 | 8/2003 | Anthony et al. | |
| 6,606,237 B1 | 8/2003 | Naito et al. | |
| 6,608,538 B2 | 8/2003 | Wang | |
| 6,611,419 B1 | 8/2003 | Chakavorty | |
| 6,618,268 B2 | 9/2003 | Dibene, II et al. | |
| 6,618,943 B2 | 9/2003 | Ashe et al. | |
| 6,624,692 B2 | 9/2003 | Suzuki et al. | |
| 6,633,528 B2 | 10/2003 | Watanabe | |
| 6,636,406 B1 | 10/2003 | Anthony | |
| 6,638,686 B2 | 10/2003 | Sawada et al. | |
| 6,643,903 B2 | 11/2003 | Stevenson et al. | |
| 6,650,203 B2 | 11/2003 | Gerstenberg et al. | |
| 6,650,525 B2 | 11/2003 | Anthony | |
| 6,665,053 B2 | 12/2003 | Korenaga | |
| 6,674,343 B2 | 1/2004 | Gould et al. | |
| 6,687,108 B1 | 2/2004 | Anthony et al. | |
| 6,696,952 B2 | 2/2004 | Zirbes | |
| 6,700,181 B1 | 3/2004 | Coccioli | |
| 6,704,190 B2 | 3/2004 | Honda et al. | |
| 6,707,685 B2 | 3/2004 | Kabumoto et al. | |
| 6,710,263 B2 | 3/2004 | Kobayashi et al. | |
| 6,710,997 B2 | 3/2004 | Honda et al. | |
| 6,717,301 B2 | 4/2004 | De Daran et al. | |
| 6,738,249 B1 | 5/2004 | Anthony et al. | |
| 6,750,739 B2 | 6/2004 | Enokihara et al. | |
| 6,767,787 B2 | 7/2004 | Koh et al. | |
| 6,768,630 B2 | 7/2004 | Togashi | |
| 6,794,961 B2 | 9/2004 | Nagaishi et al. | |
| 6,801,422 B2 | 10/2004 | Mosley | |
| 6,806,806 B2 | 10/2004 | Anthony | |
| 6,812,411 B2 | 11/2004 | Belau et al. | |
| 6,823,730 B2 | 11/2004 | Buck et al. | |
| 6,828,666 B1 | 12/2004 | Herrell et al. | |
| 6,849,945 B2 | 2/2005 | Horiuchi et al. | |
| 6,873,513 B2 | 3/2005 | Anthony | |
| 6,879,481 B2 | 4/2005 | Honda et al. | |
| 6,894,884 B2 | 5/2005 | Anthony, Jr. et al. | |
| 6,909,593 B2 | 6/2005 | Kuroda et al. | |
| 6,942,469 B2 | 9/2005 | Seale et al. | |
| 6,950,293 B2 | 9/2005 | Anthony | |
| 6,954,346 B2 | 10/2005 | Anthony | |
| 6,956,174 B2 | 10/2005 | Khandros et al. | |
| 6,980,414 B1 | 12/2005 | Sutardja | |
| 6,995,983 B1 | 2/2006 | Anthony et al. | |
| 7,042,303 B2 | 5/2006 | Anthony et al. | |
| 7,042,703 B2 | 5/2006 | Anthony et al. | |

(56) References Cited

U.S. PATENT DOCUMENTS

| | | |
|---|---|---|
| 7,050,284 B2 | 5/2006 | Anthony |
| 7,106,570 B2 | 9/2006 | Anthony, Jr. et al. |
| 7,109,569 B2 | 9/2006 | Breisch et al. |
| 7,110,227 B2 | 9/2006 | Anthony et al. |
| 7,110,235 B2 | 9/2006 | Anthony, Jr. et al. |
| 7,113,383 B2 | 9/2006 | Anthony et al. |
| 7,141,899 B2 | 11/2006 | Anthony et al. |
| 7,180,718 B2 | 2/2007 | Anthony et al. |
| 7,193,831 B2 | 3/2007 | Anthony |
| 7,224,564 B2 | 5/2007 | Anthony |
| 7,262,949 B2 | 8/2007 | Anthony |
| 7,274,549 B2 | 9/2007 | Anthony |
| 7,301,748 B2 | 11/2007 | Anthony et al. |
| 7,321,485 B2 | 1/2008 | Anthony et al. |
| 7,336,467 B2 | 2/2008 | Anthony et al. |
| 7,336,468 B2 | 2/2008 | Anthony et al. |
| 7,423,860 B2 | 9/2008 | Anthony et al. |
| 7,428,134 B2 | 9/2008 | Anthony |
| 7,433,168 B2 | 10/2008 | Anthony |
| 7,440,252 B2 | 10/2008 | Anthony |
| 7,443,647 B2 | 10/2008 | Anthony |
| 7,586,728 B2 | 9/2009 | Anthony |
| 7,593,208 B2 | 9/2009 | Anthony et al. |
| 7,609,500 B2 | 10/2009 | Anthony et al. |
| 7,609,501 B2 | 10/2009 | Anthony et al. |
| 7,630,188 B2 | 12/2009 | Anthony |
| 7,675,729 B2 | 3/2010 | Anthony et al. |
| 7,688,565 B2 | 3/2010 | Anthony et al. |
| 7,733,621 B2 | 6/2010 | Anthony et al. |
| 7,768,763 B2 | 8/2010 | Anthony et al. |
| 7,782,587 B2 | 8/2010 | Anthony et al. |
| 7,817,397 B2 | 10/2010 | Anthony |
| 7,894,176 B1 | 2/2011 | Anthony |
| 7,916,444 B2 | 3/2011 | Anthony et al. |
| 7,920,367 B2 | 4/2011 | Anthony et al. |
| 7,974,062 B2 | 7/2011 | Anthony et al. |
| 8,004,812 B2 | 8/2011 | Anthony et al. |
| 8,014,119 B2 | 9/2011 | Anthony |
| 8,018,706 B2 | 9/2011 | Anthony et al. |
| 8,023,241 B2 | 9/2011 | Anthony et al. |
| 8,026,777 B2 | 9/2011 | Anthony |
| 8,547,677 B2 | 10/2013 | Anthony et al. |
| 8,587,915 B2 | 11/2013 | Anthony et al. |
| 2001/0001989 A1 | 5/2001 | Smith |
| 2001/0002105 A1 | 5/2001 | Brandelik et al. |
| 2001/0002624 A1 | 6/2001 | Khandros et al. |
| 2001/0008288 A1 | 7/2001 | Kimura et al. |
| 2001/0008302 A1 | 7/2001 | Murakami et al. |
| 2001/0008478 A1 | 7/2001 | McIntosh et al. |
| 2001/0008509 A1 | 7/2001 | Watanabe |
| 2001/0009496 A1 | 7/2001 | Kappel et al. |
| 2001/0010444 A1 | 8/2001 | Pahl et al. |
| 2001/0011763 A1 | 8/2001 | Ushijima et al. |
| 2001/0011934 A1 | 8/2001 | Yamamoto |
| 2001/0011937 A1 | 8/2001 | Satoh et al. |
| 2001/0013626 A1 | 8/2001 | Fujii |
| 2001/0015643 A1 | 8/2001 | Goldfine et al. |
| 2001/0015683 A1 | 8/2001 | Mikami et al. |
| 2001/0017576 A1 | 8/2001 | Kondo et al. |
| 2001/0017579 A1 | 8/2001 | Kurata |
| 2001/0019869 A1 | 9/2001 | Hsu |
| 2001/0020879 A1 | 9/2001 | Takahashi et al. |
| 2001/0021097 A1 | 9/2001 | Ohya et al. |
| 2001/0022547 A1 | 9/2001 | Murata et al. |
| 2001/0023983 A1 | 9/2001 | Kobayashi et al. |
| 2001/0024148 A1 | 9/2001 | Gerstenberg et al. |
| 2001/0028581 A1 | 10/2001 | Yanagisawa et al. |
| 2001/0029648 A1 | 10/2001 | Ikada et al. |
| 2001/0031191 A1 | 10/2001 | Korenaga |
| 2001/0033664 A1 | 10/2001 | Poux et al. |
| 2001/0035801 A1 | 11/2001 | Gilbert |
| 2001/0035802 A1 | 11/2001 | Kadota |
| 2001/0035805 A1 | 11/2001 | Suzuki et al. |
| 2001/0037680 A1 | 11/2001 | Buck et al. |
| 2001/0039834 A1 | 11/2001 | Hsu |
| 2001/0040484 A1 | 11/2001 | Kim |
| 2001/0040487 A1 | 11/2001 | Ikata et al. |
| 2001/0040488 A1 | 11/2001 | Gould et al. |
| 2001/0041305 A1 | 11/2001 | Sawada et al. |
| 2001/0043100 A1 | 11/2001 | Tomita et al. |
| 2001/0043129 A1 | 11/2001 | Hidaka et al. |
| 2001/0043450 A1 | 11/2001 | Seale et al. |
| 2001/0043453 A1 | 11/2001 | Narwankar et al. |
| 2001/0045810 A1 | 11/2001 | Poon et al. |
| 2001/0048581 A1 | 12/2001 | Anthony et al. |
| 2001/0048593 A1 | 12/2001 | Yamauchi et al. |
| 2001/0048906 A1 | 12/2001 | Lau et al. |
| 2001/0050550 A1 | 12/2001 | Yoshida et al. |
| 2001/0050600 A1 | 12/2001 | Anthony et al. |
| 2001/0050837 A1 | 12/2001 | Stevenson et al. |
| 2001/0052833 A1 | 12/2001 | Enokihara et al. |
| 2001/0054512 A1 | 12/2001 | Belau et al. |
| 2001/0054734 A1 | 12/2001 | Koh et al. |
| 2001/0054756 A1 | 12/2001 | Horiuchi et al. |
| 2001/0054936 A1 | 12/2001 | Okada et al. |
| 2002/0000521 A1 | 1/2002 | Brown |
| 2002/0000583 A1 | 1/2002 | Kitsukawa et al. |
| 2002/0000821 A1 | 1/2002 | Haga et al. |
| 2002/0000893 A1 | 1/2002 | Hidaka et al. |
| 2002/0000895 A1 | 1/2002 | Takahashi et al. |
| 2002/0003454 A1 | 1/2002 | Sweeney et al. |
| 2002/0005880 A1 | 1/2002 | Ashe et al. |
| 2002/0024787 A1 | 2/2002 | Anthony |
| 2002/0027263 A1 | 3/2002 | Anthony et al. |
| 2002/0027760 A1 | 3/2002 | Anthony |
| 2002/0044401 A1 | 4/2002 | Anthony et al. |
| 2002/0075096 A1 | 6/2002 | Anthony |
| 2002/0079116 A1 | 6/2002 | Anthony |
| 2002/0089812 A1 | 7/2002 | Anthony et al. |
| 2002/0113663 A1 | 8/2002 | Anthony et al. |
| 2002/0122286 A1 | 9/2002 | Anthony |
| 2002/0131231 A1 | 9/2002 | Anthony |
| 2002/0149900 A1 | 10/2002 | Anthony |
| 2002/0158515 A1 | 10/2002 | Anthony, Jr. et al. |
| 2002/0186100 A1 | 12/2002 | Anthony et al. |
| 2003/0029632 A1 | 2/2003 | Anthony, Jr. et al. |
| 2003/0029635 A1 | 2/2003 | Anthony, Jr. et al. |
| 2003/0048029 A1 | 3/2003 | DeDaran et al. |
| 2003/0067730 A1 | 4/2003 | Anthony et al. |
| 2003/0161086 A1 | 8/2003 | Anthony |
| 2003/0202312 A1 | 10/2003 | Anthony et al. |
| 2003/0206388 A9 | 11/2003 | Anthony et al. |
| 2003/0210125 A1 | 11/2003 | Anthony |
| 2003/0231451 A1 | 12/2003 | Anthony |
| 2003/0231456 A1 | 12/2003 | Anthony et al. |
| 2004/0004802 A1 | 1/2004 | Anthony et al. |
| 2004/0008466 A1 | 1/2004 | Anthony et al. |
| 2004/0027771 A1 | 2/2004 | Anthony |
| 2004/0032304 A1 | 2/2004 | Anthony et al. |
| 2004/0054426 A1 | 3/2004 | Anthony |
| 2004/0085699 A1 | 5/2004 | Anthony |
| 2004/0105205 A1 | 6/2004 | Anthony et al. |
| 2004/0124949 A1 | 7/2004 | Anthony et al. |
| 2004/0130840 A1 | 7/2004 | Anthony |
| 2004/0218332 A1 | 11/2004 | Anthony et al. |
| 2004/0226733 A1 | 11/2004 | Anthony et al. |
| 2005/0016761 A9 | 1/2005 | Anthony, Jr. et al. |
| 2005/0018374 A1 | 1/2005 | Anthony |
| 2005/0063127 A1 | 3/2005 | Anthony |
| 2005/0248900 A1 | 11/2005 | Anthony |
| 2005/0286198 A1 | 12/2005 | Anthony et al. |
| 2006/0023385 A9 | 2/2006 | Anthony et al. |
| 2006/0139836 A1 | 6/2006 | Anthony |
| 2006/0139837 A1 | 6/2006 | Anthony et al. |
| 2006/0193051 A1 | 8/2006 | Anthony et al. |
| 2006/0202414 A1 | 9/2006 | Chen |
| 2006/0203414 A1 | 9/2006 | Anthony |
| 2007/0019352 A1 | 1/2007 | Anthony |
| 2007/0047177 A1 | 3/2007 | Anthony |
| 2007/0057359 A1 | 3/2007 | Anthony et al. |
| 2007/0103839 A1 | 5/2007 | Anthony et al. |
| 2007/0109709 A1 | 5/2007 | Anthony et al. |
| 2008/0160681 A1 | 7/2008 | Anthony et al. |
| 2009/0321127 A1 | 12/2009 | Anthony et al. |

(56) References Cited

U.S. PATENT DOCUMENTS

| | | |
|---|---|---|
| 2010/0078199 A1 | 4/2010 | Anthony et al. |
| 2010/0180438 A1 | 7/2010 | Anthony et al. |
| 2010/0294555 A1 | 11/2010 | Anthony et al. |
| 2010/0307810 A1 | 12/2010 | Anthony et al. |
| 2010/0319978 A1 | 12/2010 | Anthony et al. |
| 2011/0032657 A1 | 2/2011 | Anthony |
| 2011/0141653 A1 | 6/2011 | Anthony |
| 2011/0174523 A1 | 7/2011 | Anthony et al. |
| 2011/0192642 A1 | 8/2011 | Anthony et al. |
| 2012/0000045 A1 | 1/2012 | Anthony et al. |
| 2012/0023741 A1 | 2/2012 | Anthony et al. |
| 2012/0023742 A1 | 2/2012 | Anthony et al. |
| 2012/0034774 A1 | 2/2012 | Anthony et al. |

FOREIGN PATENT DOCUMENTS

| | | |
|---|---|---|
| DE | 197 28 692 A1 | 1/1999 |
| DE | 198 57 043 C1 | 3/2000 |
| EP | 295948 | 12/1988 |
| EP | 563873 | 10/1993 |
| EP | 279769 | 9/1994 |
| EP | 0623363 | 11/1994 |
| EP | 98915364 | 11/1994 |
| EP | 763867 | 3/1997 |
| EP | 0776016 | 5/1997 |
| EP | 872888 | 10/1998 |
| EP | 0933871 | 8/1999 |
| EP | 1022751 | 7/2000 |
| EP | 1024507 | 8/2000 |
| EP | 1061535 | 12/2000 |
| EP | 1128434 | 8/2001 |
| EP | 735606 | 1/2002 |
| EP | 1873872 | 12/2008 |
| FR | 2496970 | 6/1982 |
| FR | 2606207 | 5/1988 |
| FR | 2765417 | 12/1998 |
| FR | 2808135 | 10/2001 |
| GB | 2217136 | 4/1988 |
| GB | 2310967 | 3/2000 |
| GB | 2341980 | 3/2000 |
| JP | 57-172130 | 10/1982 |
| JP | 63-269509 | 11/1988 |
| JP | 1-27251 | 1/1989 |
| JP | 01-120805 | 5/1989 |
| JP | 01-212415 | 8/1989 |
| JP | 02-267879 | 11/1990 |
| JP | 03-18112 | 1/1991 |
| JP | 03-018112 | 1/1991 |
| JP | 03-071614 | 3/1991 |
| JP | 05-205966 | 8/1993 |
| JP | 5-283284 | 10/1993 |
| JP | 05-299292 | 11/1993 |
| JP | 06-020870 | 1/1994 |
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-120704 | 4/1994 |
| JP | 06-151014 | 5/1994 |
| JP | 06-151244 | 5/1994 |
| JP | 06-151245 | 5/1994 |
| JP | 06-231995 | 8/1994 |
| JP | 06-251981 | 9/1994 |
| JP | 06-275463 | 9/1994 |
| JP | 6-302471 | 10/1994 |
| JP | 06-325977 | 11/1994 |
| JP | 11-214244 | 11/1994 |
| JP | 06-267790 | 12/1994 |
| JP | 07-022757 | 1/1995 |
| JP | 07-122757 | 5/1995 |
| JP | 07 161568 | 6/1995 |
| JP | 07-201651 | 8/1995 |
| JP | 07-202477 | 8/1995 |
| JP | 07-235406 | 9/1995 |
| JP | 07-235852 | 9/1995 |
| JP | 07-235862 | 9/1995 |
| JP | 07-240651 | 9/1995 |
| JP | 07-263871 | 10/1995 |
| JP | 07-263280 | 11/1995 |
| JP | 08-97328 | 4/1996 |
| JP | 08-124795 | 5/1996 |
| JP | 08-163122 | 6/1996 |
| JP | 08-172025 | 7/1996 |
| JP | 08-181035 | 7/1996 |
| JP | 8172025 | 7/1996 |
| JP | 08-273973 | 10/1996 |
| JP | 09-232185 | 9/1997 |
| JP | 9-266130 | 10/1997 |
| JP | 09-275145 | 10/1997 |
| JP | 09-284076 | 10/1997 |
| JP | 09-284077 | 10/1997 |
| JP | 09-284078 | 10/1997 |
| JP | 09-293987 | 11/1997 |
| JP | 9-294041 | 11/1997 |
| JP | 10-12490 | 1/1998 |
| JP | 10-41637 | 2/1998 |
| JP | 10-41677 | 2/1998 |
| JP | 10-223470 | 8/1998 |
| JP | 11-21456 | 4/1999 |
| JP | 11-97291 | 4/1999 |
| JP | 11-102839 | 4/1999 |
| JP | 11-214256 | 8/1999 |
| JP | 11-223396 | 8/1999 |
| JP | 11-219824 | 10/1999 |
| JP | 11-294908 | 10/1999 |
| JP | 11-305302 | 11/1999 |
| JP | 11-319222 | 11/1999 |
| JP | 11-345273 | 12/1999 |
| JP | 2000-188218 | 4/2000 |
| JP | 00-188218 | 7/2000 |
| JP | 2000-243646 | 8/2000 |
| JP | 00-261235 | 9/2000 |
| JP | 00-299249 | 10/2000 |
| JP | 2000-286665 | 10/2000 |
| WO | WO9007785 | 7/1990 |
| WO | WO 91/15046 | 10/1991 |
| WO | WO9622008 | 7/1996 |
| WO | WO9641376 | 12/1996 |
| WO | WO 97/20332 | 6/1997 |
| WO | WO 97/43786 | 11/1997 |
| WO | WO 98/45921 | 10/1998 |
| WO | WO 99/04457 | 1/1999 |
| WO | WO 99/19982 | 4/1999 |
| WO | WO 99/37008 | 7/1999 |
| WO | WO 99/52210 | 10/1999 |
| WO | WO 00/16446 | 3/2000 |
| WO | WO 00/65740 | 11/2000 |
| WO | WO 00/74197 | 12/2000 |
| WO | WO 00/77907 | 12/2000 |
| WO | 01/06631 | 1/2001 |
| WO | WO 01/10000 | 2/2001 |
| WO | WO 01/41232 | 6/2001 |
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/27794 | 4/2002 |
| WO | WO 02/33798 | 4/2002 |
| WO | WO 02/45233 | 6/2002 |
| WO | WO 02/065606 | 8/2002 |
| WO | WO 02/080330 | 10/2002 |
| WO | WO 03/005541 | 1/2003 |
| WO | WO 2004/070905 | 8/2004 |
| WO | WO 2005/002018 | 1/2005 |
| WO | WO 2005/015719 | 2/2005 |
| WO | WO 2005/065097 | 7/2005 |

(56) References Cited

FOREIGN PATENT DOCUMENTS

| WO | WO 2006/093830 | 9/2006 |
|---|---|---|
| WO | WO 2006/093831 | 9/2006 |
| WO | WO 2006/099297 | 9/2006 |
| WO | WO 2006/104613 | 10/2006 |
| WO | WO 2007/103965 | 9/2007 |

OTHER PUBLICATIONS

Jan. 2, 2003, PCT International Search Report for PCT/US01/44681.
Greb, "An Intuitive Approach to EM Fields," EMC Test & Design, Jan. 1, 1994, pp. 30-33.
Greb, "An Intuitive Approach to EM Coupling," EMC Test & Design, Dec. 1, 1993, pp. 20-25.
Sakamoto, "Noiseproof Power Supplies: What's Important in EMI Removal Filters?" JEE, Jun. 1, 1986, pp. 80-85.
Montrose, "Analysis on Loop Area Trace Radiated Emissions from Decoupling Capacitor Placement on Printed Circuit Boards," IEEE, Jan. 1, 1999, pp. 423-428.
Miyoshi, "Surface Mounted Distributed Constant Type Noise Filter," IEEE, Jan. 1, 1999, pp. 157-160.
Shigeta et al., "Improved EMI Performance by Use of a Three-Terminal-Capacitor Applied to an IC Power Line," IEEE, Jan. 1, 1999, pp. 161-164.
Jul. 19, 1999, PCT International Search Report for PCT/US99/07653.
Oct. 13, 1999, IPER for PCT/US99/07653.
U.S. Appl. No. 10/479,506, Claims 1-46 from Preliminary Amendment filed Dec. 10, 2003.
U.S. Appl. No. 10/189,339, Claims 1-41 from Preliminary Amendment filed Oct. 28, 2003.
U.S. Appl. No. 10/443,792, Claims 1-41 from Preliminary Amendment filed Oct. 28, 2003.
Aug. 19, 1998, PCT International Search Report for PCT/US98/06962.
Apr. 19, 1999, PCT International Search Report for PCT/US99/01040.
Sep. 18, 2000, PCT International Search Report for PCT/US00/11409.
Sep. 13, 2000, PCT International Search Report for PCT/US00/14626.
Nov. 8, 2000, PCT International Search Report for PCT/US00/16518.
Dec. 28, 2000, PCT International Search Report for PCT/US00/21178.
Carpenter, Jr. et al., "A New Approach to TVSS Design," Power Quality Assurance, Sep./Oct. 1996 p. 60-63.
Raychem, "Polyswitch Resettable Fuses," Circuit Protection Databook, Jan. 1, 1996, pp. 11-18.
Dec. 28, 2001, PCT International Search Report for PCT/US01/41720.
Jun. 13, 2001, PCT International Search Report for PCT/US01/09185.
Polka et al., "Package-Level Interconnect Design for Optimum Electrical Performance," Intel Technology Journal Q3, Jul. 1, 2000, pp. 1-17.
May 10, 2002, PCT International Search Report for PCT/US01/43418.
Mar. 13, 2002, PCT International Search Report for PCT/US01/32480.
Aug. 19, 2002, PCT International Search Report for PCT/US02/10302.
Feb. 28, 2003, PCT International Search Report for PCT/US02/21238.
Mar. 18, 2002, PCT International Search Report for PCT/US01/13911.
Jul. 16, 1991, PCT International Search Report for PCT/US91/02150.
Jun. 28, 2001, PCT International Search Report for PCT/US01/03792.

"Johanson Dielectrics, Inc. Licenses X2Y Circuit Conditioning Technology," Press Release, Dec. 16, 1998, 1 page.
Beyne et al., "PSGA—an innovative IC package for single and multichip designs," Components, Mar. 1, 1997, pp. 6-9.
"EMC Design for Brush Commutated DC Electric Motors," Sep. 15, 1997, pp. 1-2.
"Tomorrow's Capacitors," Components, Apr. 1, 1996, No. 4, p. 3.
Mason, "Valor—Understanding Common Mode Noise," Mar. 30, 1998, pp. 1-7.
Anthony Anthony et al., Pending specification, claims, figures for U.S. Appl. No. 10/237,079, Claims 21-81; filed Sep. 9, 2002.
David Anthony et al., Pending specification, claims, figures for U.S. Appl. No. 10/766,000, Claims 1-63; filed Jan. 29, 2004.
William Anthony, Pending specification, claims, figures for U.S. Appl. No. 10/399,630, Claims 1-35; filed Aug. 27, 2003.
Anthony Anthony et al., Pending specification, claims, figures for U.S. Appl. No. 10/432,840, Claims 1-39; filed May 28, 2003.
William Anthony, Pending specification, claims, figures for U.S. Appl. No. 10/443,482, Claims 1-25; filed Jun. 12, 2003.
Anthony Anthony et al., Pending specification, claims, figures for U.S. Appl. No. 10/435,199, Claims 1-32; filed May 12, 2003.
Anthony Anthony et al., Pending specification, claims, figures for U.S. Appl. No. 10/115,159, Claims 1-31; filed Apr. 2, 2002.
Anthony Anthony et al., Pending specification, claims, figures for U.S. Appl. No. 10/189,338, Claims 1-69; filed Jul. 2, 2002.
Anthony Anthony et al., Pending specification, claims, figures for U.S. Appl. No. 10/189,339, Claims 1-41; filed Jul. 2, 2002.
Anthony Anthony et al., Pending specification, claims, figures for U.S. Appl. No. 10/479,506, Claims 1-46; filed Dec. 10, 2003.
Anthony Anthony, Pending specification, claims, figures for U.S. Appl. No. 10/443,764, Claims 26-40; filed Sep. 16, 2003.
Anthony Anthony, Pending specification, claims, figures for U.S. Appl. No. 10/443,792, Claims 1-41; May 23, 2003.
Anthony Anthony, Pending specification, claims, figures for U.S. Appl. No. 10/443,788, Claims 1-20; filed May 23, 2003.
Anthony Anthony et al., Pending specification, claims, figures for U.S. Appl. No. 10/443,778, Claims 1; 21-59; filed May 23, 2003.
Anthony Anthony et al., Pending specification, claims, figures for U.S. Appl. No. 10/460,361, Claims 1-16; filed Jun. 13, 2003.
Anthony Anthony et al., Pending specification, claims, figures for U.S. Appl. No. 10/705,962, Claims 19-33; filed May 25, 2005.
Anthony Anthony, Pending specification, claims, figures for U.S. Appl. No. 10/369,335, Claims 1-20; Feb. 18, 2003.
Anthony Anthony et al., Pending specification, claims, figures for U.S. Appl. No. 09/647,648, Claims 1-48; filed Nov. 17, 2000.
Anthony Anthony, Pending specification, claims, figures for U.S. Appl. No. 10/328,942, Claims 1-20; filed Dec. 23, 2002.
Anthony Anthony et al., Pending specification, claims, figures for U.S. Appl. No. 09/632,048, Claims 1-20; filed Aug. 3, 2000.
Anthony Anthony et al., Pending specification, claims, figures for U.S. Appl. No. 09/996,355, Claims 1-73; filed Nov. 29, 2001.
Willian Anthony , Pending specification, claims, figures for U.S. Appl. No. 10/023,467, Claims 1-20; filed Dec. 17, 2001.
Jan. 1, 2005, Weir, et al., "DesignCon 2005, High Performance FPGA Bypass Networks".
Apr. 25, 2002, Pending claims 1-40 and figures (3 pages) for U.S. Appl. No. 10/399,590.
Feb. 11, 2005, PCT International Search Report for PCT/US04/00218.
Feb. 18, 2005, PCT International Search Report for PCT/US04/14539.
Mar. 24, 2005, Australian Patent Office Examination Report for SG 200303041-8; Neifeld Ref: X2YA0025UPCT-SG.
Apr. 11, 2005, PCT International Search Report for PCT/US04/18938.
Nov. 2000, Muccioli, "EMC Society Seattle and Oregon Chapters—New X2Y Filter Technology Emerges as Singles Component Solution for Noise Suppression".
Sep. 27, 2005, PCT Corrected IPER of Record for PCT/US04/00218.
Nov. 8, 2005, Supplementary Partial European Search Report EP 99916477.
Oct. 27, 2005, Supplementary European Search Report EP 98915364.

(56) References Cited

OTHER PUBLICATIONS

Dec. 9, 2005, PCT ISR for PCT/US04/39777.
May 8, 2006, EP Examination Report for 99916477.5-2215.
PCT Written Opinion of the International Search Authority, PCT/US2007/063463.
PCT International Search Report, PCT/US2007/063463.
Oct. 31, 2007, PCT International Search Report PCT/US06/06609.
Oct. 31, 2007, PCT Written Opinion of the International Search Authority PCT/US06/06609.
Jun. 12, 2008, PCT International Search Report PCT/US06/06608.
Jun. 12, 2008, PCT Written Opinion of the International Search Authority PCT/US06/06608.
Jun. 12, 2008, PCT International Search Report PCT/US06/06607.
Jun. 12, 2008, PCT Written Opinion of the International Search Authority PCT/US06/06607.
Jun. 17, 2008, PCT International Search Report PCT/US06/08901.
Jun. 17, 2008, PCT Written Opinion of the International Search Authority PCT/US06/08901.
Jun. 6, 2008, European Search Report EP 07 01 9451.
Sep. 25, 2008, European Search Report EP 01 99 4116.
Sep. 25, 2008, European Search Report EP 01 99 9170.
Sep. 25, 2008, European Search Report EP 01 99 0677.
Sep. 18, 2008, PCT Written Opinion of the International Search Authority PCT/US07/063463.
Sep. 25, 2008, European Search Report EP 01 90 8876.
Sep. 25, 2008, European Search Report EP 01 92 2559.
Sep. 25, 2008, European Search Report EP 01 98 1731.
Jan. 24, 1995, Patent Abstracts of Japan, English translation of abstract for JP 07-022757.
Oct. 13, 2000, Patent Abstracts of Japan, English translation of abstract for JP 2000-28665.
Nov. 1, 1960, Cohn, "Characteristic Impedances of Broadside-Coupled Strip Transmission Lines", IRE Transactions on Microwave Theory and Techniques, vol. 8.6, 633-637.
May 1, 1969, Goldmann, "Geometric Optimization of Controlled Collapse Interconnections", IBM Journal of Research and Development, vol. 13.3, pp. 251-265.
Jan. 1, 1974, Howe, Stripline Circuit Design, pp. 1-308.
May 1, 1971, Hines, "Reciprocal and Nonreciprocal Modes of Propagation in Ferrite Stripline and Microstrip Devices", IEEE Transactions on Mircowave Theory and Techniques, vol. MTT-19.5, pp. 442-451.
Sep. 1, 1976, Coda et al., "Design Considerations for High-Frequency Ceramic Chip Capacitors", IEEE, vol. PHP-12.3, pp. 206-212.
Apr. 1, 1985, King, Texas Instruments Design Group Electromagnetic Compatibility Design Guide, pp. 1-98.
Sep. 1, 1987, Robinson et al., "A Midrange VLSI Hewlett-Packard Precision Architecture Computer", Hewlett-Packard Journal, vol. 38.9, pp. 26-37.
Jan. 1, 1988, Chao et al., "Multilayer Thin-Film Substrate for Multichip Packaging", Electronic Components Conference, Proceedings of the 38th, pp. 276-281.
Jan. 1, 1989, Quint et al., "Electrical Design Methodology of a 407 Pin Multi-Layer Ceramic Package", Electronic Components Conference, Proceedings of the 39th, pp. 392-397.
Jan. 1, 1989, Bhat et al., Stripline-Like Transmission Lines for Microwave Integrated Circuits, pp. 1-695.
May 1, 1989, Paul, "A Comparison of the Contributions of Common-mode and Differential Mode Currents in Radiated Emissions", IEEE Transactions on Electromagnetic Compatability, vol. 31.2, pp. 189-193.
Aug. 1, 1989, King et al., Michael King Lecture Notes, pp. 1-14.
May 1, 1982, Bonner et al., "Advanced Printed-Circuit Board Design for High Performance Computer Applications", IBM Journal of Research and Development, vol. 26.3, pp. 297-305.
Jan. 1, 1989, Hnatek et al., "Quality Issues of High Pin Count Fine Pitch VLSI Packages", IEEE International Test Conference, pp. 397-421.
May 1, 1989, Jayaraj et al., "Performance of Low Loss, High Speed Interconnects for Multi-GHz Digital Systems", IEEE Proceedings of the Aerospace and Electronics Conference, vol. 4, pp. 1674-1681.
Jan. 1, 1989, Liang et al., "High-Performance VLSI Through Package-Level Interconnects", IEEE Proceedings 39th Electronic Components Conference, pp. 518-523.
Jun. 1, 1987, Palusinski et al., "Electrical Modeling of Interconnections in Multilayer Packaging Structures", IEEE Transactions on Components, Hybrids, and Manufacturing Technology, vol. 10.2, pp. 217-223.
Sep. 1, 1987, Kwon et al., "Closely Packed Microstrip Lines as Very High-Speed Chip-to-Chip Interconnects", IEEE Transactions on Components, Hybrids, and Manufacturing Technology, vol. 10.3, pp. 314-320.
Dec. 1, 1985, Watari et al., "Packaging Technology for the NEC SX Supercomputer", IEEE Transactions on Components, Packaging, and Manufacturing Technology, vol. 8.4 pp. 462-467.
Jan. 1, 1989, Seraphim et al., "Principles of Electronic Packaging", McGraw-Hill series in electrical engineering.
Nov. 1, 1989, Gisin, "Minimizing Electromagnetic Interference Through Proper Printed Circuit Board Layout Techniques", Wescon/89 Conference Record, pp. 352-354.
Jan. 1, 1983, Wilson et al., "Theoretical and Experimental Analysis of Coupling Characteristics of Dual TEM Cells", IEEE 1983 International Symposium on Electromagnetic Compatibility, pp. 513-517.
Jan. 1, 1985, Keenan, Decoupling and Layout of Digital Printed Circuits, 1.0 to A4-4.
Jan. 1, 1989, AMS International, Electronic Materials Handbook: Packaging, vol. 1, pp. 18-34; 76-88; 127-141; 597-610.
Sep. 1, 1987, Mangelsdorf et al., "A VLSI Processor for HP Precision Architecture", Hewlett-Packard Journal, vol. 38.9, pp. 4-11.
Apr. 1, 1989, Jessen, "VXIbux Product Development Tools", Hewlett-Packard Journal, vol. 40.2, 96-97.
Apr. 1, 1989, Jessen, "VXIbus: A New Interconnection Standard for Modular Instruments", Hewlett-Packard Journal, vol. 40.2, pp. 91-95.
Jan. 1, 1990, Akihiro et al., "Packaging Technology for the NEC SX-3/SX Supercomputer", IEEE Electronic Components and Technology Conference, pp. 525-533.
Smith and Savara, "High-Speed Characteristics of Multilayer Ceramic Packages and Test Fixtures", Gallium Arsenide Integrated Circuit (GaAs IC) Symposium, Jan. 1, 1990. Technical Digest 1990, 12th Annual, pp. 203-206.
Shimada et al., "Large Scale Multilayer Glass-Ceramic Substrate for Supercomputer", IEEE 40th Electronic Components and Technology Conference, Jan. 1, 1990, vol. 1, pp. 76-83.
Jan. 1, 1990, Mielke et al., "High-Speed Fixture Interconnects for Mixed-Signal IC Testing", IEEE International Test Conference, pp. 891-895.
Jan. 1, 1990, Walker, Capacitance, Inductance and Crosstalk Analysis, pp. 1-231.
May 1, 1990, Prymak, "Advanced Decoupling Using Ceramic MLC Capacitors", 40th Electronic Components and Technology Conference, pp. 1014-1023.
Sep. 1, 1990, Moresco, "Electronic System Packaging: The Search for Manufacturing the Optimum in a Sea of Constraints", IEEE Transactions on Components, Hybrids, and Manufacturing Technology, vol. 13.3, pp. 494-508.
Oct. 1, 1990, Quint et al., "Measurement of R, L, and C Parameters in VLSI Packages", Hewlett-Packard Journal, vol. 41.5, pp. 73-77.
Feb. 1, 1991, Henke et al., "A Checklist for EMC-Controlled Printed Circuit Board Designs", Printed Circuit Design, vol. 8.2.
Feb. 1, 1991, Tomlinson, "Bringing Board Layout Up to Speed", Printed Circuit Design, vol. 8.2, pp. 6-10.
Montrose, "Overview on Design Techniques for Printed Circuit Board Layout Used in High Technology Products", IEEE International Symposium on Electromagentic Compatibility, Aug. 1, 1991, pp. 61-66.
Sep. 1, 1991, Nghiem et al., "A General Analysis of Propagation Along Multi-Layer Superconducting Stripline and Microstrip Transmission Lines", IEEE Transactions on Microwave Theory and Techniques, vol. 39.9, pp. 1553-1565.

(56) References Cited

OTHER PUBLICATIONS

Jan. 1, 1991, Tummala et al., "Packaging Technology for IBM's Latest Mainframe Computers (S/390/ES9000)", IEEE, pp. 682-688.
Jan. 1, 1991, Institue for Interconnecting and Packaging Electronic Circuits, IPC-D-275: Design Standard for Rigid Printed Boards and Rigid Printed Board Assemblies, pp. 1-97.
Jan. 1, 1991, Fluke, Controlling Conducted Emissions by Design, pp. 1-334.
Becker et al., "Time domain Electromagnetic Analysis of a Via in a Multilayer Computer Chip Package", Microwave Symposium Digest, Jan. 1, 1992, IEEE MTT-S International, pp. 1229-1232.
Papsioannou et al., "Generic Design Rules for High-Speed MCM's", IEMT 12th International Electronic Manufacturing Technology Symposium, Jan. 1, 1992, pp. 237-244.
Jan. 1, 1992, Wu, "Resistance Computations for Multilayer Packaging Structures by Applying the Boundary Element Method", IEEE Transactions on Components, Packaging, and Manufacturing Technology, vol. 15.1, pp. 87-96.
Feb. 1, 1992, Teener, "A Bus on a Diet—The Serial Bus Alternative—An Introduction to the P1394 High Performance Serial Bus", IEEE Digest of Papers of 37th Computer Society International Conference, Compcon Spring 1992, pp. 316-321.
Feb. 1, 1992, Wyatt, "EMC Design of the HP 54600 Series Oscilloscopes", Hewlett-Packard Journal, vol. 43.1, pp. 41-45.
Apr. 1, 1992, Carey, "Trends in Low Cost, High-Performance Substrate Technology", IEEE Micro, pp. 19-27.
Apr. 1, 1992, DesJardin, "VXIbus: A Standard for Test and Measurement System Architecture", Hewlett-Packard Journal, vol. 43.2, pp. 6-14.
May 1, 1992, Gravelle et al., "EMI/EMC in Printed Circuit Boards—a Literature Review", IEEE Transactions on Electromagnetic Compatibility, vol. 34.2, pp. 109-116.
Jul. 1, 1992, de Vreede, et al., "A High Frequency Model Based on the Physical Structure of the Ceramic Multilayer Capacitor", IEEE Transactions on Microwave Theory and Techniques, vol. 40.7, pp. 1584-1587.
Jan. 1, 1992, Murano et al., "Packaging Technology for the NEC SX-3 Supercomputer", IEEE Transaction on Components, Hybrids, and Manufacturing Technology, pp. 411-417.
Aug. 1, 1992, Pan et al., "The Simulation of High-Speed, High-Density Digital Interconnects in Single Chip Packages and Multichip Modules", IEEE Transactions on Components, Hybrids, and Manufacturing Technology, vol. 15, No. 4, pp. 465-477.
Daijavad et al., "Methodology for Evaluating Practical EMI Design Guidelines Using EM Analysis Programs", IEEE International Symposium on Electromagnetic Compatibility, Aug. 1, 1992, pp. 30-34.
Aug. 1, 1992, Frink et al., "High-Performance Designs for the Low-Cost PA-RISC Desktop", Hewlett-Packard Journal, vol. 43.4, pp. 55-63.
Aug. 1, 1992, Gleason et al., "VLSI Circuits for Low-End and Midrange PA-RISC Computers", Hewlett-Packard Journal, vol. 43.4, pp. 12-22.
Aug. 1, 1992, Lettang, "ECL Clocks for High-Performance RISC Workstations", Hewlett-Packard Journal, vol. 43.4, pp. 23-25.
Sep. 1, 1992, Davidson et al., "Physical and electrical design features of the IBM Enterprise System/9000 circuit Module", IBM J. Res. Develop. vol. 36, No. 5, pp. 877-888.
Oct. 1, 1992, Foss et al., "Fast Interfaces for DRAMs", IEEE Spectrum, vol. 29.10.
Nov. 1, 1992, Bussmann, "Active Compensation of Interconnection Losses for Multi-GHz Clock Distribution Networks", IEEE Transactions on Circuits and Systems II: Analog and Digital Signal Processing, vol. 39.11, pp. 790-798.
Dec. 1, 1992, Matta, "Advances in Integrated Circuit Packaging: Demountable TAB", Hewlett-Packard Journal, vol. 43.6, pp. 62-77.
Dec. 1, 1992, Thomas et al., "Software for the HP EISA SCSI Card", Hewlett-Packard Journal, vol. 43.6, pp. 97-108.
Jan. 1, 1993, Rao et al., "Manufacture of Advanced Cu-PI Multi Chip Modules", IEEE Proceedings 43rd Electronic Components and Technology Conference, pp. 920-934.
Jan. 1, 1993, "Finite-Difference Time-Domain Modeling of Noise in Computer Packages", IEEE, pp. 123-127.
Feb. 1, 1993, Jouppi et al., "A 300MHz 115W 32b Bipolar ECL Microprocessor with On-Chip Caches", IEEE 40th International Solid-State Circuits Conference, 1993 Digest of Papers, pp. 84-85.
Iqbal et al., "Design Tradeoffs Among MCM-C, MCM-D and MCM-D/C Technologies", Multi-Chip Module Conference, Jan. 1, 1993. MCMC-93, Proceedings, 1993 IEEE, pp. 12-18.
Becker et al., "Power Distribution Modelling of High Performance First Level Computer Packages", IEEE Electrical Performance of Electronic Packaging, Jan. 1, 1993, pp. 202-205.
Aug. 1, 1993, Downing et al., "Decoupling Capacitor Effects on Switching Noise", IEEE Transactions on Components, Hybrids, and Manufacturing Technology, vol. 16.5, pp. 484-489.
Nov. 1, 1993, Blennemann et al., "High Aspect Ratio Lines as Low Distortion High Frequency Off-Chip Interconnects", IEEE Transactions on Components, Hybrids, and Manufacturing Technology, vol. 16.7, pp. 692-698.
Becker et al., "Finite-Difference Time-Domain Modeling of Currents in Multi-Layered Computer Chip Packages", IEEE Electrical Performance of Electronic Packaging, Oct. 1, 1993, pp. 181-184.
Yamaguchi et al., "Packaging Technology for High-Speed Multichip Module Using Copper-Polyimide Thin Film Multilayer Substrate [for B-ISDN]", Electronic Manufacturing Technology Symposium, Oct. 1, 1993, Fifteenth IEEE/CHMT International, pp. 406-410.
Dec. 1, 1993, Intel, "AP-125: Designing Microcontroller Systems for Electrically Noisy Environments", pp. 1-21.
Jan. 1, 1993, Institute for Interconnecting and Packaging Electronic Circuits, IPC-T-50: Terms and Definitions Interconnecting and Packaging Electronic Circuits, pp. 1-71.
Feb. 1, 1993, IEEE, IEEE Std 1155-1992: IEEE Standard for VMEbus Extensions for Instrumentation: VXIbus, pp. 1-199.
Jun. 1, 1993, Asprey et al., "Performance Features of the PA7100 Microprocessor", IEEE Micro, vol. 13.3, pp. 22-35.
Jun. 1, 1993, McLellan, "The alpha AXP Architecture and 21064 Processor", IEEE Micro, vol. 13.3, pp. 36-47.
Jan. 1, 1994, Kambe et al., "MCM Substrate with High Capacitance", Proceedings of the 1994 International Conference on Multichip Modules, pp. 136-141.
Center for Electronic Packaging Research, "Simultaneous Switching Noise: Influence of Plane-Plane and Plane-Signal Trace Coupling", Electronic Components and Technology Conference, Jan. 1, 1994. Proceedings, 44th, pp. 957-961.
Dimos et al., "Thin-Film Decoupling Capacitors for Multichip Modules", Electronic Components and Technology Conference, Jan. 1, 1994. Proceedings, 44th, pp. 894-899.
Jan. 1, 1994, Ida et al., "An L-Band Power Amplifier Multi-Chip-Module Using Multi-Layered Planar Circuits", IEEE MTT-S International Microwave Symposium Digest 1994, vol. 3, pp. 1649-1652.
Schaper et al., "Electrical Characterization of the Interconnected Mesh Power System (IMPS) MCM Topology", IEEE Proceedings 44th Electronic Components and Technology Conference, Jan. 1, 1994, pp. 791-795.
Hirano et al., "Characterization and Reduction of Simultaneous Switching Noise for a Multilayer Package", IEEE Proceedings of 44th Electronic Components and Technology Conference, Jan. 1, 1994, pp. 949-956.
Huang et al., "CBGA Package Design for C4 PowerPC Microprocessor Chips: Trade-off Between Substrate Routability and Performance", Electronic Components and Technology Conference, Jan. 1, 1994. Proceedings, 44th, pp. 88-93.
Jan. 1, 1994, AT&T, Carrierless AM/PM (CAP) Host-DSL Transceiver Layout Guide, pp. 1-24.
May 1, 1994, Yamanak et al., "320 Gb/s High-Speed ATM Switching System Hardware Technologies Based on Copper-Polymide MCM", IEEE 44th Electronic Components and Technology Conference, pp. 776-785.
Jan. 1, 1994, Iqbal et al., "Design Tradeoffs Among MCM-C, MCM-D and MCM-D/C Technologies", IEEE Transactions on Components, Packaging, and Manufacturing Technology—Part B: Advanced Packaging, pp. 22-29.

(56) References Cited

OTHER PUBLICATIONS

Jul. 1, 1994, Schwab et al., "Multilayer Suspended Stripline and Coplanar Line Filters", IEEE Transactions on Microwave Theory and Techniques, vol. 42.7, pp. 1403-1407.

Garg et al., "Thermal Design of an Advanced Multichip Module for a RISC Processor", IEEE International Conference on Computer Design: LVSI in Computers and Processors, Oct. 1, 1994, pp. 608-611.

Light et al., "Process Considerations in the Fabrication of Teflon Printed Circuit Boards", IEEE Proceedings of the Electronic Components and Technology Conference, May 1, 1994, pp. 542-549.

Jan. 1, 1994, Swaminathan et al., "Electrical Design of an MCM for a Multiprocessor System", MCM '94 Proceedings, pp. 480-486.

Wu et al., "Modeling and Simulation of Integral Decoupling Capacitors in Single and Multichip Module Electronics Packaging", IEEE Proceedings 44th Electronic Components and Technology Conference, May 1, 1994, pp. 945-948.

Panicker et al., "Low-Cost Ceramic Thin-Film Ball Grid Arrays", IEEE Proceedings 44th Electronic Components and Technology Conference, May 1, 1994, pp. 29-31.

Sudo, "Present and Future Directions for Multichip Module Technologies", IEEE Symposium on VLSI Circuits, Jun. 1, 1994. Digest of Technical Papers, pp. 51-54.

DeHaven and Dietz, "Controlled Collapse Chip Connection (C4)—an Enabling Technology", IEEE Proceedings of 44th Electronic Components and Technology Conference, May 1, 1994, pp. 1-6.

Jan. 1, 1994, Fang et al., "Effects of Losses in Power Planes in the Simulation of Simultaneous Switching Noise", Proceedings of the 3rd Topical Meeting on Electrical Performance of Electronic Packaging, pp. 110-112.

Apr. 1, 1994, Light et al., "Integrated Flex: Rigid-Flex Capability in a High Performance MCM", MCM '94 Proceedings, pp. 430-442.

Jan. 1, 1994, Jastech, Advanced EMC Printed Circuit Board Design, pp. 1 to 8-15.

Jan. 1, 1994, Hannemann et al., Semiconductor Packaging A Multidisciplinary Approach, pp. 1-886.

Intel Corp, Intel Corp Form 10-K for period ending Dec. 17, 2008.

Intel Corp, Intel Corp Form 10-K for period ending Dec. 29, 2007.

Ogasawara et al., "High Isolation Analog 4×4 Matrix Switch LSI for Centralized Control Microcell Radio Systems", 5th IEEE International Symposium on Personal, Indoor and Mobile Radio Communications, Sep. 1, 1994. Wireless Networks—Catching the Mobile Future, vol. 1, pp. 369-371.

Dec. 1, 1994, IEEE Standards Board, IEEE Standard for Medical Device Communications—Physical Layer Interface—Cable Connected.

Jan. 1, 1995, Vaidyanath et al., "Simultaneous Switching Noise: Influence of Plane-Plane and Plane-Signal Trace Coupling", IEEE Transactions on Components, Packaging, and Manufacturing Technology—Part B, vol. 18.3, pp. 496-502.

Jan. 1, 1995, Lester et al., "Low Cost Miniaturized EHF Satcom Transceiver Featuring HEMT MMICS and LTCC Multilayer Packaging", IEEE 1995 Microwave and Millimeter-Wave Monolithic Circuits Symposium, pp. 35-38.

Liaw, "Simulation and Modeling of Mode Conversion at Vias in Multilayer Interconnections", IEEE Proceedings of the 45th Electronic Components and Technology Conference, Jan. 1, 1995, pp. 361-367.

Jan. 1, 1996, Montrose, Printed Circuit Board Design Techniques for EMC Compliance, pp. 1-238.

Feb. 1, 1995, Yamanaka et al., "320 Gb/s High-speed ATM Switching System Hardware Technologies Based on Copper-Polyimide MCM", IEEE Transactions on Components, Packaging, and Manufacturing Technology—Part B: Advanced Packaging, vol. 18.1, pp. 83-91.

Apr. 1, 1995, Pearson, "A Low-Cost, High-Performance PA-RISC Workstation with Built-in Graphics Multimedia, and Networking Capabilities", Hewlett-Packard Journal, vol. 46.2, pp. 6-11.

Feb. 1, 1995, Kambe, et al., "MCM Substrate with High Capacitance", IEEE Transactions on Components, Packaging, and Manufacturing Technology—Part B, vol. 18.1, pp. 23-27.

Oct. 1, 1995, Cohn, "Shielded Coupled-Strip Transmission Line", IRE Transactions on Microwave Theory and Techniques, vol. 3.5, pp. 29-38.

Sep. 1, 1995, Murphy et al., "High Frequency Performance of Multilayer Capacitors", IEEE Transactions on Microwave Theory and Techniques, vol. 43, No. 9, 2007-2015.

Mar. 1, 1995, Dimos et al., "Thin-Film Decoupling Capacitors for Multichip Modules", IEEE Transactions on Components, Packaging, and Manufacturing Technology, Part A, vol. 18.1, pp. 174-179.

Feb. 1, 1995, Sarfaraz et al., "Electrical Design of an MCM Package for a Multi-Processor Digital System", IEEE Transactions on Components, Packaging, and Manufacturing Technology, Part B. vol. 18, No. 1, pp. 127-143.

Nov. 1, 1995, Lee et al., "Modeling and Analysis of Multichip Module Power Supply Planes", IEEE Transactions on Components, Packaging, and Manufacturing Technology, Part B: Advanced Packaging, vol. 18.4, pp. 628-639.

May 1, 1995, Hussein, "FDTD Applications to Electromagnetic Interference and Shielding, WESCANEX 95. Communications, Power, and Computing", Conference Proceedings. IEEE, pp. 478-482.

Feb. 1, 1995, Light et al., "Integrated Flex: Rigid-Flex Capability in a High Performance MCM", IEEE Transactions on Components, Packaging, and Manufacturing Technology, Part B, vol. 18.1, pp. 47-52.

Dec. 1, 1995, Huang et al., "A Packaging System for Built-in Microcircuits in Multilayer Substrates", 1995 Japan IEMT Symposium: Proceedings of 1995 International Electronic Manufacturing Technology Symposium, pp. 460-463.

Jan. 1, 1995, Institute for Interconnecting and Packaging Electronic Circuits, IPC-D-317A: Design Guidelines for Electronic Packaging Utilizing High-Speed Techniques, pp. 1-70.

Nov. 6, 1995, Miskell, "Avoid EMI Woes in Power-Bus Layouts", Electronic Design, vol. 43.23, pp. 147-150.

Jan. 1, 1995, Wu et al., "Precise CMOS Current Sample/Hold Circuits Using Differential Clock Feedthrough Attenuation Techniques", IEEE Journal of Solid-State Circuitry, vol. 30.1, pp. 76-80.

Apr. 1, 1995, Lee, "Accelerating Multimedia with Enhanced Microprocessors", IEEE Micro, vol. 15.2, p. 22-32.

Mar. 1, 1995, Hunt, "Advanced Performance Features of the 64-bit PA-8000", Compcon '95, 'Technologies for the Information Superhighway', Digest of Papers, pp. 123-128.

Dec. 1, 1995, IEEE Standards Board, IEEE Standard for a High Performance Serial Bus.

Apr. 1, 1995, Edmondson et al., "Superscalar Instruction Execution in the 21164 Alpha Microprocessor", IEEE Micro, vol. 15.2, 33-43.

Apr. 1, 1995, Bass et al., "The PA 7100LC Microprocessor: A Case Study of 1C Design Decisions in a Competitive Environment", Hewlett-Packard Journal, vol. 46.2, 12-22.

Feb. 1, 1996, Fessler et al., "The Effectiveness of an Image Plane in Reducing Radiated Emissions", IEEE Transactions on Electromagnetic Compatibility, vol. 38.1, pp. 51-61.

Feb. 1, 1996, Kromann et al. "A Hi-Density C4/CBGA Interconnect Technology for a CMOS Microprocessor", IEEE Transactions on Components, Packaging, and Manufacturing Technology, Part B: Advanced Packaging, vol. 19.1, pp. 166-173.

Feb. 1, 1996, Intel, AP-711: EMI Design Techniques for Microcontrollers in Automotive Applications, pp. 1-21.

Wu et al., "1.2V CMOS Switched-Capacitor Circuits", IEEE 42nd International Solid-State Circuits Conference, Feb. 1, 1996, pp. 388-389, 479.

Feb. 1, 1996, Bryg et al., "A High-Performance, Low-Cost Multiprocessor Bus for Workstations and Midrange Servers", Hewlett-Packard Journal, vol. 47.1, pp. 18-24.

Feb. 1, 1996, Chan et al., "Design of the HP PA 7200 CPU", Hewlett-Packard Journal, vol. 47.1, pp. 25-33.

Feb. 1, 1996, Harline et al., "Symmetric Multiprocessing Workstations and Servers System—Designed for High Performance and Low Cost", Hewlett-Packard Journal, vol. 47.1, pp. 8-17.

(56) References Cited

OTHER PUBLICATIONS

Feb. 1, 1996, Hotchkiss et al., "A New Memory System Design for Commercial and Technical Computing Products", Hewlett-Packard Journal, vol. 47.1, pp. 44-51.

Mar. 1, 1996, Intel, AP-524: Pentium® Pro Processor GTL+ Guidelines, pp. 1-26.

Mar. 21, 1996, IEEE Standards Board, IEEE Standard for Low-Voltage Differential Signals (LVDS) for Scalable Coherent Interface (SCI), pp. 1-29.

Apr. 26, 1996, Bauer, "BGA and Flip-Chip Technologies: A to Z", SEMICON/Test, Assembly & Packaging 96.

Aguirre et al., "Numerical Investigation of Radiated Emissions Mechanisms in Single-Chip Packages", IEEE Proceedings of 46th Electronic Components and Technology Conference, May 1, 1996, pp. 996-1001.

Madhavan et al., "A Novel High Speed Low Skew Clock Distribution Scheme in 0.8 Micron CMOS", 1996 IEEE International Symposium on Circuits and Systems, May 1, 1996. ISCAS '96., Connecting the World, vol. 4, pp. 149-152.

Jul. 1, 1996, Ommodt et al., "Vertical Interconnects for Phased Array Packaging", IEEE Antennas and Propagation Society International Symposium, vol. 2, pp. 1334-1337.

Fang et al., "Reduction of Power and Ground Noise Coupling in Mixed Signal Modules", IEEE $5^{th}$ Topical Meeting on Electrical Performance of Electronic Packaging, Oct. 1, 1996, pp. 90-92.

Oct. 1, 1996, Lei et al., "Power Distribution Noise Suppression Using Transmission Line Termination Techniques", Proceedings of the 5th Topical Meeting on the Electrical Performance of Electrical Packaging, pp. 100-102.

Jan. 1, 1996, Libous et al., "Measurement, Modeling and Simulation of Flip-Chip CMOS ASIC Simultaneous Switching Noise on a Multi-Layer Ceramic BGA", IEEE, pp. 120-122.

Jan. 1, 1996, Institute for Interconnecting and Packaging Electronic Circuits, IPC-T-50: Terms and Definitions Interconnecting and Packaging Electronic Circuits, pp. 1-101.

Dec. 1, 1996, Slater, "The Microprocessor Today", IEEE Micro, vol. 16.6, pp. 32-44.

Dec. 1, 1996, Yu, The Future of Microprocessors, IEEE Micro, vol. 16.6, pp. 46-53.

Jan. 1, 1997, Konsowski et al., Electronic Packaging of High Speed Circuitry, pp. 1-417.

Jan. 1, 1997, Allan et al., "A Low-Cost Workstation with Enhanced Performance and I/O Capabilities", Hewlett-Packard Journal, vol. 48.3, pp. 82-88.

Oct. 1, 1997, Pillai, "Coax Via—A Technique to Reduce Crosstalk and Enhance Impedance Match at Vias in High-Frequency Multilayer Packages Verified by FDTD and MoM Modeling", IEEE Transaction on Microwave Theory and Techniques, vol. 45, No. 10, pp. 1981-1985.

Nov. 1, 1997, Koike et al., "High-speed Signal Transmission at the Front of a Bookshelf Packaging System", IEEE Transactions on Components, Packaging, and Manufacturing Technology, Part B. vol. 20, No. 4, pp. 353-360.

Jan. 1, 1998, Petefish et al., "High Density Organic Flip Chip Package Substrate Technology", IEEE 1998 Electronic Components and Technology Conference, pp. 1089-1097.

Feb. 1, 1998, Deutsch, "Electrical Characteristics of Interconnections for High-Performance Systems", Proceedings of the IEEE, vol. 86.2, pp. 315-355.

Feb. 1, 1998, Vichot et al., "Numerical Modeling of a Clock Distribution Network for a Superconducting Multichip Module", IEEE Transactions on Components, Packaging, and Manufacturing Technology—Part B, vol. 21, No. 1, pp. 98-104.

Feb. 1, 1998, Institute for Interconnecting and Packaging Electronic Circuits, IPC-2221: Generic Standard on Printed Board Design, pp. 1-97.

Aug. 1, 1998, Kaires, "Radiated Emissions from Printed Circuit Board Traces Including the Effect of Vias, as a Function of Source, Termination and Board Characteristics", IEEE International Symposium on Electromagnetic Compatibility 1998, vol. 2, pp. 872-877.

Oct. 1, 1998, Brown, Advanced Electronic Packaging with Emphasis on Multichip Modules, pp. 1-791.

Jan. 1, 1998, Low et al., "Via Design Optimisation for High Speed Device Packaging", IEEE/CPMT Electronics Packaging Technology Conference, pp. 112-118.

Jan. 1, 1998, Lau et al., Electronic Packaging Design, Materials, Process, and Reliability, pp. 1-482.

Jan. 1, 1998, Martens, High-Frequency Characterization of Electronic Packaging, pp. 1-155.

Shigeta et al., "Improved EMI Performance by Use of a Three-Terminal-Capacitor Applied to an IC Power Line", IEEE International Symposium on Electromagnetic Compatibility, Jan. 1, 1999, vol. 1, pp. 161-164.

Feb. 1, 1999, Intel Corporatio, AP-589: Design for EMI, pp. 1-14.

Erdin et al., "Mixed Circuit/Electromagnetic Analysis of Field Coupling to High Speed Interconnects in Inhomogenous Medium", IEEE International Symposium on Electromagnetic Compatibility, Aug. 1, 1999, vol. 1, pp. 446-449.

Aug. 1, 1999, Armstrong, "PCB Design Techniques for Lowest-Cost EMC Compliance: Part 1", Electronics & Communication Engineering Journal, pp. 218-226.

Oct. 1, 1999, Armstrong, "PCB Design Techniques for Lowest-Cost EMC Compliance: Part 2", Electronics & Communication Engineering Journal, pp. 185-194.

Jan. 1, 1999, Li et al., "Validation of Integrated Capacitor-Via-Planes Model", IEEE, pp. 121-124.

Jan. 1, 1999, Yew et al., "Design and Performance Evaluation of Chip Capacitors on Microprocessor Packaging", IEEE 8th Topical Meeting on Electrical Performance of Electronic Packaging, pp. 175-178.

Jan. 1, 2000, Chen, "Effects of 20-H Rule and Shielding Vias on Electromagnetic Radiation From Printed Circuit Boards", IEEE, pp. 193-196.

Jan. 1, 2000, Ilavarasan et al., "Current and Future EMI Challenges at Intel and How to Manage Them", IEEE, pp. 281-283.

Jan. 1, 2000, Tadayon, "Thermal Challenges During Microprocessor Testing", Intel Technology Journal.

Jan. 1, 2000, Dory et al., "Simultaneous Chip-Join and Underfill Assembly Technology for Flip-Chip Packaging", Intel Technology Journal.

Jan. 1, 2000, Grayeli, "Microprocessor Packaging: Evolution and Future Challenges", Intel Technology Journal.

Jan. 1, 2000, Viswanath et al., "Thermal Performance Challenges From Silicon to Systems", Intel Technology Journal.

Jul. 1, 2000, Benedict, "PCB Design for EMI/EMC Compliance", WEMPEC Seminar.

Aug. 1, 2000, Li et al., "Design and Performance Evaluation of Microprocessor Packaging Capcitors Using Integrated Capcitor-Via-Plane Model", IEEE Transactions on Advanced Packaging, vol. 23.3, pp. 361-367.

Aug. 1, 2000, Mahajan et al., "The Evolution of Microprocessor Packaging", Intel Technology Journal, vol. 4.3, pp. 1-10.

Aug. 1, 2000, Lii et al., "Flip-Chip Technology on Organic Pin Grid Array Packages", Intel Technology Journal, vol. 4.3, pp. 1-9.

Aug. 1, 2000, Mencinger, "A Mechanism-Based Methodology for Processor Package Reliability Assessments", Intel Technology Journal, vol. 4.3, pp. 1-8.

Jan. 1, 2001, Ye et al., "EMI Mitigation with Multilayer Power-Bus Stacks and Via Stitching of Reference Planes", IEEE Transactions on Electromagnetic Compatibility, vol. 43.4, pp. 538-548.

Jan. 1, 2001, zilog.com, Product Update for Z86CO2/E02/L02, Z86C04/E04/L04, Z86C08/E08/L08 to Clarify the Output Drive in Low-EMI Mode.

Aug. 1, 2001, Shim et al., "20-H Rule Modeling and Measurements", IEEE International Symposium on Electromagnetic Compatibility 2001, vol. 2, pp. 939-942.

Sep. 1, 2001, Gisin et al., "Minimizing EMI Caused by Radially Propagating Waves Inside High Speed Digital Logic PCBs", TELSIKS 2001, pp. 624-631.

Jan. 1, 2002, He et al., "Study of Package EMI Reduction for GHz Microprocessors", IEEE, pp. 271-274.

Jan. 1, 2003, Muccioli et al., "A Microwave Test Fixture for Measuring Four-Terminal Passive Components from DC to 10 GHz", Interference Technology.

(56) References Cited

OTHER PUBLICATIONS

Sanders et al., "Comparison of MLCC and X2Y Technology for Use in Decoupling Circuits", CARTS 2004: 24th Annual Capacitor and Resistor Technology Symposium, Mar. 29-Apr. 1.

Aug. 1, 2004, Sanders, A Better Approach to of Record DC Power Filtering.

Mar. 21, 2005, Sanders et al., "The Quantitative Measurement of the Effectiveness of Decoupling Capacitors in Controlling Switching Transients from Microprocessors", 25th Annual Passive Components Conference CARTS 2005, pp. 1-16.

May 1, 2005, Montrose et al., "Analysis on the Effectiveness of the 20-H Rule for Printed-Circuit-Board Layout to Reduce Edge-Radiated Coupling", IEEE Transactions on Electromagnetic Compatibility, vol. 47.2, pp. 227-233.

Nov. 9, 2005, Various, Various, Intel Technology Journal.

May 1, 2008, Ikami et al., "Practical analysis on 20H Rule for PCB", 2008 Asia-Pacific Symposium on Electromagentic Compatibility, pp. 180-183.

Apr. 26, 2012, Swigget of Prismark Partners LLC, "Product Teardown Report", filed in ITC Investigation No. 337-TA-781.

Jan. 1, 1999, Montrose, EMC and the Printed Circuit Board—Design, Theory, and Layout Made Simple, pp. 1-325.

U.S. Appl. No. 60/033,673, filed Dec. 18, 1996, Lamson.

Apr. 26, 2012, Stanley Shanfield, Expert Report of Stanley Shanfield, Ph.D Regarding Invalidity of U.S. Patent Nos. 6,738,249, 7,110,227, 7,609,500, 7,773,621, 7,916,444, and 8,203,241.

Apr. 26, 2012, Andreas Cangellaris, Expert Report of Andreas Cangellaris, Ph.D. Regarding Invalidity of U.S. Patent Nos. 6,738,249, 7,110,227, 7,609,500, 7,733,621, 7,916,444, and 8,023,241.

Apr. 26, 2012, Vivek Subramanian, Initial Expert Report of Vivek Subramanian, Ph.D.

May 11, 2012, Vivek Subramanian, Rebuttal Expert Report of Vivek Subramanian, Ph.D.

Apr. 26, 2012, Dean P. Neikirk, Opening Expert Report of Dean P. Neikirk, PhD, Regarding X2Y's Patent Portfolio and Claim Construction, Infringement, and Domestic Industry Technical Prong, for United States Patent Nos. 6,738,249, 7,110,227, 7,609,500, 7,733,621, 7,916,444, and 8,023,241, vol. 1.

May 11, 2012, Dean P. Neikirk, Rebuttal Expert Report of Dean P. Neikirk, PhD, Regarding Claim Construction, Validity, and Other Matters Relating to United States Patent Nos. 6,738,249, 7,110,227, 7,609,500, 7,733,621, 7,916,444, and 8,023,241, vol. 1.

May 11, 2012, Dean P. Neikirk, Rebuttal Expert Report of Dean P. Neikirk, PhD, vol. 2.

May 11, 2012, Dean P. Neikirk, Rebuttal Expert Report of Dean P. Neikirk, PhD, vol. 8.

May 11, 2012, Dean P. Neikirk, Rebuttal Expert Report of Dean P. Neikirk, PhD, vol. 9.

May 11, 2012, Dean P. Neikirk, Rebuttal Expert Report of Dean P. Neikirk, PhD, vol. 10.

May 11, 2012, Dean P. Neikirk, Rebuttal Expert Report of Dean P. Neikirk, PhD, vol. 11.

May 11, 2012, Dean P. Neikirk, Rebuttal Expert Report of Dean P. Neikirk, PhD, vol. 12.

May 11, 2012, Dean P. Neikirk, Rebuttal Expert Report of Dean P. Neikirk, PhD, vol. 13.

May 11, 2012, Dean P. Neikirk, Rebuttal Expert Report of Dean P. Neikirk, PhD, vol. 14.

May 11, 2012, Dean P. Neikirk, Rebuttal Expert Report of Dean P. Neikirk, PhD, vol. 15.

May 21, 2012, Intel Corporation, Apple Inc., and Hewlett-Packard Company, Respondents' Motion for Summary Determination of Indefiniteness of Asserted Claims of the '621, '444, and '241 Patents.

May 31, 2012, X2Y Attenuators, LLC, X2Y's Memorandum of Law in Opposition to Respondents' Motion for Summary Determination of Indefiniteness of Asserted Claims of the 621, 444, and 241 Patents.

Feb. 22, 2012, X2Y Attenuators, LLC, Complainant X2Y Attenuators, LLC's Responses and Objections to Respondents' Eighth Set of Interrogatories (No. 109-148).

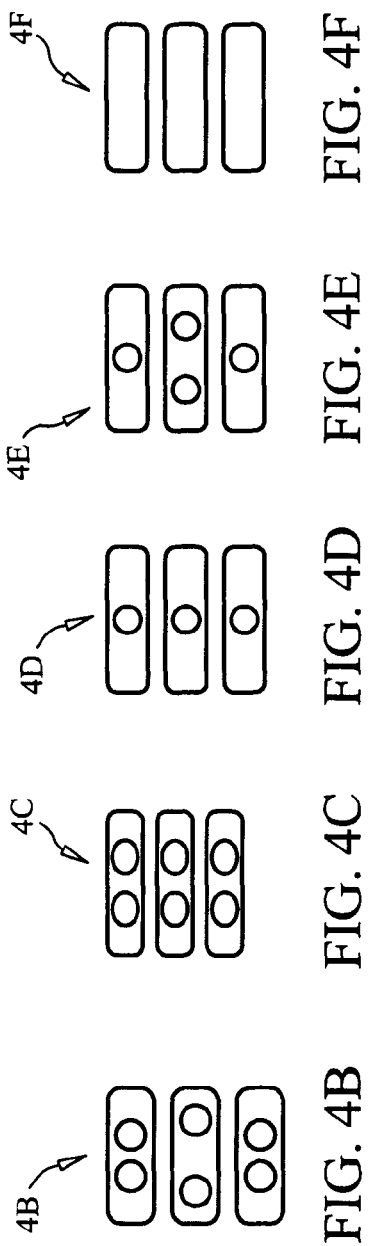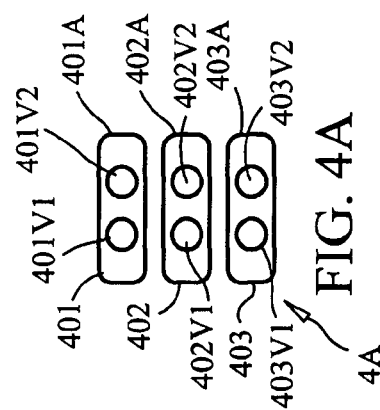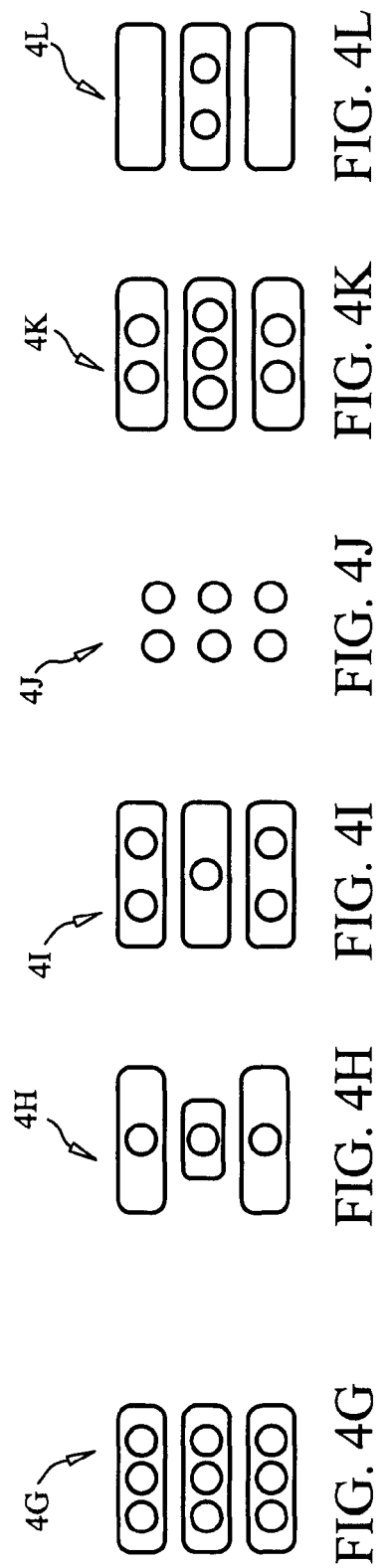
FIG. 4A FIG. 4B FIG. 4C FIG. 4D FIG. 4E FIG. 4F
FIG. 4G FIG. 4H FIG. 4I FIG. 4J FIG. 4K FIG. 4L

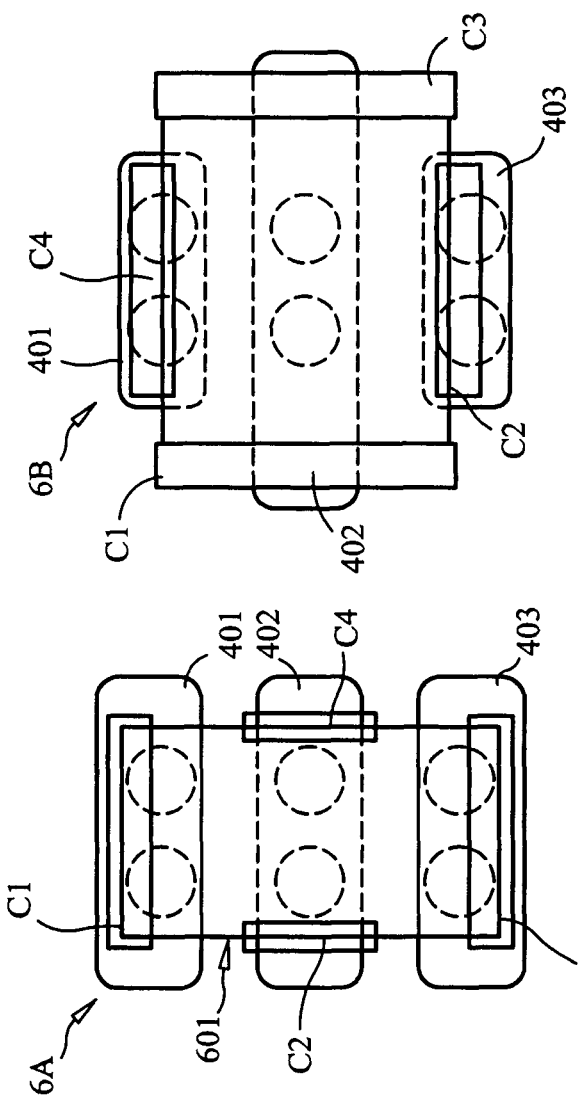

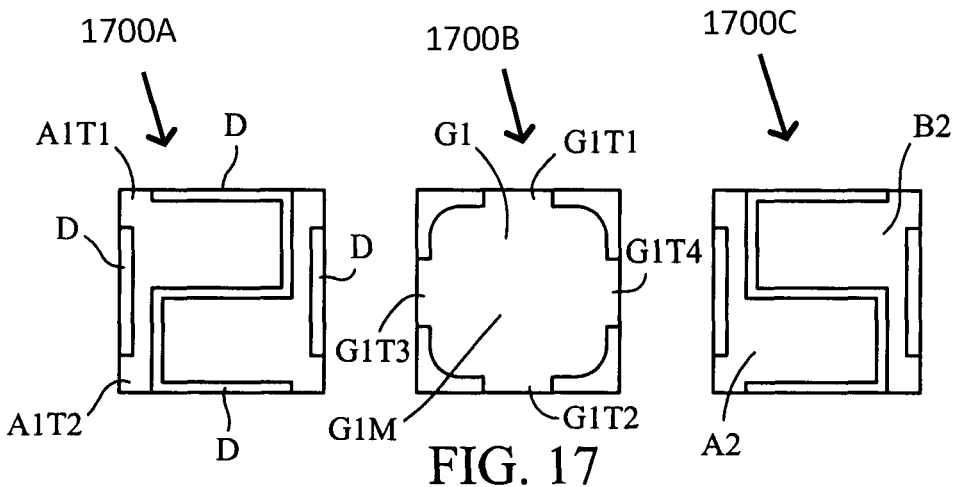
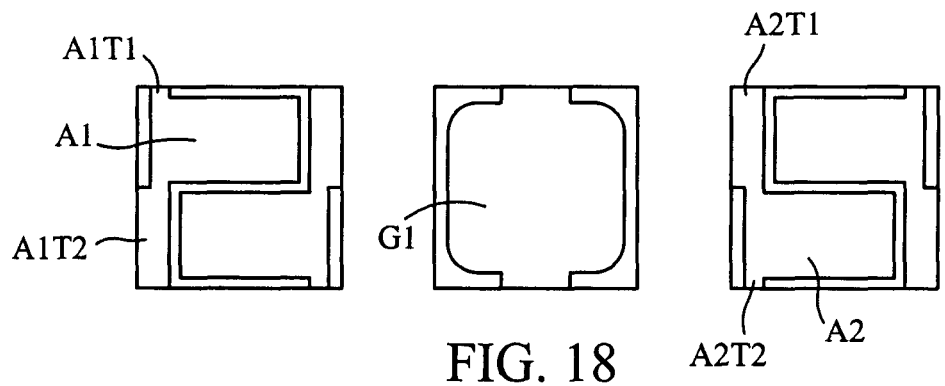
FIG. 17
FIG. 18
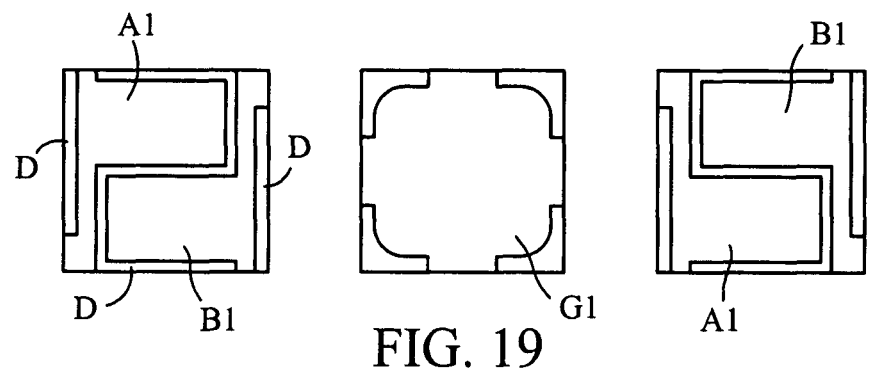
FIG. 19
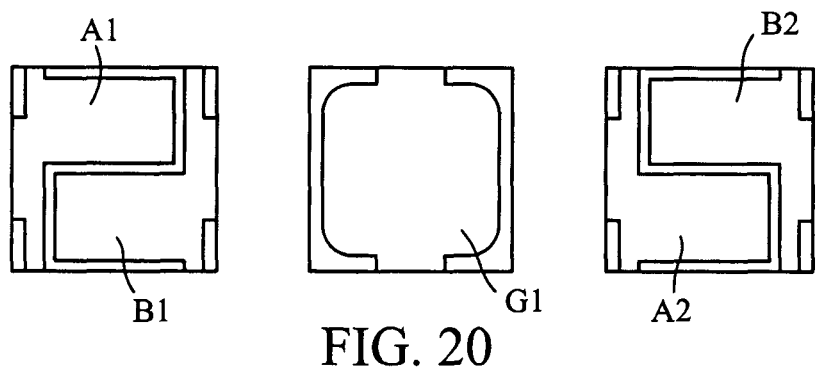
FIG. 20

180# INTERNALLY OVERLAPPED CONDITIONERS

CROSS REFERENCE TO RELATED APPLICATIONS

This application is a continuation of application Ser. No. 13/175,918, filed Jul. 4, 2011, which is a continuation of application Ser. No. 12/861,811, filed Aug. 23, 2010, now issued as U.S. Pat. No. 7,974,062, which is a continuation of application Ser. No. 11/817,634, filed Aug. 31, 2007, now issued as U.S. Pat. No. 7,782,587, which is a U.S. National Stage application of International Application PCT/US06/06607, filed Feb. 27, 2006, which claims the benefit of provisional Application No. 60/656,910, filed Mar. 1, 2005, provisional Application No. 60/661,002, filed Mar. 14, 2005, provisional Application No. 60/668,992, filed Apr. 7, 2005, provisional Application No. 60/671,107, filed Apr. 14, 2005, provisional Application No. 60/671,532, filed Apr. 15, 2005, provisional Application No. 60/674,284, filed Apr. 25, 2005, and provisional Application No. 60/751,273, filed Dec. 19, 2005.

The following applications are each incorporated by reference herein: application Ser. No. 13/175,918, filed Jul. 4, 2011, application Ser. No. 12/861,811, filed Aug. 23, 2010, application Ser. No. 11/817,634, filed Aug. 31, 2007, International Application PCT/US06/06607, filed Feb. 27, 2006, provisional Application No. 60/656,910, filed Mar. 1, 2005, provisional Application No. 60/661,002, filed Mar. 14, 2005, provisional Application No. 60/668,992, filed Apr. 7, 2005, provisional Application No. 60/671,107, filed Apr. 14, 2005, provisional Application No. 60/671,532, filed Apr. 15, 2005, provisional Application No. 60/674,284, filed Apr. 25, 2005, and provisional Application No. 60/751,273, filed Dec. 19, 2005.

FIELD OF THE INVENTION

This invention relates to energy conditioning.

Background of the Invention

Electrical circuits using low frequency electrical power generate noise that is coupled through the power distribution system. That noise is generally detrimental. In the past, capacitors have been used to condition the electrical power propagating to and from devices. One type of device in which capacitors have been used to condition electrical power is an active circuitry. Capacitors have been used to in active circuitry to decouple noise from the power lines. Typically, in applications involving Large or Very Large Scale Integration (LSI or VLSI) Integrated Circuits (ICs), multiple rows of capacitors are arrayed on a PC board as close as feasible to the location of the IC in the PC board, given design constraints. This arrangement provides sufficient decoupling of the power and ground from the IC's active circuitry. The terms "bypass" and "decoupling" are used interchangeable herein.

SUMMARY OF THE INVENTION

This application discloses novel energy conditioner structures and novel combinations of the connections of the energy conditioners on other structures, such as PC board structures, and novel circuit arrangements of the energy conditioners with structures, such as PC boards, described herein, generally provide improved decoupling, per conditioner, and require less conditioners and related structure, such as vias, to provide sufficient decoupling. Similarly to PC boards, the structures to which the novel conditioners and the novel combination of the connections of the energy conditioners may be applied include first level interconnects and semiconductor chips, including for example ASIC, FPGA, CPU, memory, transceiver, computer on a chip, and the like.

More particularly, this application discloses and claims energy conditioner internal structures and external structures, connection structure, and circuits including energy conditioners having A, B, and G master electrodes.

In one aspect, the claims define an internal structure of an energy conditioner:

wherein said internal structure has a left side surface, a right side surface, an upper side surface, a lower side surface, a top side surface, and a bottom side surface;

wherein said internal structure comprises a dielectric material and a conductive material;

wherein surfaces of said dielectric material and surfaces of said conductive material define said left side surface, said right side surface, said upper side surface, said lower side surface, said top side surface, and said bottom side surface;

wherein said conductive material comprises a first A conductive layer and a first B conductive layer in a first plane;

wherein said first A conductive layer and said first B conductive layer are electrically isolated from one another in said structure;

wherein said first A conductive layer comprises at least one first A conductive layer first tab and a first A conductive layer main body portion;

wherein said first B conductive comprises at least one first B conductive layer first tab and a first B conductive layer main body portion;

wherein said first A conductive layer main body portion does not extend to any one of said left side, right side, upper side, and lower side;

wherein said first B conductive layer main body portion does not extend to any one of said left side, right side, upper side, and lower side;

wherein said at least one first A conductive layer first tab extends to said left side surface, said upper side surface, and said lower side surface; and wherein said at least one first B conductive layer first tab extends to at least portions of said right side surface, said upper side surface, and said lower side surface.

In aspects dependent upon the foregoing, the claims define wherein said first A conductive layer main body portion extends to a region closer to said right side surface than said left side surface and closer to said upper side surface than said lower side surface, and wherein said first B conductive layer main body portion extends to a region closer to said left side surface than said right side surface and closer to said lower side surface than said upper side surface; wherein said at least one first A conductive layer first tab comprises a single tab extending across all of said left side, extending to a left side end of said upper side surface, and extending to a left side end of said lower side surface; wherein said at least one first A conductive layer first tab comprises at least two tabs; wherein said conductive material further comprises a first G conductive layer; wherein conductive material further comprises a first G conductive layer between said first A conductive layer and said first B conductive layer; wherein conductive material further comprises a first G conductive layer in a second plane parallel to said first plane, and said G conductive layer has a G conductive layer main body portion having a region opposing at least a portion of said first A conductive layer A main body portion and a portion of said first B conductive layer main body portion;

wherein said conductive material comprises a second A conductive layer in a second plane and a second B conductive layer in said second plane;

wherein said second A conductive layer and said second B conductive layer are electrically isolated from one another in said structure;

wherein said second A conductive layer comprises at least one second A conductive layer first tab and a second A conductive layer main body portion;

wherein said second B conductive layer comprises at least one second B conductive layer first tab and a second B conductive layer main body portion;

wherein said second A conductive layer main body portion does not extend to any one of said left side surface, said right side surface, said upper side surface, and said lower side surface;

wherein said second B conductive layer main body portion does not extend to any one of said left side surface, said right side surface, said upper side surface, and said lower side surface;

wherein said at least one second A conductive layer first tab extends to at least portions of said left side surface, said upper side surface, and said lower side surface;

wherein said at least one second B conductive layer first tab extends to at least portions of said right side surface, said upper side surface, and said lower side surface;

wherein said second A conductive layer main body portion extends to a region closer to said right side surface than said left side surface and closer to said lower side surface than said upper side surface, and wherein said second B conductive layer main body portion extends to a region closer to said left side surface than said right side surface and closer to said upper side surface than said lower side surface;

whereby said first A conductive layer main body portion and said second B conductive layer main body portion have a first region of substantial overlap and said second A conductive layer main body portion and said first B conductive layer main body portion have a second region of substantial overlap; wherein said conductive material further comprises a first G conductive layer, and wherein said first G conductive layer comprises a main body portion having a substantial overlap with both said first region and said second region; wherein said first G conductive layer is in a third plane between said first plane and said second plane; wherein said conductive material further comprises:

a first G conductive layer in said first plane between said first A conductive layer and said first B conductive layer and electrically isolated in said structure from said first A conductive layer and said first B conductive layer; and a second G conductive layer in said second plane between said second A conductive layer and said second B conductive layer and electrically isolated in said structure from said second A conductive layer and said second B conductive layer; wherein said conductive material further comprises a second G conductive layer, and wherein said second G conductive layer comprises a main body portion having a substantial overlap with both said first region and said second region; and wherein said first G conductive layer is in a third plane between said first plane and said second plane.

In a second aspect the claims define an assembly comprising said internal structure and an external structure of an energy conditioner, wherein said external structure comprises: a first conductive integration region that extends along at least one of said left side surface, said upper side surface, and said lower side surface and contacts there at, at least one of said at least one first A conductive layer first tab; and a second conductive integration region that extends along at least one of said right side surface, said upper side surface, and said lower side surface and contacts thereat at least one of said at least one first B conductive layer first tab.

Dependent upon the second aspect, the claims define wherein said internal structure further comprises a G conductive layer including a G conductive layer main body portion, a G conductive layer first tab, and a G conductive layer second tab, and wherein said external structure further comprises a third conductive integration region that extends along at least one side surface of said internal structure and contacts thereat said G conductive layer first tab; wherein said external structure further comprises a fourth conductive integration region that extends along at least one side surface of said internal structure opposite the one side surface of said internal structure along which said third conductive integration region extends where at said fourth conductive integration region contacts said G conductive layer second tab; wherein at least one of said first conductive integration region, said second conductive integration region, said third conductive integration region, and said fourth conductive integration region are formed from solder; wherein at least one of said first conductive integration region, said second conductive integration region, said third conductive integration region, and said fourth conductive integration region comprise a conductive band; further comprising a mounting structure to which said external structure is mounted, wherein said mounting structure consists of only a first conductive regions, a second conductive region, and a third conductive region; wherein said first conductive region comprises conductive material in a first via, said second conductive region comprises conductive material in a second via, and said third conductive region comprises conductive material in a third via.

In a third aspect the claims define a circuit comprising an internal structure of an energy conditioner having A and B layers in the same plane and tabs extending to at least three side surfaces; a source, and a load, wherein said internal structure is connected in said circuit in a circuit 1 configuration; a circuit comprising an internal structure of an energy conditioner having A and B layers in the same plane and tabs extending to at least three side surfaces, a source, and a load, wherein said internal structure is connected in said circuit in a circuit 2 configuration; a circuit comprising an internal structure of an energy conditioner having A, B, and G master electrode components, a source, and a load, wherein said internal structure is connected in said circuit in a circuit 3 configuration; a circuit comprising an internal structure of an energy conditioner having A, B, and G master electrode components, a first source, a second source, a first load, and a second load, wherein said internal structure is connected in said circuit in a circuit 4 configuration; a circuit comprising an internal structure of an energy conditioner having A, B, and G master electrode components, a first source, a first load, and a second load, wherein said internal structure is connected in said circuit in a circuit 5 configuration; a circuit comprising said internal structure of an energy conditioner having A, B, and G master electrode components, a first source, a first load, and a second load, wherein said internal structure is connected in said circuit in a circuit 6 configuration.

In additional aspects, the invention comprises an assembly having an energy conditioner having an internal structure, a mounting structure; and wherein said internal structure is mounted on said mounting structure; wherein said mounting structure comprises no more than three separate conductive elements; an assembly comprising: an energy conditioner having an internal structure including components of A, B, and G master electrodes, and an external structure comprising conductive regions that conductively connect components of the A master electrode to one another, components of the B master electrode to one another, and components of the G master electrode to one another; a mounting structure; wherein said internal structure is mounted on said mounting structure; wherein said mounting structure consists of only a first conductive region, a second conductive region, and a third conductive region; and wherein said A master electrode contacts said first conductive region, said B master electrode contacts said second conductive region, and said G master electrode contacts said third conductive region.

In additional aspects, the claims define that said G master electrode includes a first G conductive integration region that and a second G conductive integration region spatially separated and not contacting said first G conductive integration region, wherein both said a first G conductive integration region and said second G conductive integration region contact said third conductive region.

In another aspect, the claims define an internal structure of an energy conditioner: wherein said internal structure has a left side surface, a right side surface, an upper side surface, a lower side surface, a top side surface, and a bottom side surface; wherein said internal structure comprises a dielectric material and a conductive material; wherein surfaces of said dielectric material and surfaces of said conductive material define said left side surface, said right side surface, said upper side surface, said lower side surface, said top side surface, and said bottom side surface; wherein said conductive material comprises a stack of at least seven conductive layers in the following order from top to bottom: A1; G1; B1; G1; A1; G1; and B1; wherein each A1 conductive layer has an A1 first tab that extends to said upper side surface near said left side surface and an A2 tab that extends to said lower side surface near said left side surface; wherein each G1 conductive layer has a G1 first tab that extends to said left side surface and a G2 tab that extends to said right side surface near; and wherein each B1 conductive layer has a B1 first tab that extends to said upper side surface near said right side surface and a B2 tab that extends to said lower side surface near said right side surface. In dependent aspects, each tab of the same type has a vertical overlap with all other tabs of the same type, and conductive integration regions conductively connect layers of the same type only to one another; and wherein additional conductive layers exist within the seven layer sequence.

BRIEF DESCRIPTION OF THE DRAWINGS

The figures show elements of embodiments of the inventions. The same reference number in different figures refers to identical elements or elements with similar structure or function.

FIG. 6A is a schematic view showing a novel combination of a novel energy conditioner on an arrangement of mounting surface structure elements including conductive pads and vias, with two vias per pad;

FIG. 6B is a schematic view showing a novel combination of a novel energy conditioner on an arrangement of mounting surface structure elements including conductive pads and vias, with two vias per pad, and a central pad that extends further than the outer two pads such that the central pad contacts conductive terminals, caps, or bands on left and right hand sides of the energy conditioner;

FIG. 6C is a top plan view showing a novel combination of a novel energy conditioner on an arrangement of mounting surface structure elements including conductive pads and vias showing overlap of terminals of the conditioner with vias;

FIG. 17 is an exploded view of a stack of three plates internal to a novel energy conditioner in which the plate elements have been displaced laterally in the page;

FIG. 18 is an exploded view of a stack of three plates internal to a novel energy conditioner in which the plate elements have been displaced laterally in the page;

FIG. 19 is an exploded view of a stack of three plates internal to a novel energy conditioner in which the plate elements have been displaced laterally in the page;

FIG. 20 is an exploded view of a stack of three plates internal to a novel energy conditioner in which the plate elements have been displaced laterally in the page;

DETAILED DESCRIPTION OF THE EMBODIMENTS

Figure 1A:
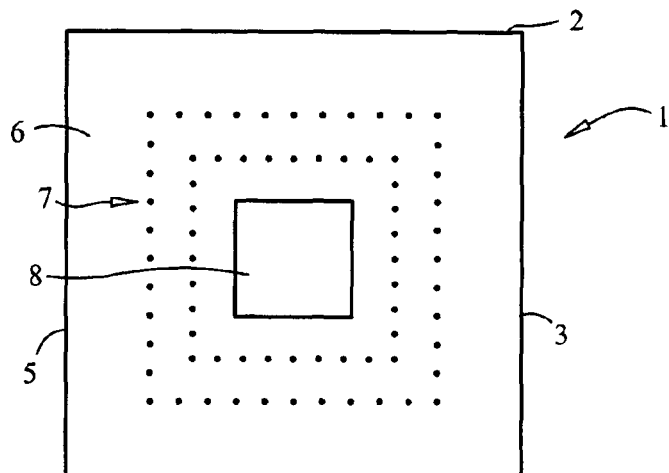
FIG. 1A is a plan view of a conventional digital circuit board, also called a PC board, for a conventional high speed VLSI IC (Very Large Scale Integration Integrated Circuit) chip.

FIG. 1A shows PC board 1 having sides 2, 3, 4, and 5, top surface 6, array 7 of structure for mounting discrete capacitors, and region 8 for mounting an IC. Each side of array 7 defines plural rows, such as rows 9 and 10. Each element of array 7 represents mounting structure for mounting a discrete capacitor. Conventional PC boards often have an array including at least two rows of structure for mounting capacitors. Each row may have several to tens of array elements for mounting capacitors. The board is designed so that capacitors mounted to the elements of array 7 sufficiently decouple the power to the IC from active circuitry so that the IC and any other coupled circuit elements functions as intended.

Conventional capacitors are two terminal discrete devices.

Figure 1B:
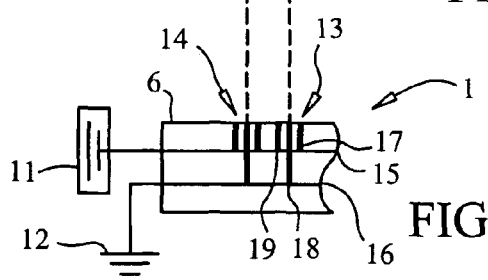
FIG. 1B is schematic partial edge side sectional view of the conventional board of FIG. 1A.

FIG. 1B shows a portion of board 1, a source of electrical power 11, a ground 12, mounting structure 13 corresponding to one element of array 7, mounting structure 14 corresponding to another element of array 7, power plane 15, and ground plane 16. In addition, FIG. 1B shows three vias extend down from each mounting structure element, such as vias 17, 18, 19 below mounting structure 13. Use of more than two vias enables mounting unconventional devices, such as 3 terminal energy conditioners.

In operation, power source 11 distributes electrical power to circuit elements mounted to board 1 via conductive connection of power source 11 to power plane 15. Ground plane 16 conductively connects to ground 12. Vias 17 and 19 conductively connect to power plane 15. Via 18 does not conductively connect to power plane 15 and instead passes through an aperture in power plane 15 to ground plane 16. Power plane 15 is above ground plane 16.

Figure 2A:
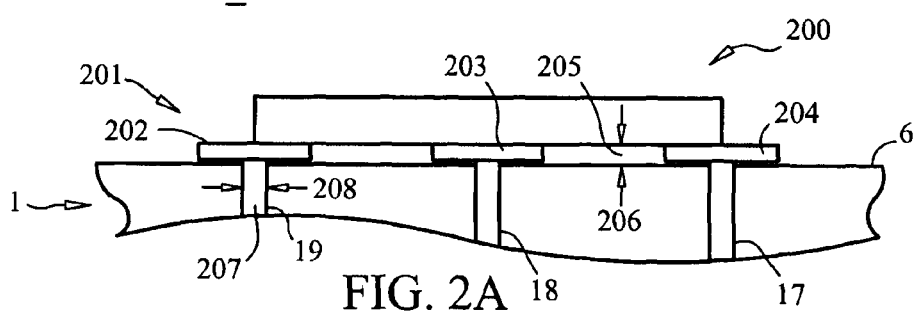
FIG. 2A is a partial side sectional view of a structure including a more than two terminal energy conditioner mounted via pads to a board, showing vias connecting the conditioner and conductive planes in the board.

FIG. 2A shows assembly 200 including energy conditioner 201 mounted on board 1. Board 1 includes pads 202, 203, 204 that separate conditioner 201 from board surface 6 by a distance 205 as indicated by the distance between facing arrows 206. Vias 17, 18, 19, have a width 207 as indicated by the distance between facing arrows 209.

Figure 2B:
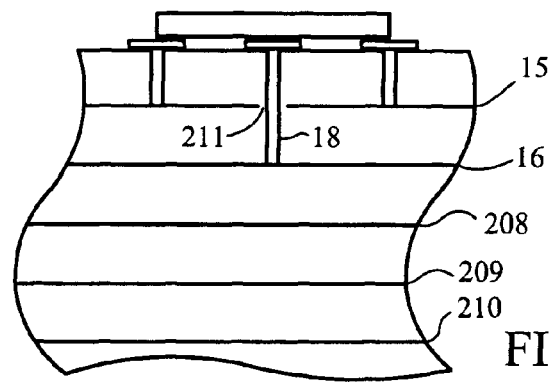
FIG. 2B is another side sectional view showing power and ground planes and connection of the multi terminal conditioner to the power and ground planes.

FIG. 2B shows additional structure underneath conditioner 201 including additional power, ground, and/or signal planes 208, 209, 210, and aperture 211 through which the conductive path in via 18 passes without shorting to power plane 15. Additional power, ground and/or signal planes may exist in any particular board.

In operation, power feed from source 11 through one or more power planes provides power for active circuitry in the IC mounted in region 8 to operate. Conditioners mounted to the elements of array 7, one conditioner per array element, decouple transients otherwise induced in power due to switching and the like in the active circuitry of the IC.

FIGS. 3A to 3K are perspective views of exterior surfaces 3A to 3K of certain novel energy conditioners disclosed herein. In FIGS. 3A to 3K, "C" denotes electrically conductive material and "D" denotes dielectric material (electrically insulating). The electrically conductive portions, C, may be referred to herein as bands or outer terminals.

Figure 3A:
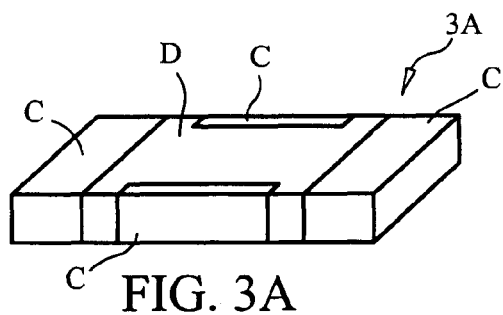
FIGS. 3A to 3K are perspective views of exterior surfaces of novel energy conditioners disclosed herein, particularly showing surfaces of conductive band structures, C, and surfaces of dielectric material, D.
Figure 3B:
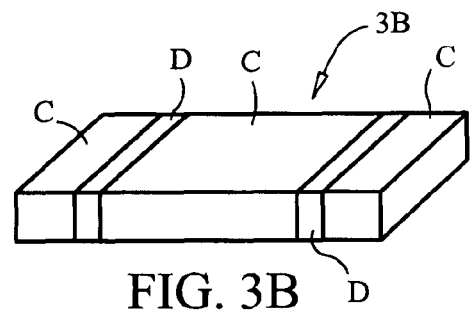
Figure 3C:
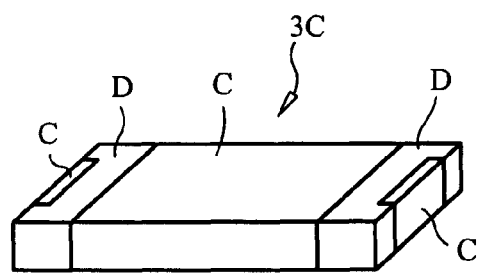
Figure 3D:
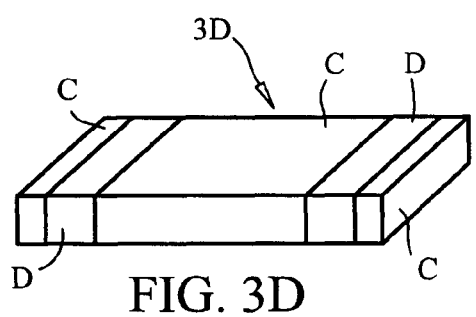
Figure 3E:
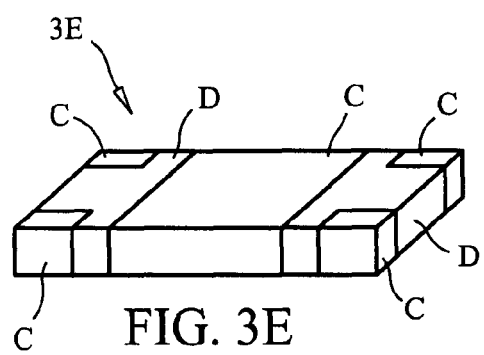
Figure 3F:
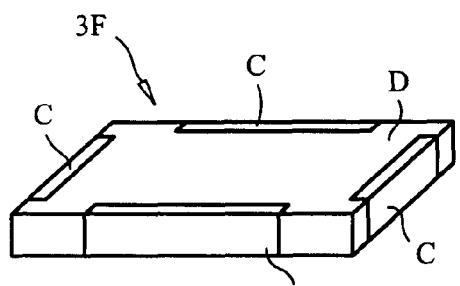
Figure 3G:
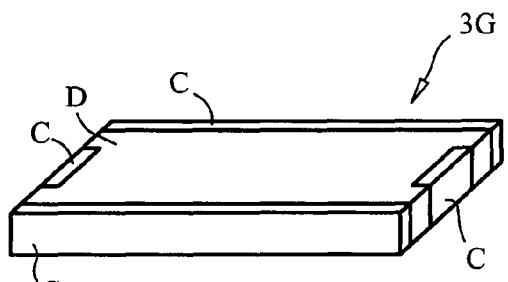
Figure 3H:
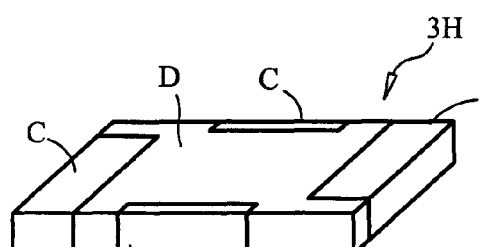
Figure 3I:
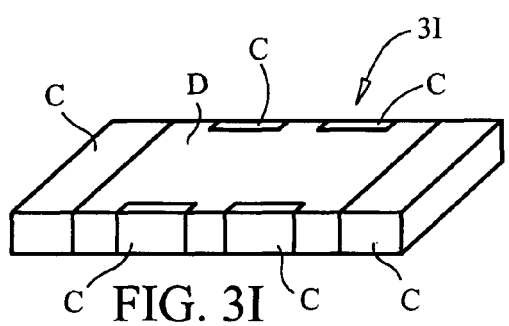
Figure 3J:
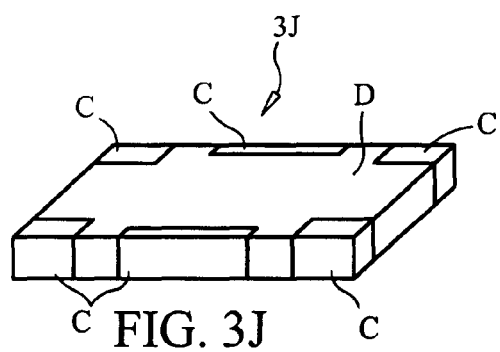
Figure 3K:
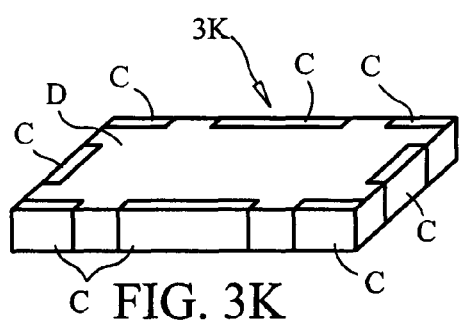

FIG. 3A shows conductive bands C, and FIG. 3G shows conductive bands C, for purpose of discussion with energy conditioner internal structure disclosed herein below.

Figure 4O:
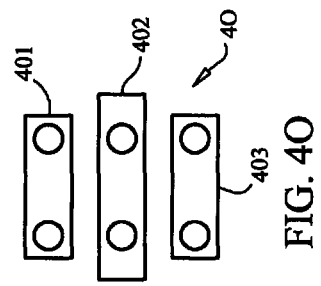
FIGS. 4A-O are plan views each showing arrangements of conductive elements of mounting surface structure, including conductive pad and/or via structure to which novel discrete component energy conditioners disclosed herein may be mounted.

FIG. 4A-4O each show one arrangement of conductive elements of mounting structure for mounting a single one of the novel discrete energy conditioners. These arrangements are also referred to as land patterns. The mounting surface may be a surface of a PC board, first level interconnect, or semiconductor chip.

FIG. 4A shows an arrangement 4A of mounting surface structure including a set of three generally rectangularly shaped conductive pads 401, 402, 403. Conductive pads 401, 402, 403, have relatively long sides (unnumbered) and relatively short sides. The relatively short sides are labeled 401A, 402A, 403A. Relatively short sides 401A, 402A, 403A are aligned with one another such that a straight line segment could contact substantially all of short sides 401A, 402A, 403A. Conductive pad 401 contains vias 401V1, 401V2. Conductive pad 402 contains vias 402V1, 402V2. Conductive pad 403 contains vias 403 V1, 403V2. Vias 401 V1, 402V1, and 403 V1 are aligned such that a single line segment could intersect them. Vias 401V2, 402V2, and 403V2 are aligned such that a single line segment could intersect them.

In alternatives to arrangement 4A, pads may have different sizes, lengths, or widths from one another. For example, pad 402 may be shorter than pads 401, 403.

In another alternative to arrangement 4A, outer pads 401, 403 may have a different shape than central pad 402. For example, outer pads 401, 403 may include convex central regions and/or flared end regions. For example, outer pads 401, 403 may be the same length as one another but shorter or longer than central pad 402.

In another alternative to arrangement 4A, certain vias may have a diameter larger than the width or length of the pad to which they are attached such that the via is not entirely contained within the footprint of a conductive pad. For example, a via diameter may be equal to a width of a conductive pad, 1.5, 2, or 3 times a width of the conductive pad.

In another alternative to arrangement 4A, certain vias may have different cross-sectional diameters from one. For example, cross-section diameters of vias connecting to the central pad 402 may be ⅓, ½, 1, 1.5, 2, or 3 times the cross-sectional diameter of vias connecting to outer pads 401, 403.

In another alternative to arrangement 4A, vias 402V1, 402V2 may be spaced from one another by more than or less than the spacing between vias 401V1, 401V2 and the spacing between 403V1, 403V2.

In another alternative to arrangement 4A, each conductive pad may contain one, two, three, or more vias. For example, each conductive pad 401, 402, 403 may contain a single via. For example, pads 401 and 403 may contain 2 or 3 vias and pad 402 may contain one via. For example, pads 401 and 403 may contain 1 via and pad 402 may contain 2 or 3 vias.

In another alternative to arrangement 4A, the pads may not exist in which case just conductive vias exist in one of the foregoing arrangements. For example, two parallel rows of three vias.

In another alternative to arrangement 4A, some pads may have connected vias and some may not. For example, central pad 402 may contain 1, 2, 3, or more vias and outer pads 401, 403 may contain no vias. For example, central pad 402 may contain no vias and each outer pad 401, 403, may contain 1, 2, 3, or more vias.

In another alternative to arrangement 4A, the cross-sections of vias may not be circular, such as elliptical, elongated, or irregular.

FIGS. 4B-4L show various arrangements of the alternatives discussed above.

FIG. 4B shows arrangement 4B of mounting structure having vias of pad 402 more widely spaced from one another than the spacing between vias of either pad 401 or pad 403.

FIG. 4C shows arrangement 4C of mounting structure having vias having elongated elliptical cross-sections.

FIG. 4D shows arrangement 4D of mounting structure having a single via in each one of pads 401, 402, 403.

FIG. 4E shows arrangement 4E of mounting structure having outer pads 401, 403 having one centrally located via.

FIG. 4F shows arrangement 4F of mounting structure having pads 401, 402, 403 having no vias. In this alternative, conductive lines may radiate along the surface of the structure from each pad.

FIG. 4G shows arrangement 4G of mounting structure having pads 401, 402, 403 each having three vias, each via in each pad aligned with one via in each one of the other two pads.

FIG. 4H shows arrangement 4H of mounting structure having a single via in each pad, and in which the central pad 402 is short than the outer pads 401, 403.

FIG. 4I shows arrangement 4I of mounting surface structure having equal length pads 401, 402, 403, and in which the central pad 402 connects to only one via whereas the outer pads 401, 402 connect to 2 vias.

FIG. 4J shows arrangement 4J of mounting structure having three pairs of vias, and no pads.

FIG. 4K shows arrangement 4K of mounting structure having outer pads 401, 403 connecting to two vias and central pad 402 connecting to three vias.

FIG. 4L shows arrangement 4L of mounting structure having central pad 402 connecting to one via and outer pads 401, 403 having no vias.

Figure 4N:
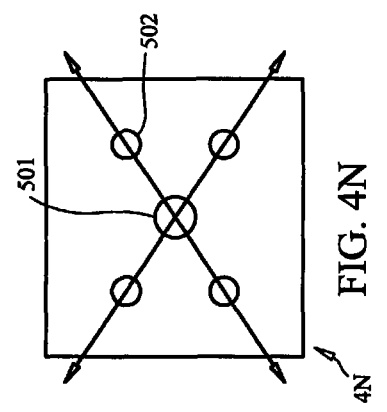
Figure 4M:
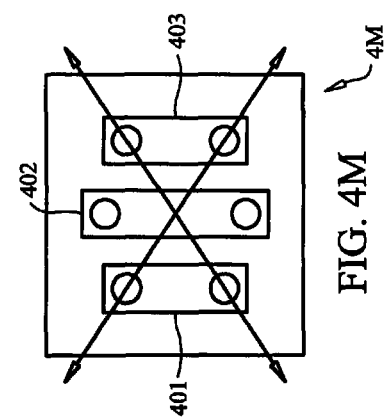

FIG. 4M shows mounting structure 4M having central pad 402 extending further than pads 401, 403, and vias in central pad 402.

FIG. 4N shows mounting structure 4N having via 501 having a larger diameter than via 502. Moreover, larger via 501 is more centrally located than the other smaller diameter vias. That is, FIG. 5N contemplates benefits from conductively filled or lined vias of different dimensions from one another, and in which the larger vias are more centrally located relative to the energy conditioner to which they connect.

FIG. 4O shows mounting structure 4O having central pad 402 extending symmetrically further than pads 401, 403.

Preferably, vias in each pad are spaced symmetrically on either side of the center of the pad. Preferably, the arrangement of vias is symmetric about the center point of central pad 402.

The inventors contemplate all variations of arrangements of mounting structures (pads and vias combinations, sizes, and shapes) and energy conditioners mounted therein that provide conductive connection between the conductive elements of the mounting structure and A, B, and G master electrodes (defined herein below) internal to the energy conditioner. The A, B, and G master electrodes either have regions forming part of the surface of the energy conditioner or internally physically contact conductive bands (outer electrodes) forming part of the surface of the energy conditioner. Thus, all variations of the conductive band structures and mounting structure that provide suitable connection to the A, B, and G master electrodes are contemplated. In addition, the inventors contemplate all variations of energy conditioners lacking conductive band (outer electrodes) that can be mounted on and soldered (or conductively pasted) to the board thereby conductively connecting the A, B, and G master electrodes to the conductive regions of the mounting structure.

Herein, conductive integration region, means either a conductive band or equivalent solder providing the contact to tabs of layers of a master electrode thereby conductively integrating those conductive layers to one master electrode. Tabs mean those portions of conductive layers of an internal structure of an energy conditioner that extend to the upper, lower, left or right side surfaces of the internal structure. Main body portions of conductive layers of an internal structure means those portions of the conductive layers that do not extend to the upper, lower, left or right side surfaces of the internal structure.

Thus, the inventors contemplate all combinations of the mounting structure configurations for mounting a conditioner to a surface and (1) either conductive band configurations or exposed A, B, and G master electrodes surfaces of energy conditioners that provide suitable connections for the A, B, and G master electrodes.

Some combinations of novel energy conditioner and surface mounting structure provide (1) a first conductive and mechanical contact, such as a solder connection, to at least one and more preferably all conductive bands connected to one side of the A and B master electrodes, (2) a second conductive and mechanical contact, such as a solder contact, to at least one and preferably all conductive bands connected to the opposite side of the A and B master electrodes, and (3) a third conductive contact to at least one and preferably all bands connected to both of the opposite ends of the G master electrode. The foregoing reference to electrical contact includes situations where DC current is blocked, such as where a dielectric cap or layer exists somewhere along a via.

Figure 5A:
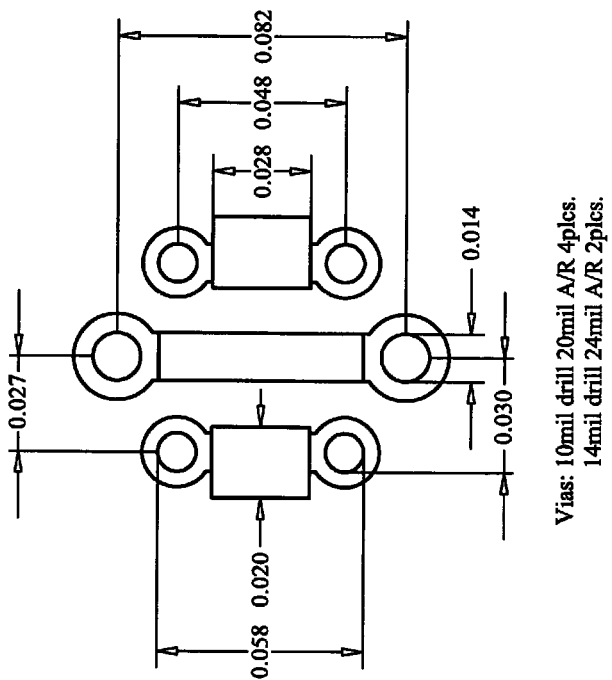
FIGS. 5A and 5B are plan views showing geometric relationships of vias.

FIG. 5A shows geometric values and dimensions for one currently preferred mounting structure.

Figure 5B:
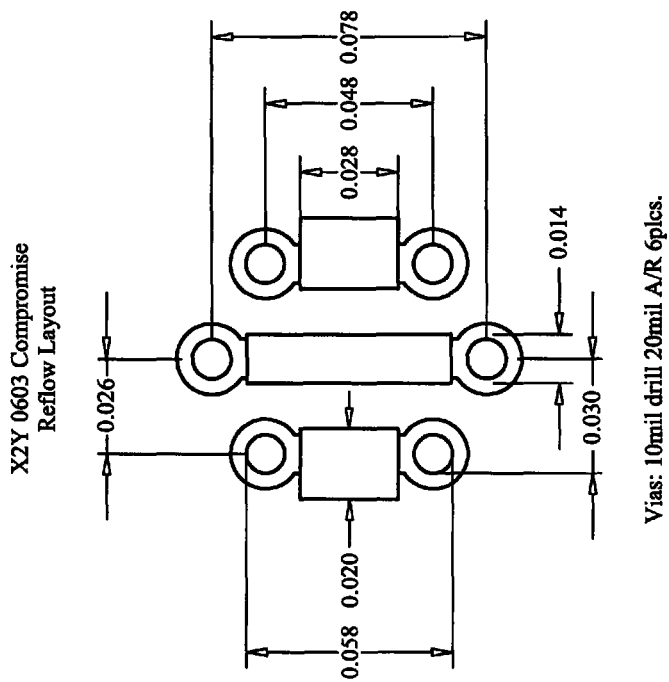

FIG. 5B shows geometric values and dimensions for another currently preferred mounting structure.

It has been determined by numerical calculations that the values shown in FIGS. 5A and 5B provided superior decoupling when 0603 X2Y type energy conditioners are mounted thereto. 0603 X2Y type capacitors have a capacitance of 1 to 100 nano farads, and nominal length, width, and thickness and height of 0.8, 0.6, 0.6, and 0.4 millimeters, respectively, as indicated for example by the URL: http://www.yageo.com/pdf/X2Y_series_10.pdf?5423212=EE8DCCAFD2263EBA74A64 43AF7A8BC75&4620207=.

FIGS. 6A-6B each schematically show a combination of a novel energy conditioner having a certain exterior surface structure in operable location on mounting structure.

FIG. 6A shows an arrangement 6A of energy conditioner 601 on mounting structure 4A. Conditioner 601 had exterior surface structure 3A. Conductive band C1 is on top of conductive pad 401. Part of conductive band C2 is on top (since its ends extend beyond) of a first end of conductive pad 402. Conductive band C3 is on top of pad 403. Conductive band C4 is on top of a second end of conductive pad 402. The first and second ends of conductive pad 402 are on opposite sides of energy conditioner 601 from one another. Vias and portions of pads hidden from view are shown in dashed lines.

FIG. 6B shows arrangement 6B of energy conditioner 602 mounted on arrangement 4O of FIG. 4O. Conditioner 602 also has exterior surface structure 3A. Conductive band C1, C3 contact near opposite ends of conductive pad 402. Conductive bands C4, C2 contact respectively to conductive pads 401, 403.

FIG. 6C shows arrangement 6C of energy conditioner 603 mounted on mounting structure 4J showing alignment of conductive bands of conditioner 603, and also solder, on vias of mounting structure 4J.

FIGS. 7-12 show circuits including an energy conditioner having A, B, and G master electrodes, which relate to the special properties of such conditioners. The inventors have determined that connection of the G master electrode at at least two points, preferably at two points on opposite sides from one another, provides significant advantages. This is in spite of the fact that the G master electrode is a single conductive structure wherein location of connection would not be relevant in a lumped circuit representation. Circuit diagrams rely upon a lumped circuit model for accuracy of representation. In order to represent this geometric requirement relating to distributed circuit design in lumped circuit figures, the inventors schematically represent the energy conditioners as devices having at least 3 terminal device, with A, B, G terminals. More terminals may exist for each master electrode, and additional master electrodes may be integrated into the same component. The inventors have also determined that relative locations of A, B, and G electrode terminals relative to the A, B, and G master electrode structures, may affect performance of the energy conditioners. FIG. 7-12 therefore show circuits peculiar to this type of energy conditioner.

In FIGS. 7-12, external terminal A conductively connects to the A master electrode, external terminal B conductively connects to the B master electrode, external terminal G1 conductively connects to the G master electrode. More specifically as used in FIGS. 7-12, embodiments having at least 2 G external terminals, such as a G1 and G2, a first side of the G master electrode, and external terminal G2 conductively connects to a different side of the G master electrode.

FIGS. 7-12 each show conditioner 700, and external terminals A, B, G1, and G2. The G master electrodes is represented by portions 702, 705, and the A and B master electrodes are represented respective by flat plate elements 703, 704. Internal to conditioner 700, the G master electrode is spaced between or acts to shield the effects of charge buildup on the A master electrode from the B master electrode. This is schematically represented by the portion 702 of the G master electrode extending between the flat plate elements 703, 704 of the A and B master electrodes. G master electrode portion 705 schematically represents shielding by the G master electrode of the A and B master electrodes relative to space outside conditioner 700.

Figure 7:
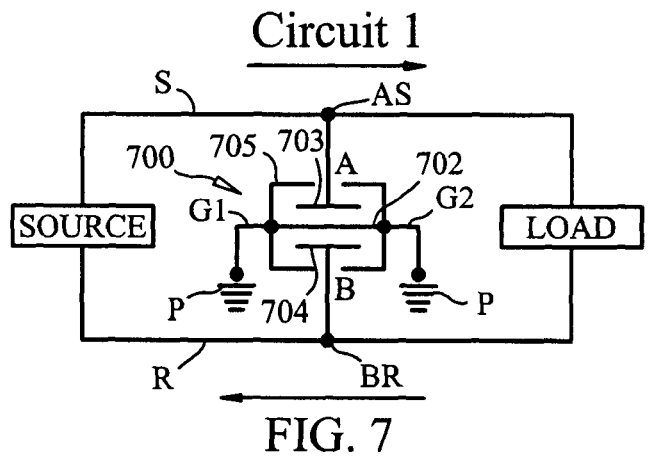
FIG. 7 is a partial schematic of circuit one for use with an energy conditioner having A, B, and G master electrodes.

FIG. 7 show a circuit 1 configuration for a conditioner 700 having A, B, and G master electrodes. In circuit one, external terminal A conductively connects to node AS of conductive path S between a source of electrical power, SOURCE, and a load, LOAD. In addition, external terminal B conductively connects to node BR of a return conductive path R between LOAD and SOURCE. In addition, external G1 and G2 terminals both conductively connect to a source of ground/constant potential P. Arrows above and below conductive paths between SOURCE and LOAD indicate that current flows in a loop.

Figure 8:
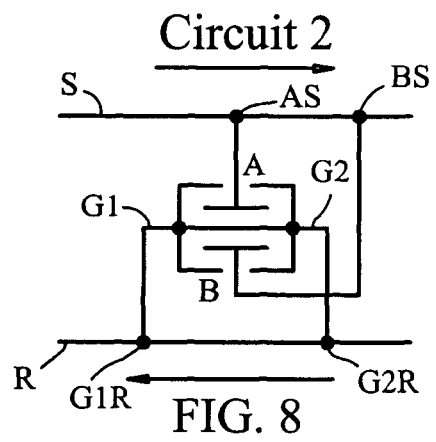
FIG. 8 is a partial schematic of circuit two for use with an energy conditioner having A, B, and G master electrodes.

FIG. 8 shows a circuit 2 configuration wherein external terminal A is tied to node AS on path S, external terminal B is tied to node BS also on path S, external terminal G1 is tied to node G1R on path R, and external terminal G2 is tied to node G2R also on path R.

Figure 9:
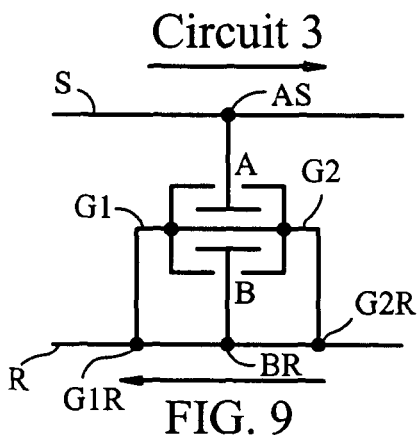
FIG. 9 is a partial schematic of circuit three for use with an energy conditioner having A, B, and G master electrodes.

FIG. 9 shows a circuit 3 configuration wherein external terminal A is tied to node AS on path S, external terminal B is tied to node BR on path R, external terminal G1 is tied to node G1R on path R, and external terminal G2 is tied to node G2R on path R.

Figure 10:
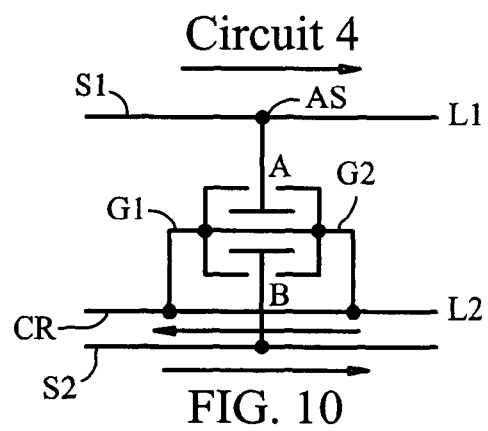
FIG. 10 is a partial schematic of a circuit four for use with an energy conditioner having A, B, and G master electrodes.

FIG. 10 shows a circuit 4 configuration wherein external terminal A is tied to a node on path S, and external terminals G1, B, and G2 are tied to nodes on path R.

Figure 11:
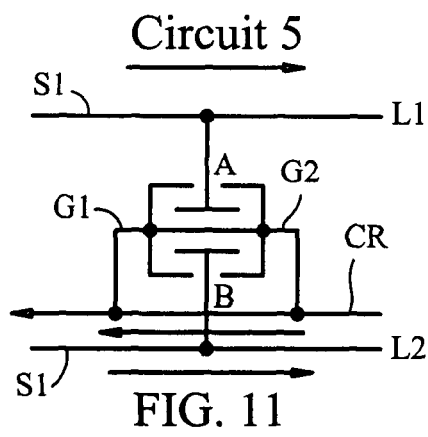
FIG. 11 is a partial schematic of a circuit five for use with an energy conditioner having A, B, and G master electrodes.

FIG. 11 shows a circuit 5 configuration wherein external terminal A is tied to a node on source path S1 from a source to a first load, L1, external terminal B is tied to a node S2 on a path from a source to a second load L2, and external terminals G1 and G2 are tied to a common return path CR.

Figure 12:
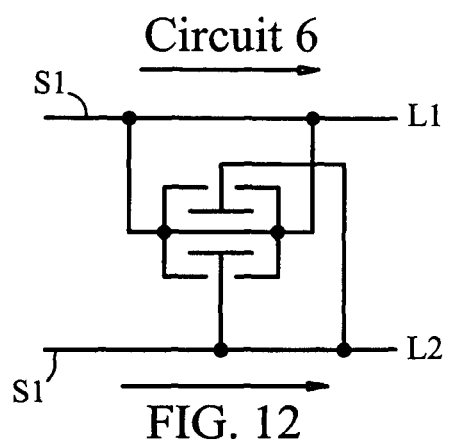
FIG. 12 is a partial schematic of a circuit six for use with an energy conditioner having A, B, and G master electrodes.

FIG. 12 shows a circuit 6 configuration wherein external terminal A is tied to a node on path R (see element R in FIG. 7), external terminal B is tied to a node on path R, and external terminals G1 and G2 are tied to nodes on path S (see element S in FIG. 7).

Relation of Internal Structure to External Structure of Energy Conditioners

FIGS. 13-33 generally show structure internal to the external surface 3A to 3K of FIGS. 3A-3K. The configuration of conductive layers of FIGS. 13-33 can be arranged relative to the external surfaces 3A to 3K so that the conductive layers of the A master electrode contact the same conductive band or bands as one, the conductive layers of the B master electrode contact the same conductive band or bands as one, and the conductive layers of the G master electrode contact the same conductive band or bands as one. Alternatively, instead of conductive bands, solder applied to the sides of the conditioners may conductively contact the conductive layers of the A master electrode to one another, the conductive layers of the B master electrode to one another, and the conductive layers of the G master electrode to one another. The same solder contacts may also contact corresponding conductive regions of the mounting structures shown in FIGS. 4A to 4O.

Meaning of "Plate", and Interconnector and IC Alternative Embodiments

The term "plate" herein generally is used to simplify explanation by defining a combination of a dielectric under layer with none, one, or more than one distinct conductive over layers. However, the relevant structure is the sequence of conductive layers separated by dielectric material. The hidden surface of the structures referred as plates in the following figures represents a dielectric surface; that is, dielectric material vertically separating the defined conductive layers from one another. In discrete energy conditioner component embodiments, the structure are often formed by layering dielectric precursor material (green material) with conductive layer precursor material (conductive paste or the like), firing that layered structure at temperatures sufficient to convert the dielectric precursor to a desired structurally rigid dielectric material and to convert the conductive precursor layer to a high relatively conductivity (low resistivity) conductive layer. However, embodiments formed in interconnects and semiconductor structures would use different techniques, including conventional lithographic techniques, to fabricate equivalent or corresponding structures to those shown in FIGS. 13-25, 27, 29, 31, and 33. Importantly, the conductive bands and solder connections for stacked layers discussed herein below would in many cases be replaced by an array of conductively filled or lined vias selectively connecting conductive layers of the same master electrode to one another. Preferably, those vias would be spaced to selectively contact the tab regions of the A, B, and G layers discussed herein.

Regardless of the mechanism of formation, it is the existence of the master electrodes' morphologies, assembly with external conductive structure, assembly with mounting structure, and integration into circuits 1-6 that are functionally important for decoupling.

Common Features of Internal Structure of Energy Conditioners

A master electrode refers to the conductive layers or regions internal to an energy conditioner and the structure internal to the energy conditioner physically contacting those conductive layers or regions so that they form one integral conductive structure.

Internal structure of energy conditioners includes conductive layers or regions spaces by dielectric material from other conductive layers or regions. The conductive layers or regions each have tab regions that extend to an edge or periphery of the dielectric material. An edge of each tab region of each conductive layer is contacted to external surface conductive structure. The external surface conductive structure may be either conductive bands integral to the discrete energy conditioner or by solder employed also to mount the energy conditioner internal structure to mounting structure. In energy conditioner internal structures having a plurality of conductive layers or regions designed to form a single master electrode, tabs of those conductive layers or regions are vertically aligned in the stack of layers so that a single conductive tab may conductively connect those conductive layers or regions to thereby form a master electrode.

Alternatively, or in addition to conductive bands or solder connecting to externally exposed edges of conductive layers or regions of a master electrode, conductively filled or lined vias may selectively connect to the same conductive layers or regions.

Relationship Between Internal Structures of Energy Conditioners and External Structure of Energy Conditioners Each one of the internal structures of energy conditioners shown in FIGS. 13-25, 27, 29, 31, and 33 may reside in each one of external surface 3A to 3K of FIGS. 3A-3K in two distinct configurations. In one configuration, a first set of tabs of a G conductive layer of the G master electrode are on the left and right sides (as shown in FIGS. 3A to 3K) of the external surfaces 3A to 3K. In the other configuration, the same first set of tabs of that same G conductive layer of the G master electrode are on the upper and lower sides (as shown in FIGS. 3A to 3K) of the external surfaces 3A to 3K. In each configuration of the internal structures of energy conditioners shown in FIGS. 13-25, 27, 29, 31, and 33 and external surfaces 3A to 3K, the conductive layers of the A and B master electrodes each have a region that extends into contact with at least one conductive band (or solder, when solder is applied) of the corresponding one of external surfaces 3A to 3K.

Relationship Between Internal Structures of Energy Conditioners, External Structure of Energy Conditioners, and Circuits 1-6

At least in circuits wherein the A and B master electrode are not tied to the same conductive path of the circuit (circuits 1, 3, 4, and 5; see FIGS. 7-12), the conductive layer or layers of the A master electrode do not contact the same conductive band on external surfaces 3A to 3K as the conductive layer or layers of the B master electrode.

At least in circuits wherein the A master electrode is not tied to the same conductive path of the circuit as the G master electrode (circuits 1-6; see FIGS. 7-12), the conductive layer or layers of the A master electrode do not contact the same conductive band on external surfaces 3A to 3K as the conductive layer or layers of the G master electrode.

At least in circuits wherein the B master electrode is not tied to the same conductive path of the circuit as the G master electrode (circuits 1, 2 and 6; see FIGS. 7-12), the conductive layer or layers of the B master electrode do not contact the same conductive band on external surfaces 3A to 3K as the conductive layer or layers of the G master electrode.

Features Common to Various Internal Structures Shown in FIGS. 13-33.

FIGS. 13-33 all show structures wherein a G master electrode has at least two distinct tabs. As used herein, tab does not require a narrowing or necking compared to a body. Instead, it requires only extension to an edge of a dielectric structure. However, many of the conductive layers of G master electrodes shown in FIGS. 13-33 include tab regions that are narrowed or necked compared to the region of the same conductive layer not adjacent the edge of dielectric structure.

FIGS. 13-16, 21, 22, 23 show conductive layers of an A master electrode and conductive layers of a B master electrode that each have only have one distinct tab.

FIGS. 17, 18, 19, 24, 25, 27, 29, 31, and 33 show conductive layers of an A master electrode and conductive layers of a B master electrode that each have two distinct tabs.

FIG. 20 shows conductive layers of an A master electrode and conductive layers of a B master electrode that each have three distinct tabs.

FIGS. 13, 16, 17, 18, 19, 20, 21, 22, 23, and 24 show plates having conductive layers of A and B master electrodes that extend to portions of at least three edges of their plate.

FIGS. 13-25, 27, 29, 31, and 33 show internal structure of novel energy conditioners.

Figure 27:
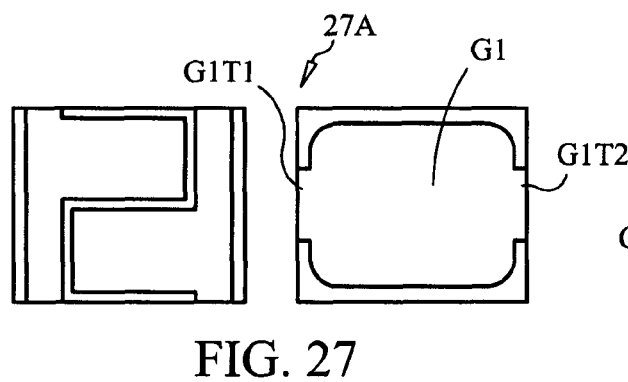
FIG. 27 is an exploded view of a set of two plates of a novel energy conditioner in which the plates have been displaced vertically in the page.
Figure 28:
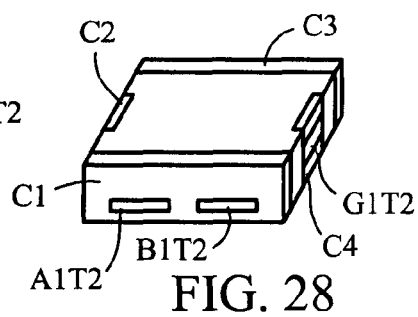
FIG. 28 is a perspective view of an exterior surface of a novel energy conditioner including the stack of two plates shown in FIG. 27.
Figure 29:
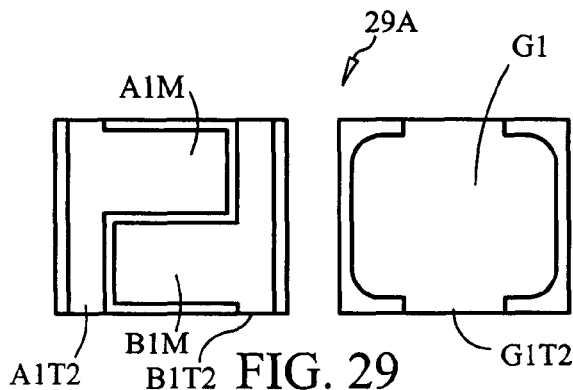
FIG. 29 is an exploded view of a set of two plates of a novel energy conditioner in which the plates have been displaced vertically in the page.
Figure 30:
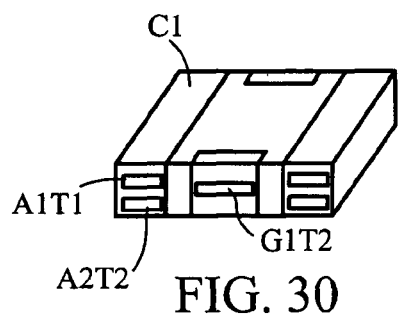
FIG. 30 is a perspective view of an exterior surface of a novel energy conditioner including the stack of two plates shown in FIG. 29.
Figure 31:
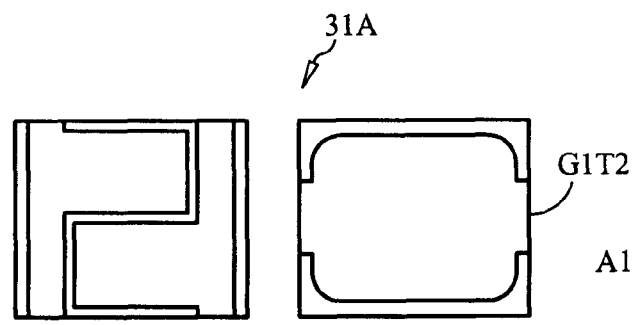
FIG. 31 is an exploded view of a set of two plates of a novel energy conditioner in which the plates have been displaced vertically in the page.
Figure 32:
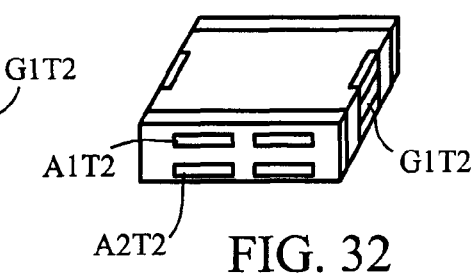
FIG. 32 is a perspective view of an exterior surface of a novel energy conditioner including the stack of two plates shown in FIG. 31.

FIGS. 28, 30, and 32 show external structure of novel energy conditioner embodiments of FIGS. 27, 29, and 31, respectively;

FIGS. 13-25, 27, 29, and 31 show plates that each have a conductive layer of an A master electrode and a conductive layer of a B master electrode in the same plate.

FIGS. 13-24 show stacks of plates that each have a conductive layer of an A master electrode and a conductive layer of a B master electrode in the same plate, and wherein two such plates are mirror images of one another about a line of symmetry extending vertically or horizontally in the plane of the paper of each figure.

FIGS. 13-24 show both (1) structures that each have a conductive layer of an A master electrode and a conductive layer of a B master electrode in the same plate and (2) stacks of plates wherein a conductive layer of an A master electrode on one plate has a region of substantial overlap with a conductive layer of a B master electrode on another plate.

FIGS. 13-24 show structures that include stacks of plates wherein (1) a first plate has a surface including a conductive layer of an A master electrode and a conductive layer of a B master electrode, (2) a second plate also has a surface including a conductive layer of an A master electrode and a conductive layer of a B master electrode, the conductive layer of the A master electrode in the first plate and the conductive layer of the B master electrode in the second plate have a region of substantial overlap, and (3) a third plate resides between the first two plates and has a conductive layer of a G master electrode extending throughout the region of substantial overlap.

Figure 22:
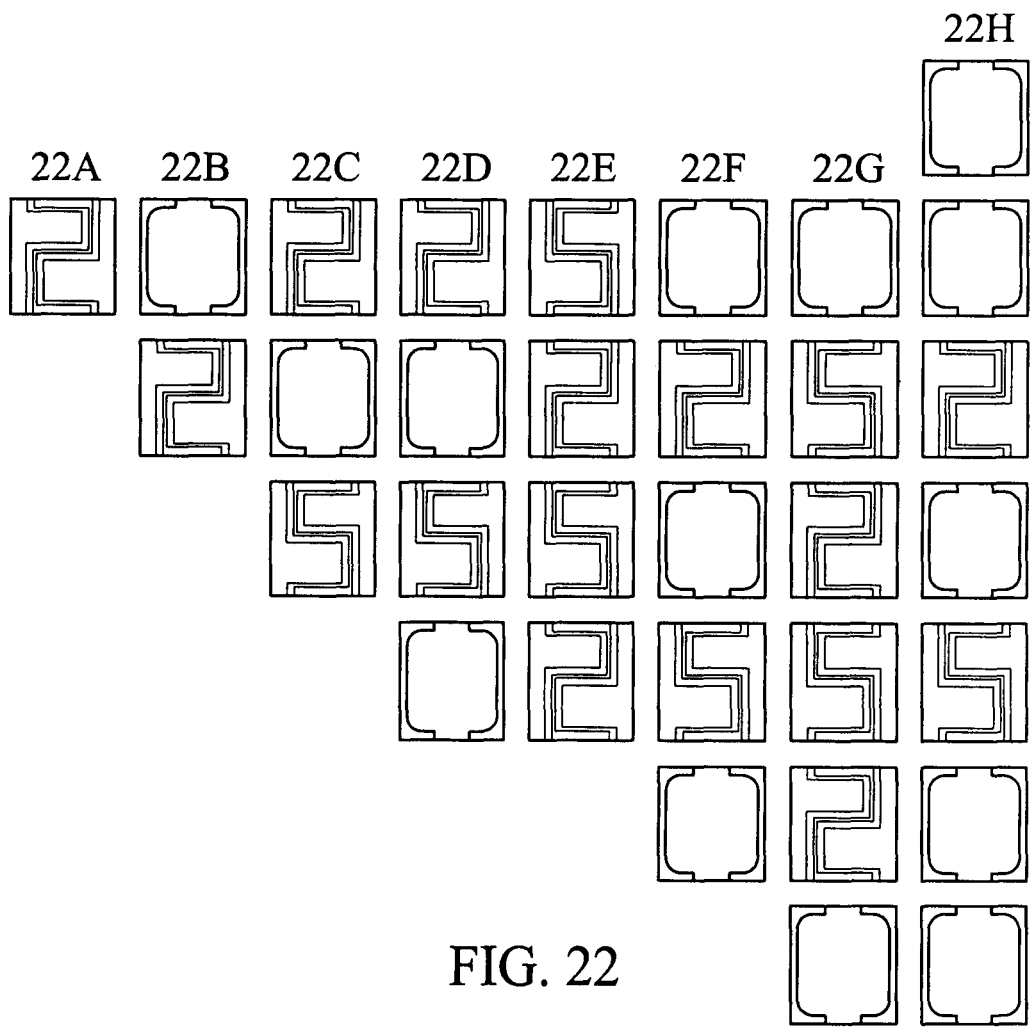
FIG. 22 is a set of exploded views of stacks 22A-22H of plates of novel energy conditioners in which the plates of each stack have been displaced vertically in the page.
Figure 25:
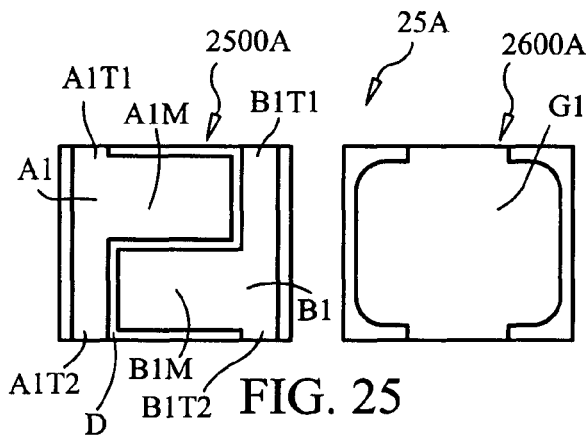
FIG. 25 is an exploded view of a set of two plates of a novel energy conditioner in which the plates have been displaced vertically in the page.

FIGS. 25, 27, and stacks 22A and 22B of FIG. 22 show structures including only a single plate having a surface including a conductive layer of an A master electrode and a conductive layer of a B master electrode, and a single plate having a surface including a conductive layer of a G master electrode.

FIGS. 29 and 31 show structures including only a two plate each having a surface including a conductive layer of an A master electrode and a conductive layer of a B master electrode, and a single plate there between having a surface including a conductive layer of a G master electrode.

Figure 21:
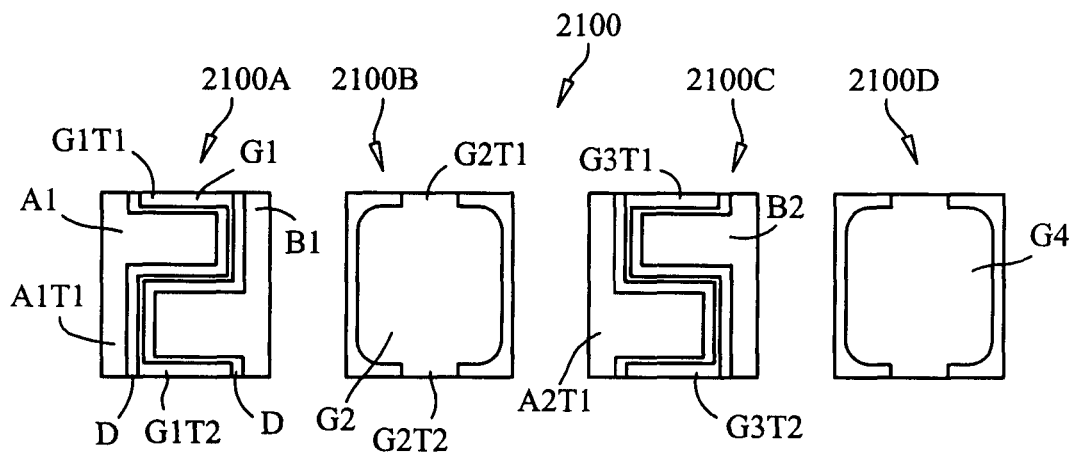
FIG. 21 is an exploded view of a stack of four plates internal to a novel energy conditioner in which the plate elements have been displaced laterally in the page.
Figures 23, 24:
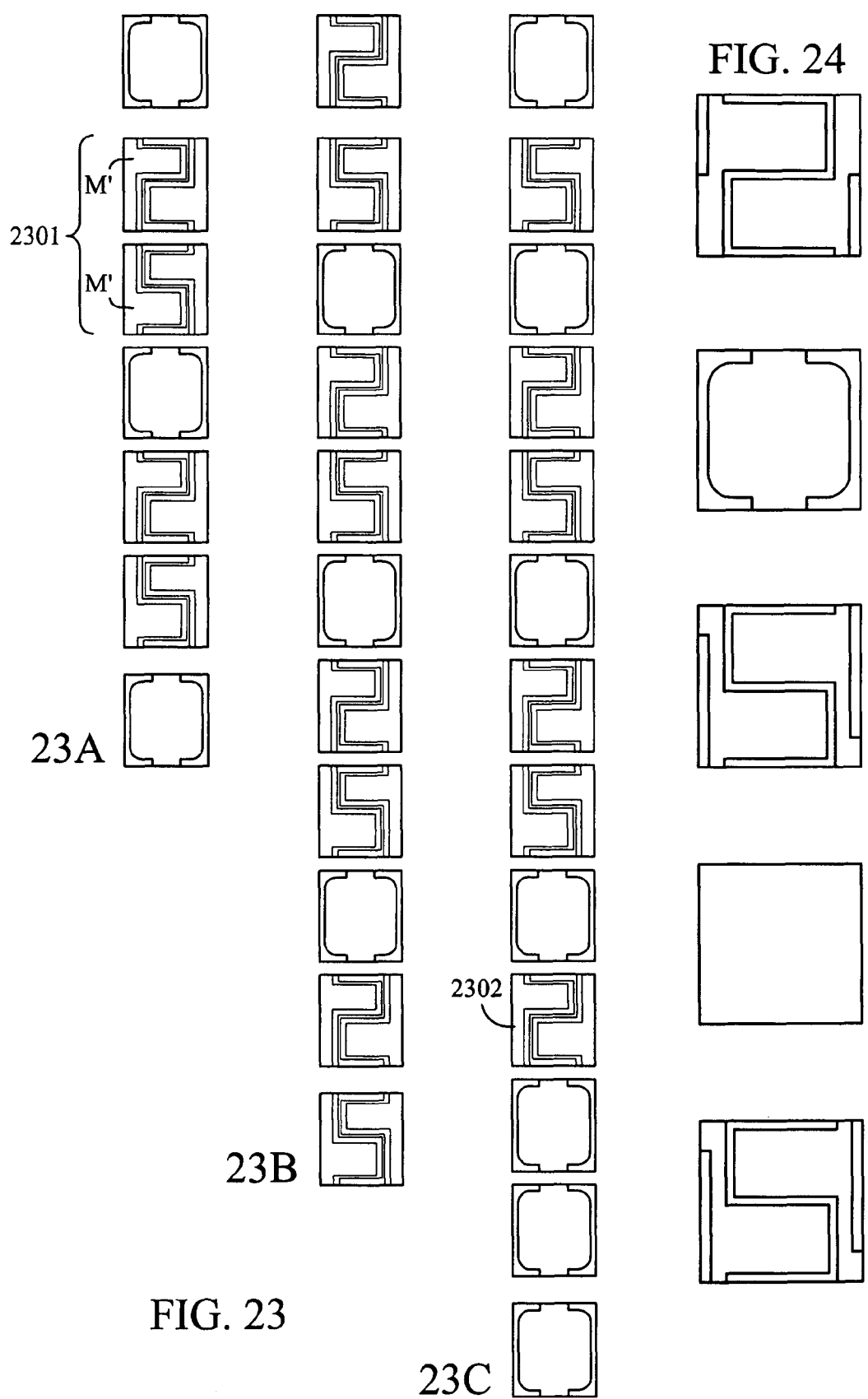
FIG. 23 is a set of exploded views of stacks 23A-23C of plates of novel energy conditioners in which the plates of each stack have been displaced vertically in the page.
FIG. 24 is an exploded view of a stack of plates of a novel energy conditioner in which the plates have been displaced vertically in the page.

FIGS. 21, 22, and 23 show structures including at least one plate having a surface including a conductive layer of an A master electrode, a conductive layer of a B master electrode and a conductive layer of a G master electrode between the aforementioned conductive layers of the A and B master electrodes.

FIG. 22 stacks 22E and 22G, and FIG. 23 stacks 23A, 23B, and 23C each show structures including plates having a substantial region of a conductive layer of an A master electrode opposing a corresponding region of a conductive layer of a B master electrode on another plate having no intervening conductive layer of a G master electrode there between.

FIG. 22 stack 22H and FIG. 23 stack 23C show structures in which the outermost conductive layers on one or both ends of the stack have a sequence of two or three conductive layers.

Figure 33:
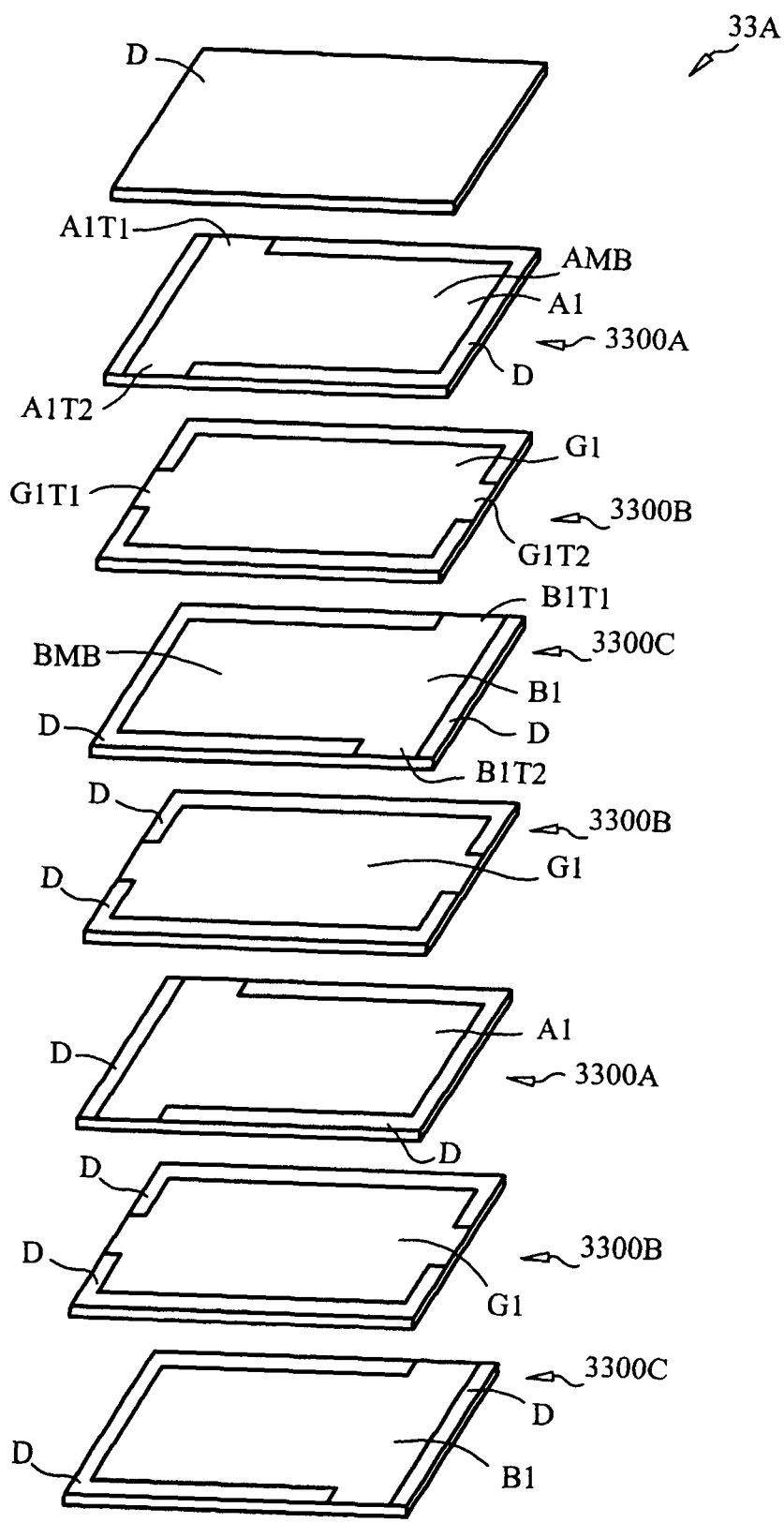
FIG. 33 is an exploded view of a stack of 8 plates of a novel energy conditioner in which the plates have been displaced vertically in the page.

FIG. 33 shows a structure including a stack of plates wherein: (1) each plate has a surface including a conductive layer of only one master electrode, the sequence of conductive layers follows the pattern A, G, B, G, A, G, B; (2) conductive layers of the A and B master electrodes substantially overlap; (3) conductive layers of the G master electrode extend substantially throughout the area of overlap; (4) each conductive layer of the A master electrode has A tabs extends to front and back edges of the corresponding plate; (5) each conductive layer of the B master electrode has B tabs extends to front and back edges of the corresponding plate without overlapping any of the A tabs; and (6) each conductive layer of the G master electrode extends to left and right side edges of the corresponding plate.

Detailed Description of FIGS. 13-33

In the following figures, plates of a stack shown displaced horizontally or vertically in the page exist in the stack in the sequence as expanded horizontally or vertically in the page. Each stack includes a top and a bottom spaced from one another in a direction perpendicular to the face of the paper of the figures. In addition, each plate of each stack is shown in the figures as having in the plane of the paper a left side LS, right side RS, upper side US, and lower side LLS.

Figures 13, 14:
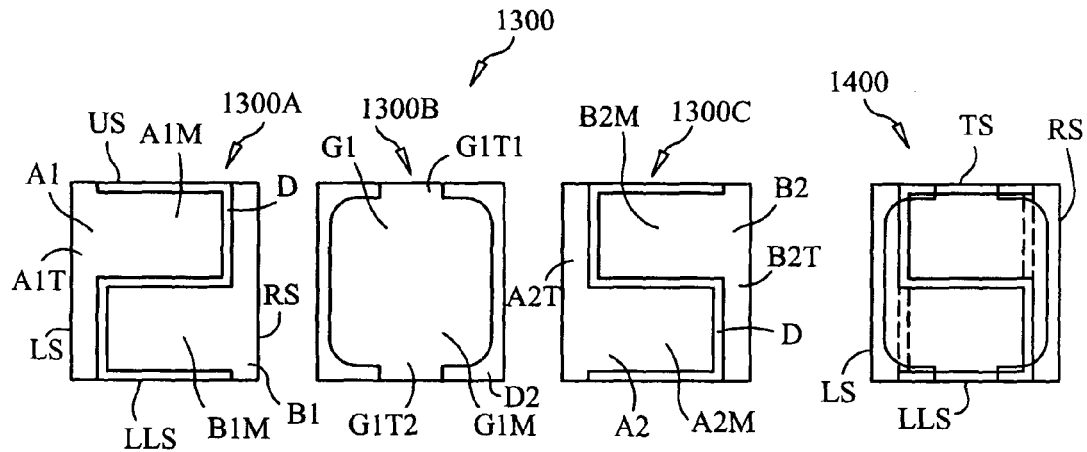
FIG. 13 is an exploded view of a stack of four plates internal to a novel energy conditioner in which the plate elements have been displaced laterally in the page.
FIG. 14 is a schematic plan view of an assembly of the plates of FIG. 13.

FIG. 13 shows stack 1300 of plates 1300A, 1300B, and 1300C. Plate 1300A includes dielectric material uniformly extending to the LS, RS, US, and LLS of stack 1300. Conductive layer A1 designed to be part of the A master electrode and conductive layer B1 designed to be part of the B master electrode reside on the surface of dielectric material of plate 1300A. Conductive layers A1 and B1 are separated from one another by exposed dielectric surface D. Conductive layer A1 has a tab A1T extending to the entire LS, and also the far left sides of the US and LLS. Conductive layer B1 has a tab B1T extending to the entire RS, and also to the far right sides of the US and LLS. Conductive layer A1 has a main body portion A1M extending the majority of the distance from the LS to the RS on the upper half of plate 1300A. Conductive layer B1 has a main body portion B1M extending the majority of the distance from the RS to the LS on the lower half of plate 1300A.

Plate 1300B includes dielectric material on which resides conductive layer G1. Conductive layer G1 has tab G1T1 extending to a central region of the US. Conductive layer G1 has tab G1T2 extending to a central region of the LS. Conductive layer G1 has a main body portion B1M between tabs G1T1 and G1T2.

Plate 1300C includes conductive layer A2 for the A master electrode, conductive layer B2 for the B master electrode. Conductive layers A2 and B2 are separated from one another by exposed dielectric surface D. Conductive layer A2 has a tab A2T extending to the entire LS, and also the far left sides of the US and LLS. Conductive layer B2 has a tab B2T extending to the entire RS, and also to the far right sides of the US and LLS. Conductive layer A2 has a main body portion A2M extending the majority of the distance from the LS to the RS on the lower half of plate 1300A. Conductive layer B2 has a main body portion B2M extending the majority of the distance from the RS to the LS on the upper half of plate 1300A.

FIG. 14 schematically shows the stack of layers 1300C, 1300B, 1300A wherein main bodies A1M and B2M have a region of substantial overlap, and main bodies A2 and B1M have a region of substantial overlap, and conductive layer G1M extends over a substantial portion of the regions of overlap. Preferably, the regions of overlap occupy at least 20, more preferably at least 40 and more preferably at least 60 percent of the area of the A1M conductive layer. Preferably, the G1M layer extends over at least 40, and more preferably at least 60 percent of the areas of overlap.

The stack of FIGS. 13 and 14, once formed, may be mounted to mounting structure on a PC board or interconnect, and soldered in place to complete the connections of the A, B, and G master electrodes. Alternatively, the structure of FIGS. 13 and 14 may be fabricated with conductive bands forming a portion of the external structure thereby completing formation of the A, B, and G master electrodes.

FIGS. 13 and 14 are only exemplary of a sequence of layers forming an energy conditioner using the plates 1300A, 1300B, 1300C. Alternatively to the FIGS. 13 and 14 stack embodiment, a stack may have an integral number of repeats of the sequence 1300A, 1300B, 1300C. Alternatively, a stack may have the sequence 1300A, 1300B, 1300C followed by any integral number of repeats of either the sequence 1300B, 1300C or the sequence 1300A, 1300B. Alternatively, one, two, or more than two 1300B plates may reside at either or both of the top and the bottom of a stack.

FIGS. 15-20 show alternative shapes for conductive layers of A, B, and G master electrodes wherein each plate having an conductive layer for an A master electrode also has a conductive layer for a B master electrode. The same alternatives and methods of assembly just noted for the FIGS. 13 and 14 embodiment apply to the FIGS. 15-20 stack embodiments.

Figure 15:
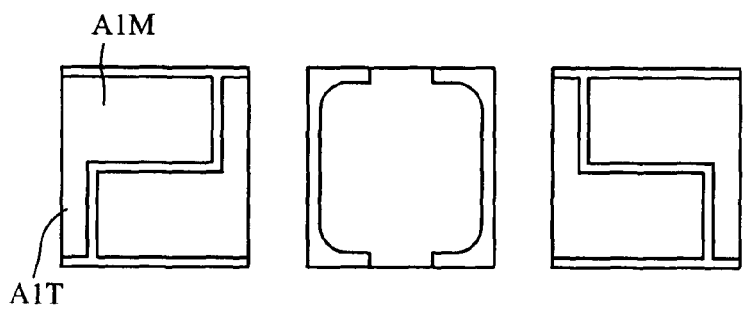
FIG. 15 is an exploded view of a stack of three plates internal to a novel energy conditioner in which the plate elements have been displaced laterally in the page.

FIG. 15 shows conductive layer A1M having tab A1T extending over only a portion of LS and over no other side.

Figure 16:
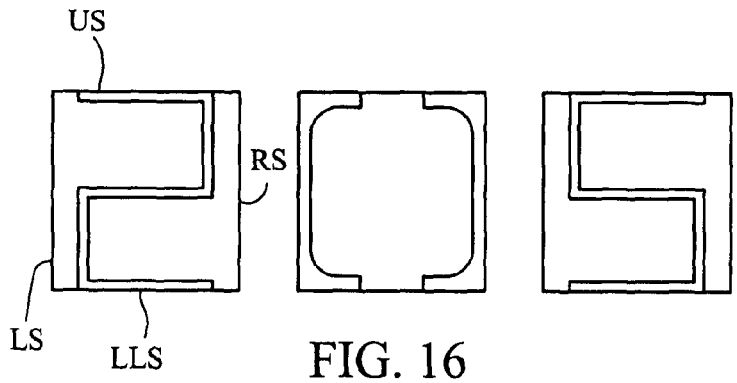
FIG. 16 is an exploded view of a stack of three plates internal to a novel energy conditioner in which the plate elements have been displaced laterally in the page.

FIG. 16 is identical to FIG. 13.

FIG. 17 shows a stack of plates including plates 1700A, 1700B, and 1700C. Plate 1700A having conductive layer A1M having tabs A1T1 and A1T2 separated by exposed dielectric D at the center of the LS. Plate 1700B includes conductive layer of a G master electrode include main body portion G1M, and tab portions G1T1, G1T2, G1T3, and G1T4 in each side edge. Plate 1700C includes conductive layers A2 and B2 for the A and B master electrodes respectively. Tabs of the A1 and A2 plated, the B1 and B2 plates in the stack are vertically aligned. Dielectric surface is exposed at the center of each side of plate 1700A and 1700C. The existence of exposed dielectric surfaces vertically aligned in the stack of plates, and existing on each side of the plates having conductive layers for the A and B electrodes, enables the existence of G tabs aligned on each side of the stack to be contacted by a conductive connecting material (conductive band or solder) without shorting the G tabs to the A or B tabs. In one alternative to FIG. 17, the G1 layer has only two tabs that extend to either the US and LLS or the LS and RS.

FIG. 18 shows a stack of plates wherein the conductive layers for the A master electrode each have two tabs, and those tabs are not completely aligned with one another. FIG. 18 shows layer A1 and A2 having tabs A1T1 and A2T1 that only partially align at the left side of the US. Similarly the remaining tabs for the A and B layers have partial overlap.

FIG. 19 shows a stack similar to that shown in FIG. 18 except that extent of the tabs of the A1, B1, A2, and B2 layers is reduced so that the exposed dielectric D extends over the center of the LS and RS, and the G1 layer has four tabs two of which extend to the center of the LS and RS. In one alternative to FIG. 19, the G1 layer has only two tabs that extend to either the US and LLS or the LS and RS.

FIG. 20 shows a stack wherein the A1 layer has tabs that extend to portions of the LS, US, and LLS, but not to any corner, and not to the center of the LS. This configuration enables up to three separate conductive connections on the side of the stack to the A layer, and likewise to the B layer, for example with the external structure 3K's left side and right side conductive bands connecting to the A and B layers.

FIG. 21 shows a stack 2100 including plates 2100A, 2100B, 2100C, and 2100D. Each one of plates 2100A and 2100C contain conductive layers for the A, B, and G master electrodes separated by dielectric D. Plate 2100A includes conductive layer A1 that includes tab A1T1 extending over the entire LS and portions of the left end of the US and LLS. Plate 2100A also includes conductive layer B1 that includes tab B1 extending over the entire RS and portions of the right end of the US and LLS. Between A1 and B1 resides conductive layer G1 that winds between the main body portions of A1 and B1 to tabs G1T1 and G1T2 in the center of the US and LLS. Plate 2100B includes layer G2 having tabs G2T1 and G2T2 in the center of the US and LLS. Plate 2100C includes layers A2, B2, and G3, and it is a mirror image of plate 2100A. Plate 2100D is identical to plate 2100B. The stack 2100 has all tabs for the G layers aligned in the center of the US and LLS so that the G layers between A and B layers as well as the G layers above or below A and B layers are integrated into the G master electrode. Alternatively, stack sequences are feasible, including the plate sequence 2100A, 2100B, 2100C, and 2100D followed or preceded by any number of repetitions of either 2100C, 2100D or 2100A, 2100B; by including 2 or more of plates of the form of 2100B/2100D instead of single plates, and not including the central G conductive layer in one, or alternating ones of the plates of the form 2100A/2100C, and including one, two, or more plates of the form of 2100B/2100D at one or both ends of the stack.

FIG. 22 shows stacks, 22A to 22H each including additional alternative stacks of the plates 2100A to 2100D. Note in particular that stacks 22A, 22B, and 22C have less than 4 plates; one, two, and three plates or layers, respectively.

FIG. 23 shows stacks 23A, 23B, and 23C which employ the same plates 2100A, 2100B, 2100C, 2100D as the stack of FIG. 21. However, FIG. 23's sequence differs from the sequences in FIGS. 21 and 22 in that there are adjacent pair 2301 of mirror image layers M, M' where overlap regions of conductive surfaces for A1 and B1 layers oppose one another without an intervening conductive layer for the G master electrode, like layers G2 and G4 of FIG. 21. There are also plates where G conductive layers like layers G2 and G4 do bracket a layer in which A, B, and G conductive layers reside, like plate 2302. FIG. 23 shows paired layers M, M'. Alternatively, stack sequences may include any number of repeats of the pair of M, M' adjacent to one another with or without any of the layers having a single G layer, like layers G2 and G4 of FIG. 21. Preferably, there is an odd total number of layers in which conductive layers exist, and an odd total number of layers in which only layers forming part of the G master electrode exist.

FIG. 24 shows a stack containing plates having various shapes from the preceding embodiments (a top plate having the same conductive pattern as the left side plate in FIG. 18, a second from top plate having the conductive pattern of G1 in FIG. 13, a third plate having the conductive pattern of a plate from FIG. 19, a fourth plate representing a dielectric spacer region, and a fifth plate like the third plate) showing the plates of different shapes and sizes and of non-uniform spacings may exist in stacks contemplated by the inventors. All such modifications and variations of layers are within the scope contemplated.

FIGS. 25-28 are views of energy conditioners including conductive layers on only two planes and various external structures.

FIG. 25 shows stack 25A containing plate 2500A and 2500B. An upper surface of plate 2500A is formed from surfaces of conductive layer A1, conductive layer B1, and exposed dielectric material D. An upper surface of plate 2500B is formed from conductive layer G1 and exposed dielectric material D. A1 has tabs A1T1 near the left hand end of the US and A1T2 at near lower left hand end of the LLS. G1 has tabs G1T1 in the middle of the US and G1T2 in the middle of the LLS. A1 does not extent to the RS, and B1 does not extend to the LS. A1 has main body portion A1M. B1 has main body portion B1M. A1M extends to a location closer to the US and RS than the LLS and LS. B1M extends to a location closer to the LS and LLS than the US and RS.

Figure 26:
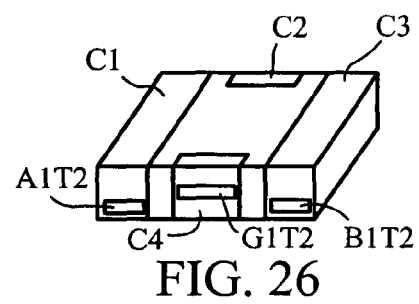
FIG. 26 is a perspective view of an exterior surface of a novel energy conditioner including the stack of two plates shown in FIG. 25.

FIG. 26 schematically shows an energy conditioner defined by one arrangement of (1) stack 25A and (2) external structure 3A of FIG. 3A. In this arrangement, tabs A1T1 and A2T2 contact internal surfaces of conductive band C1, tabs G1T1 and G1T2 respectively contact internal surfaces of bands C2 and C4, and tabs B1T1 and B1T2 contact internal surfaces of conductive band C3.

In one alternative external structure, the third conductive integration structure and the fourth conductive integration structure form a single conductive band around the outer surface of said energy conditioner. The same alternative applies to FIGS. 28, 30, and 32.

FIG. 27 shows stack 27A including plates 2500A and 2700B. Plate 2700B differs from plate 2500B in that the tabs G1T1 and G1T2 of layer G1 are in the LS and RS as opposed to the US and LLS.

FIG. 28 schematically shows an energy conditioner defined by one arrangement of (1) stack 27A and (2) external structure 3A of FIG. 3A. Tabs A1T1 and B1T1 contact the internal surface of conductive band C3, tabs A1 T2 and B1T2 contact the internal surface of conductive band C1, tab G1T1 contacts the internal surface of conductive band C2, and tab G1T2 contacts the internal surface of conductive band C4. In this energy conditioner, the A and B master electrodes are conductively tied together at the edges of the tabs by conductive bands C1, C3.

FIGS. 29-32 are views of energy conditioners including conductive layers on three planes and various external structures.

FIG. 29 shows stack 29A including plates 2500A and 2500B. Stack 29A also includes another plate 2500C (not shown) having the same layered pattern as plate 2500A and on an opposite side of plate 2500A relative to plate 2500B. Plate 2500C has elements A2T1, A2T2, B2T1, B2T2, A2M, and B2M aligned with corresponding elements of plate 2500A. Plate 2500C has conductive layers A2 and B2 having tabs aligned with corresponding tabs of plate 2500A, including tab A2T1, A2T2, B2T1, and B2T2. In addition, plate 2500C has A1M and B1M as shown in FIG. 25.

Alternatively, for FIG. 29, and stack 29A, plate 2500C may be replaced by a plate having a conductive pattern that is a mirror image of the conductive pattern on plate 2500A, the mirror defined by a vertical line passing through the center of conductive plate 2500A. In this alternative, conductive tabs A1T1 and A2T2, for example, are still vertically aligned and conductively connected by contacts to the inner surface of conductive band C1. However, in this alternative, A1M has a substantial overlap with B2M, and A2M has a substantial overlap with B1M.

FIG. 30 schematically shows an energy conditioner defined by one arrangement of (1) stack 29A and (2) external structure 3A of FIG. 3A. In this structure, tabs for conductive layers of the same master electrode are aligned in the stack and contact conductive band structure. For example, tabs A1T1 and A2T1 are aligned and contact the internal surface of conductive band C1. In an alternative to stack 29A, discussed above, A1M has a substantial overlap with B2M, and A2M has a substantial overlap with B1M. As with other embodiments, additional alternatives stacks include a repeating sequences of the three plates of layers of stack 29A, and irregular sequences of 2500A, 2500B, and 2500C, and the alternative to 2500C noted above.

FIG. 31 shows stack 31A including plates 2500A and 2500B. Stack 31A also includes a second plate 2500C having the same layered pattern as plate 2500A and on an opposite side of plate 2500A relative to plate 2500B. Plate 2500C has conductive layers A2 and B2 having tabs aligned with corresponding tabs of plate 2500A, including tab A2T1, A2T2, B2T1, and B2T2.

FIG. 32 schematically shows an energy conditioner defined by one arrangement of (1) stack 31A and (2) external structure 3A of FIG. 3A. In this structure, tabs for conductive layers of the same master electrode are aligned in the stack and contact conductive band structure. For example, tabs A1T1 and A2T1 are aligned and contact the internal surface of conductive band C1.

Alternatively, for FIG. 31, plate 2500C may be replaced by a plate having a conductive pattern that is a mirror image of the conductive pattern on plate 2500A, the mirror defined by a vertical line passing through the center of conductive plate 2500A. In this alternative, conductive tabs A1T1 and A2T2, for example, are still vertically aligned and conductively connected by contacts to the inner surface of conductive band C1. As with other embodiments, additional alternatives stacks include a repeating sequences of the three plates of layers of stack 29A, and irregular sequences of 2500A, 2500B, and 2500C, and the alternative to 2500C noted above.

FIG. 33 shows stack 33A including a sequence of plates 3300A, 3300B, 3300C, 3300B, 3300A, 3300B, 3300C.

Plates 3300A each have an upper surface that consists of a surface of conductive layer A1 and exposed dielectric surface D. Conductive layer A1 consists of tabs A1T1, A1T2, and main body portion AMB. Conductive layer A1 is part of an A master electrode. Tab A1T1 extends to the US near the LS. Tab A1T2 extends to the LLS near the LS. AMB extends from tabs A1T1 and A1T2 towards the LS.

Plates 3300B each have an upper surface that consists of a surface of conductive layer G1 and exposed dielectric surface D. Conductive layer G1 consists of tabs G1T1, G1T2, and main body portion GMB. Tab G1T1 extends to the middle of the LS. Tab G1T2 extends to the middle of the RS.

Plates 3300C each have an upper surface that consists of a surface of conductive layer B1 and exposed dielectric surface D. Conductive layer B1 consists of tabs B1T1, B1T2, and main body portion BMB. Conductive layer B1 is part of a B master electrode. Tab B1T1 extends to the US near the LS. Tab A1T2 extends to the LLS near the LS. AMB extends from both tabs A1T1 and A1T2 towards the center.

Stack 33A also shows a dielectric plate having no conductive layers thereon at the top of the stack. The dielectric cover represents the condition that the conductive layers not be shorted to external conductive material, as might happen if they were otherwise uncovered.

Alternatives to stack 33A include one or more repetitions of the sequence of plates 3300A, 3300B, 3300C, 3300B, 3300A, 3300B, 3300C, and one or more repetitions of the sequence of plates 3300A, 3300B, 3300C added to the top or the bottom of the sequence of plates 3300A, 3300B, 3300C, 3300B, 3300A, 3300B, 3300C.

Stack 33A may be assembled in a variety of external structures to provide various connections. In one assembly of stack 33A and external structure 3I of FIG. 3I results in tabs A1T2 of the A1 conductive layers in contact with the internal surface of band C4, tabs A1T1 in contact with the internal surface of band C2, tabs B1T2 in contact with the internal surface of band C6, tabs B1T1 in contact with the internal surface of band C5, tabs G1T1 in contact with the internal surface of the LS of band C1, and tabs G1T2 in contact with the internal surface of the RS of band C3.

In alternatives assemblies, stack 33A is assembled with either external structure 3A or 3G wherein the tabs of the G conductive layer contact internal surfaces of bands C2 and C4. In these alternatives, band C1 contacts to tabs at opposite ends of contact A conductive layer thereby forming two parallel conductive paths from tab A1T1 to tab A1T2; one directly between the tabs and the other through the connecting structure of band C1. Similarly, two parallel conductive paths are formed from B tabs of the same B layer by band C3.

The foregoing describe embodiments and alternatives within the scope of the novel concepts disclosed herein. The following claims define the scope of protection sought.

We claim:
1. A conductive structure, comprising:
[A] a plurality of aligned structural plates that are positioned and stacked in a vertical alignment with one another, and wherein each one of the aligned structural plates in the plurality has
1) substantially the same width and length, and
2) a left side, a right side, an upper side, and a lower side, and has a left side, a right side, an upper side, and a lower side;

[B] an upper structural plate of the plurality comprising an upper layer of dielectric and an upper layer of conductive material;

[C] a first structural plate of the plurality, comprising a first support layer of dielectric and a first layer of conductive material that includes
1) a first-shaped electrode layer area including a left region and an upper region, and wherein the left region extends along, but not beyond, the left side of the first structural plate, and
2) a second-shaped electrode layer including a right region and a lower region, and wherein the right region extends along, but not beyond, the right side of the first structural plate;

[D] an center structural plate of the plurality comprising an center layer of dielectric and a center layer of conductive material;

[E] a second structural plate of the plurality, comprising a second support layer of dielectric and an second layer of conductive material that includes
1) a first-shaped electrode layer area including a left region and an upper region, and wherein the left region extends along, but not beyond, the left side of the second structural plate, and
2) a second-shaped electrode layer including a right region and a lower region, and wherein the right region extends along, but not beyond, the right side of the second structural plate;

[F] an lower structural plate of the plurality comprising an lower layer of dielectric and a lower layer of conductive material;

wherein
(a) the first and second structural plates are parallel with one another,
(b) the first and second-shaped electrode layers of the first structural plate are co-planar and electrically isolated from each other,
(c) the first and second-shaped electrode layers of the second structural plate are co-planar and electrically isolated from each other,
(d) the upper structural plate and the center structural plate sandwich the first structural plate,
(e) the center structural plate and the lower structural plate sandwich the second structural plate,
(f) the upper structural plate and the lower structural plate sandwich the first structural plate, the central structural plate and the second structural plate therebetween, and
(g) within the plurality of aligned structural plates, the orientation of the first and second-shaped electrode layers of the first structural plate is 180 degrees opposite the orientation of the first and second-shaped electrode layers of the second structural plate.

\* \* \* \* \*